(12) United States Patent
Li et al.

(10) Patent No.: US 12,224,307 B2
(45) Date of Patent: Feb. 11, 2025

(54) DISPLAY DEVICE AND MANUFACTURING METHOD THEREOF

(71) Applicant: SAMSUNG DISPLAY Co., LTD., Yongin-si (KR)

(72) Inventors: Xinxing Li, Yongin-si (KR); Tae Jin Kong, Yongin-si (KR); Dae Hyun Kim, Yongin-si (KR); Veidhes Basrur, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 476 days.

(21) Appl. No.: 17/605,781

(22) PCT Filed: Jan. 16, 2020

(86) PCT No.: PCT/KR2020/000814
§ 371 (c)(1),
(2) Date: Oct. 22, 2021

(87) PCT Pub. No.: WO2020/218713
PCT Pub. Date: Oct. 29, 2020

(65) Prior Publication Data
US 2022/0231080 A1 Jul. 21, 2022

(30) Foreign Application Priority Data

Apr. 24, 2019 (KR) .................. 10-2019-0047876

(51) Int. Cl.
*H01L 33/38* (2010.01)
*H01L 27/15* (2006.01)
(Continued)

(52) U.S. Cl.
CPC .......... *H01L 27/156* (2013.01); *H01L 33/005* (2013.01); *H01L 33/24* (2013.01);
(Continued)

(58) Field of Classification Search
CPC ....... H01L 33/005; H01L 33/24; H01L 33/38; H01L 33/44
See application file for complete search history.

(56) References Cited

U.S. PATENT DOCUMENTS 8,872,214 B2  10/2014 Negishi et al.
9,190,590 B2  11/2015 Shibata et al.
(Continued)

FOREIGN PATENT DOCUMENTS

CN  108538877  9/2018
JP  4814394  11/2011
(Continued)

OTHER PUBLICATIONS

US 10,930,830 B2, 02/2021, Do et al. (withdrawn)
(Continued)

*Primary Examiner* — Eric K Ashbahian
*Assistant Examiner* — David W Ward
(74) *Attorney, Agent, or Firm* — KILE PARK REED & HOUTTEMAN PLLC

(57) ABSTRACT

A display device includes a pixel disposed in a display area. The pixel includes a first electrode; a first insulating layer disposed on the first electrode, and including openings, each of the openings exposing different areas of the first electrode and defining respective cells; light emitting elements disposed in the respective cells, each of the light emitting elements including a first end electrically connected to the first electrode; and a second end protruding upward from the first insulating layer; and a second electrode disposed on the light emitting elements, and electrically connected to the second ends of each of the light emitting elements.

21 Claims, 47 Drawing Sheets

(51) Int. Cl.
  *H01L 33/00* (2010.01)
  *H01L 33/24* (2010.01)
  *H01L 33/44* (2010.01)

(52) U.S. Cl.
  CPC .............. *H01L 33/38* (2013.01); *H01L 33/44* (2013.01); *H01L 2933/0016* (2013.01)

(56) References Cited

U.S. PATENT DOCUMENTS

| | | | |
|---|---|---|---|
| 9,229,236 | B2 | 1/2016 | Hino et al. |
| 9,287,242 | B2 | 3/2016 | Shibata et al. |
| 9,570,425 | B2 | 2/2017 | Do |
| 9,773,761 | B2 | 9/2017 | Do |
| 9,985,012 | B2 | 5/2018 | Kwon |
| 10,276,630 | B2 | 4/2019 | Lee et al. |
| 10,338,712 | B2 | 7/2019 | Bok et al. |
| 10,373,985 | B2 | 8/2019 | Kim et al. |
| 10,418,527 | B2 | 9/2019 | Sasaki et al. |
| 10,629,791 | B2 | 4/2020 | Lim |
| 10,741,608 | B2 | 8/2020 | Chen |
| 10,818,647 | B2 | 10/2020 | Kim et al. |
| 2007/0087472 | A1 | 4/2007 | Huber et al. |
| 2011/0089850 | A1 | 4/2011 | Shibata et al. |
| 2017/0104009 | A1* | 4/2017 | Peng ............... H01L 29/458 |
| 2017/0294451 | A1 | 10/2017 | Kim et al. |
| 2018/0012876 | A1* | 1/2018 | Kim ................ H01L 33/387 |
| 2018/0026074 | A1* | 1/2018 | Lee ................. H01L 33/38 362/219 |
| 2018/0190672 | A1 | 7/2018 | Lee et al. |
| 2019/0245126 | A1* | 8/2019 | Lim ................ H01L 33/36 |
| 2019/0371823 | A1* | 12/2019 | Chang ............. H01L 27/1248 |
| 2021/0242380 | A1* | 8/2021 | Kim ................ H01L 33/38 |
| 2022/0231080 | A1* | 7/2022 | Li .................. H01L 25/0753 |

FOREIGN PATENT DOCUMENTS

| | | |
|---|---|---|
| JP | 4914929 | 4/2012 |
| KR | 10-2014-0085331 | 7/2014 |
| KR | 10-1436123 | 11/2014 |
| KR | 10-2015-0006798 | 1/2015 |
| KR | 10-2015-0098246 | 8/2015 |
| KR | 10-1711187 | 3/2017 |
| KR | 10-2017-0049117 | 5/2017 |
| KR | 10-2017-0109183 | 9/2017 |
| KR | 10-2017-0117282 | 10/2017 |
| KR | 10-2018-0007025 | 1/2018 |
| KR | 10-2018-0011404 | 2/2018 |
| KR | 10-2018-0030454 | 3/2018 |
| KR | 10-2019-0096474 | 8/2019 |

OTHER PUBLICATIONS

International Search Report, with English translation, corresponding to International Application No. PCT/KR2020/000814 dated May 6, 2020.

Written Opinion, with English translation, corresponding to International Application No. PCT/KR2020/000814, dated May 6, 2020.

* cited by examiner

FIG. 3A
FIG. 3B
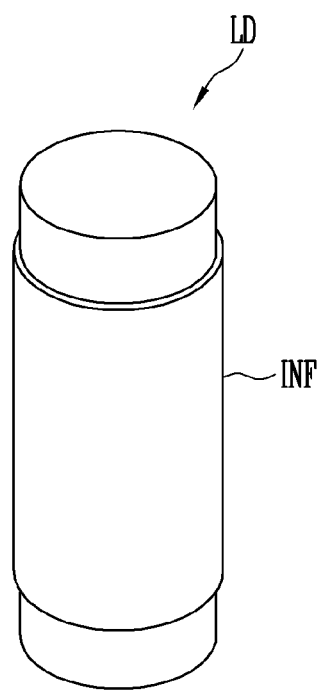
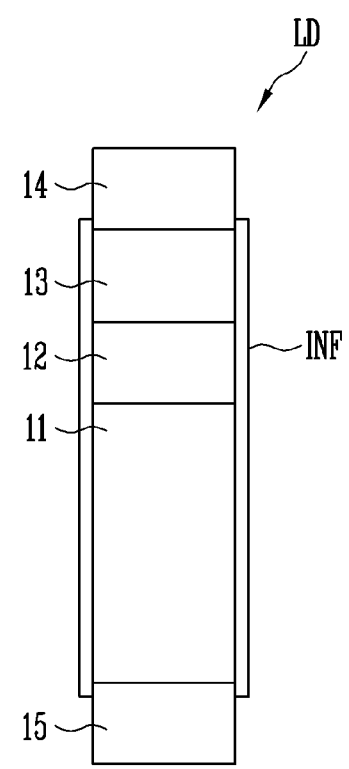

DISPLAY DEVICE AND MANUFACTURING METHOD THEREOF

CROSS-REFERENCE TO RELATED APPLICATION(S)

This application is a national entry of International Application No. PCT/KR2020/000814, filed on Jan. 16, 2020, which claims under 35 U.S.C. §§ 119(a) and 365(b) priority to and benefits of Korean Patent Application No. 10-2019-0047876, filed on Apr. 24, 2019 in the Korean Intellectual Property Office, the entire contents of which are incorporated herein by reference.

TECHNICAL FIELD

Embodiments of the disclosure relate to a display device and a method of fabricating the same.

DESCRIPTION OF THE RELATED ART

Recently, a technique of manufacturing a subminiature light emitting element using a material having a reliable inorganic crystal structure and manufacturing a light emitting device using the light emitting element has been developed. For example, a technique of fabricating subminiature light emitting elements each having a small size corresponding to a range from the nanometer scale to the micrometer scale, and forming light sources of various light emitting devices including pixels of display devices using the subminiature light emitting elements, has been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are directed to a display device having a pixel including light emitting elements, and a method of fabricating the same.

A display device in accordance with an embodiment may include a pixel disposed in a display area. The pixel may include a first electrode; a first insulating layer disposed on the first electrode, and including openings, each of the openings exposing different areas of the first electrode and defining respective cells; light emitting elements disposed in the respective cells, each of the light emitting elements including a first end electrically connected to the first electrode; and a second end protruding upward from the first insulating layer; and a second electrode disposed on the light emitting elements, and electrically connected to the second ends of each of the light emitting elements.

In an embodiment, each of the openings may have a width less than a length of each of the light emitting elements.

In an embodiment, each of the light emitting elements may be disposed in a vertical direction or a diagonal direction with respect to the first electrode and the second electrode.

In an embodiment, the first end of each of the light emitting elements may directly contact the first electrode.

In an embodiment, the second end of each of the light emitting elements may directly contact the second electrode.

In an embodiment, each of the openings may have a substantially polygonal shape, a substantially circular shape, a substantially elliptical shape, or a shape substantially corresponding to a combination thereof in a plan view, and each of the openings may be adjacent to each other in an emission area of the pixel.

In an embodiment, the display device may further include first contact electrodes disposed in each of the openings, and electrically contacting the first electrode and the first end of each of the light emitting elements.

In an embodiment, the display device may further include insulating patterns disposed in each of the openings and overlapping the first contact electrodes and the first end of each of the light emitting elements.

In an embodiment, the insulating patterns may include an organic insulating material.

In an embodiment, the display device may further include a second insulating layer disposed between the first insulating layer and the second electrode and surrounding each of the light emitting elements.

In an embodiment, the second insulating layer may include an organic insulating material, and portions of the second insulating layer may enclose each of the openings of the first insulating layer.

In an embodiment, the pixel may comprise at least one intermediate electrode spaced apart from the first electrode and the second electrode, and electrically connected between the first electrode and the second electrode by at least one light emitting element of the light emitting elements.

In an embodiment, the pixel may include intermediate electrodes. The intermediate electrodes may be alternately disposed on a layer on which the first electrode is disposed and a layer on which the second electrode is disposed.

In an embodiment, each of the light emitting elements may include rod-type light emitting elements or core-shell light emitting elements.

A method of fabricating a display device in accordance with an embodiment may include forming a first electrode on a base layer; forming a first insulating layer on the first electrode; forming an alignment electrode overlapping the first electrode and including first openings on the first insulating layer; forming second openings overlapping the first openings in the first insulating layer, using the alignment electrode as a mask; supplying light emitting elements on the base layer, and aligning the light emitting elements in cells formed by the first openings and the second openings by applying alignment signals to the first electrode and the alignment electrode; electrically connecting first ends of the light emitting elements to the first electrode; and forming a second electrode on second ends of the light emitting elements to electrically connect the second electrodes to the second ends of the light emitting elements.

In an embodiment, the electrically connecting of the first ends of the light emitting elements to the first electrode may include forming a conductive layer overlapping the alignment electrode and the light emitting elements after the light emitting elements are aligned; forming an organic insulating layer on the conductive layer; and etching the conductive layer and the organic insulating layer such that the conductive layer to have a height in the first openings and the second openings.

In an embodiment, the alignment electrode may be removed in the etching of the conductive layer.

In an embodiment, the method may further include forming a second insulating layer overlapping the first insulating layer and the light emitting elements after the alignment electrode is removed; and partially etching the second insulating layer in a thickness direction such that the second ends of the light emitting elements are exposed.

In an embodiment, the method may further include dividing a lower electrode pattern including the first electrode into the first electrode and at least one intermediate electrode, after the aligning of the light emitting elements and before the forming of the second electrode.

In an embodiment, the forming of the second electrode may include forming the second electrode and at least one intermediate electrode on different light emitting elements among the light emitting elements, respectively.

In a display device and a method of fabricating the display device in accordance with various embodiments, light emitting elements may be reliably connected between a first electrode and a second electrode of each pixel, and light efficiency of each pixel may be enhanced.

BRIEF DESCRIPTION OF THE DRAWINGS

The above and other aspects and features of the disclosure will become more apparent by describing in detail embodiments thereof with reference to the attached drawings, in which:

FIGS. 3A and 3B are respectively a schematic perspective view and a schematic cross-sectional view illustrating a light emitting element in accordance with an embodiment.

DETAILED DESCRIPTION OF THE EMBODIMENTS

Figure 1A:
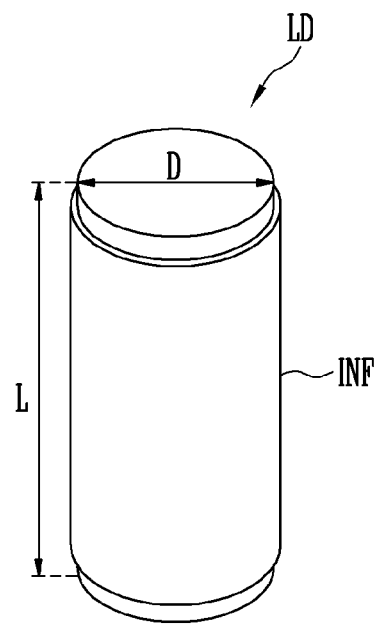
FIGS. 1A and 1B are respectively a schematic perspective view and a schematic cross-sectional view illustrating a light emitting element in accordance with an embodiment.

Reference will now be made in detail to various embodiments, examples of which are illustrated in the accompanying drawings and described below, and the embodiments can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. It will be further understood that the terms "comprise", "include", "have", etc. and their variations thereof when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first component or part is disposed on a second component or part, the first component or part may be not only directly on the second component or part but a third component or part may also intervene between them. Furthermore, the term "position", "direction", etc.

used in the following description are defined in relative terms, and it should be noted that they may be changed into a reverse position or direction depending on a view angle or direction. Furthermore, a singular form may include a plural form unless stated otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 1B, 2A, 2B, 3A, and 3B are schematic perspective views and schematic cross-sectional views each illustrating a light emitting element LD in accordance with an embodiment. Although FIGS. 1A to 3B illustrate cylindrical rod-type light emitting elements LD, the type and/or shape of the light emitting elements LD in accordance with the disclosure is not limited thereto.

Figure 1B:
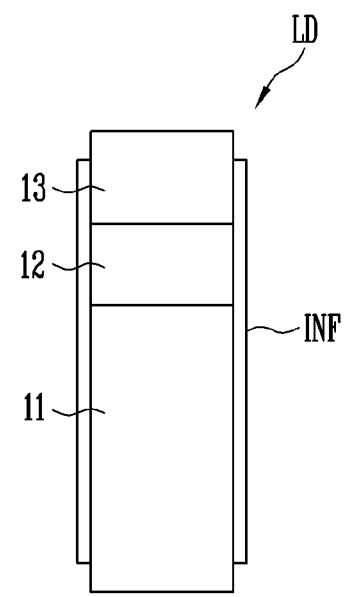

Referring to FIGS. 1A and 1B, a light emitting element LD in accordance with an embodiment may include a first conductivity type semiconductor layer 11 (also referred to as "first semiconductor layer"), a second conductivity type semiconductor layer 13 (also referred to as "second semiconductor layer"), and an active layer 12 interposed between the first and second conductivity type semiconductor layers 11 and 13. For example, the light emitting element LD may include the first conductivity type semiconductor layer 11, the active layer 12, and the second conductivity type semiconductor layer 13 which may be successively stacked each other in a longitudinal direction.

In an embodiment, the light emitting element LD may be provided or disposed in the form of a rod extending in one direction or a direction. If the direction in which the light emitting element LD extends is defined as a longitudinal direction, the light emitting element LD may have a first end and a second end with respect to the longitudinal direction.

In an embodiment, one of the first and second conductivity type semiconductor layers 11 and 13 may be disposed on the first end of the light emitting element LD. The other one of the first and second conductivity type semiconductor layers 11 and 13 may be disposed on the second end of the light emitting element LD.

In an embodiment, the light emitting element LD may be a rod-type light emitting element (also referred to as "rod-type light emitting diode") fabricated in the form of a rod by an etching scheme or the like within the spirit and the scope of the disclosure. In this specification, the term "rod-type" embraces a rod-like shape and a bar-like shape such as a substantially cylindrical shape and a substantially prismatic shape extending in a longitudinal direction (for example, to have an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanometer scale to the micrometer scale. For example, each light emitting element LD may have a diameter D (or a width) and/or a length L ranging from the nanometer scale to the micrometer scale. However, in the disclosure, the size of the light emitting element LD is not limited thereto. For example, the size of the light emitting element LD may be changed in various ways depending on design conditions of various devices, for example, a display device, which employs, as a light source, a light emitting device using a light emitting element LD.

The first conductivity type semiconductor layer 11 may include, for example, at least one N-type semiconductor layer. For instance, the first conductivity type semiconductor layer 11 may include an N-type semiconductor layer which may include any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited to this, and the first conductivity type semiconductor layer 11 may be formed of various other materials.

The active layer 12 may be disposed on the first conductivity type semiconductor layer 11 and have a single or multi-quantum well (MQW) structure. In an embodiment, a cladding layer (not shown) doped with a conductive dopant may be formed over and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied between the opposite ends of the light emitting element LD, the light emitting element LD may emit light by recombination of electron-hole pairs in the active layer 12. Since light emission of the light emitting element LD can be controlled based on the foregoing principle, the light emitting element LD may be used as a light source of various light emitting devices as well as a pixel of the display device.

The second conductivity type semiconductor layer 13 may be disposed on the active layer 12 and include a semiconductor layer having a type different from that of the first conductivity type semiconductor layer 11. For example, the second conductivity type semiconductor layer 13 may include at least one P-type semiconductor layer. For instance, the second conductivity type semiconductor layer 13 may include a P-type semiconductor layer which may include any one semiconductor material of InAlGaN, GaN, AlGaN, InGaN, AlN, and InN, and is doped with a second conductive dopant such as Mg. However, the material for forming the second conductivity type semiconductor layer 13 is not limited to this, and the second conductivity type semiconductor layer 13 may be formed of various other materials.

In an embodiment, the light emitting element LD may further include an insulating film INF provided or disposed on the surface or on a surface of the light emitting element LD. The insulating film INF may be formed or disposed on the surface or on a surface of the light emitting element LD to enclose an outer circumferential surface of at least the active layer 12, and may further enclose areas of the first and second conductivity type semiconductor layers 11 and 13. Here, the insulating film INF may allow the opposite ends of the light emitting element LD that have different polarities to be exposed to the outside. For example, the insulating film INF may expose one end of each of the first and second conductivity type semiconductor layers 11 and 13 that are disposed on the respective opposite ends of the light emitting element LD with respect to the longitudinal direction, for example, may expose two base sides of the cylinder (in FIGS. 1A and 1B, the top and bottom surfaces of the light emitting element LD) rather than covering or overlapping the two base sides.

In an embodiment, the insulating film INF may include at least one insulating material of silicon dioxide (SiO$_2$), silicon nitride (Si$_3$N$_4$), aluminum oxide (Al$_2$O$_3$), and titanium dioxide (TiO$_2$), but it is not limited thereto. In other words, the material that forms the insulating film INF is not limited to a particular material, and the insulating film INF may be formed of various insulating materials.

In an embodiment, the light emitting element LD may further include additional other components as well as the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on one end of the first conductivity type semiconductor layer 11, the active layer 12, and/or the second conductivity type semiconductor layer 13.

Figure 2A:
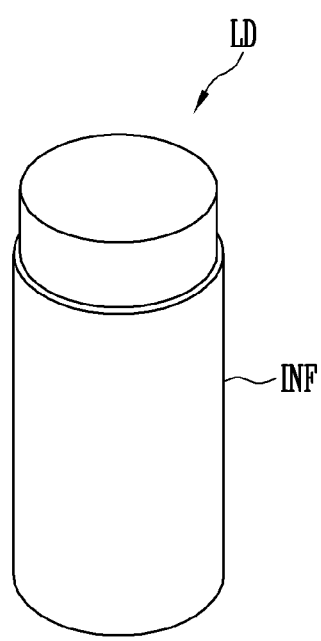
FIGS. 2A and 2B are respectively a schematic perspective view and a schematic cross-sectional view illustrating a light emitting element in accordance with an embodiment.
Figure 2B:
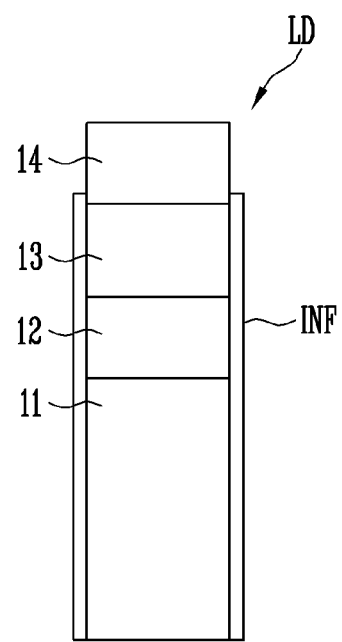

For example, as illustrated in FIGS. 2A and 2B, the light emitting element LD may further include at least one electrode layer 14 disposed on one end of the second conductivity type semiconductor layer 13. In an embodiment, as illustrated in FIGS. 3A and 3B, the light emitting element LD may further include at least one electrode layer 15 disposed on one end of the first conductivity type semiconductor layer 11.

Each of the electrode layers 14 and 15 may be an ohmic contact electrode, but it is not limited thereto. Each of the electrode layers 14 and 15 may include metal or metal oxide. For example, each of the electrode layers 14 and 15 may be formed of transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer circumferential surfaces of the electrode layers 14 and 15, or may not enclose the outer circumferential surfaces thereof. In other words, the insulating film INF may be selectively formed on the surfaces of the electrode layers 14 and 15. Furthermore, the insulating film INF may be formed to expose the opposite ends of the light emitting element LD that have different conductivity types and, for example, may expose at least one area of each of the electrode layers 14 and 15. In an embodiment, the insulating film INF may not be provided.

If the insulating film INF is provided or disposed on the surface or on a surface of the light emitting element LD, for example, on the surface or on a surface of the active layer 12, the active layer 12 may be prevented from short-circuiting with at least one electrode (for example, a first or second electrode of the pixel), which is not shown. Consequently, the electrical stability of the light emitting element LD may be secured. In the description of each embodiment, the term "connecting or connection" may comprehensively refer to physical and/or electrical connecting or connection (or coupling). Furthermore, the term "connecting or connection" may comprehensively refer to direct and/or indirect connecting or connection and integral or non-integral connecting or connection.

Furthermore, by forming the insulating film INF on the surface of the light emitting element LD, occurrence of a defect on the surface of the light emitting element LD may be minimized, whereby the lifetime and efficiency of the light emitting element LD may be improved. If the insulating film INF is formed on each light emitting element LD, even in case that light emitting elements LD are disposed adjacent to each other, the light emitting elements LD may be prevented from undesirably short-circuiting.

In an embodiment, a surface treatment process may be performed to fabricate the light emitting element LD. For example, each light emitting element LD may be surface-treated so that, in case that light emitting elements LD are mixed with a fluidic solution (or solvent) and supplied to each emission area (for example, an emission area of each pixel), the light emitting elements LD can be evenly dispersed rather than unevenly aggregating in the solution.

In an unlimited embodiment pertaining to this, the insulating film INF itself may be formed of a hydrophobic film using hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, etc., within the spirit and the scope of the disclosure. Furthermore, the hydrophobic material may be a commercially available fluorine containing material such as Teflon™ or Cytop™, or a corresponding material.

A light emitting device including the light emitting element LD described above may be used not only in a display device but also in various devices which requires a light source. For instance, at least one subminiature light emitting element LD, for example, subminiature light emitting elements LD each having a size ranging from the nanometer scale to the micrometer scale, may be disposed in each pixel area of the display panel to form a light source (or, a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

Figure 4A:
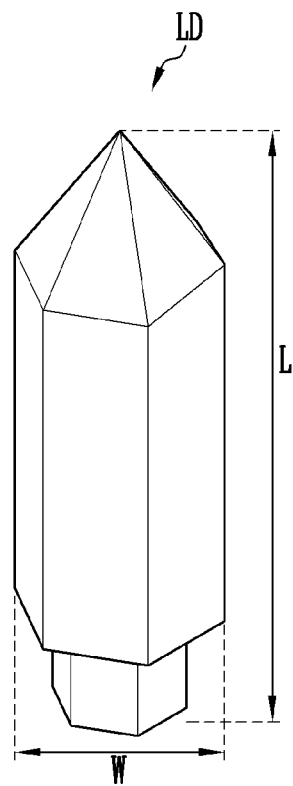
FIGS. 4A and 4B are respectively a schematic perspective view and a schematic cross-sectional view illustrating a light emitting element in accordance with an embodiment.
Figure 4B:
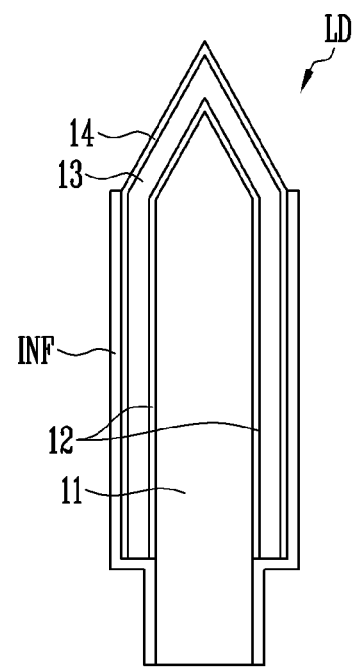

FIGS. 4A and 4B are respectively a schematic perspective view and a schematic cross-sectional view illustrating a light emitting element in accordance with an embodiment. In an embodiment, FIGS. 4A and 4B illustrate a light emitting element LD having a structure different from that of the light emitting elements LD illustrated in FIGS. 1A to 3B, and for example illustrate a light emitting element LD having a core-shell structure. In other words, the type, the structure, and/or the shape of the light emitting element LD in accordance with an embodiment may be changed in various ways. In descriptions of an embodiment of FIGS. 4A and 4B, like reference numerals are used to designate components similar or equal (or corresponding) to those of the embodiments of FIGS. 1A to 3B, and detailed descriptions thereof will be omitted.

Referring to FIGS. 4A and 4B, a light emitting element LD in accordance with an embodiment may include a first conductivity type semiconductor layer 11, a second conductivity type semiconductor layer 13, and an active layer 12 interposed between the first and second conductivity type semiconductor layers 11 and 13. In an embodiment, the first conductivity type semiconductor layer 11 may be disposed in a central area of the light emitting element LD, and the active layer 12 may be disposed on a surface of the first conductivity type semiconductor layer 11 to enclose at least one area of the first conductivity type semiconductor layer 11. The second conductivity type semiconductor layer 13 may be disposed on a surface of the active layer 12 to enclose at least one area of the active layer 12.

The light emitting element LD may further include an electrode layer 14 that may enclose at least one area of the second conductivity type semiconductor layer 13, and/or an insulating film INF disposed on an outermost surface of the light emitting element LD. For example, the light emitting element LD may further include the electrode layer 14 disposed on a surface of the second conductivity type semiconductor layer 13 to enclose one area of the second conductivity type semiconductor layer 13, and the insulating film INF disposed on a surface of the electrode layer 14 to enclose at least one area of the electrode layer 14. In an embodiment, the insulating film INF may be disposed on only a portion of the surface of the light emitting element LD such that one area of the first conductivity type semiconductor layer 11 and one area of the second conductivity type semiconductor layer 13 and/or the electrode layer 14 are exposed.

The light emitting element LD in accordance with the foregoing embodiment may be a core-shell light emitting element (also referred to as "core-shell light emitting diode") fabricated by a growth scheme or the like within the spirit and the scope of the disclosure. For example, the light emitting element LD may have a core-shell structure including the first conductivity type semiconductor layer 11, the active layer 12, the second conductivity type semiconductor layer 13, the electrode layer 14, and the insulating film INF that are successively disposed in a direction from the center to the periphery. Here, the electrode layer 14 and the insulating film INF may be selectively included in the light emitting element LD. In an embodiment, the light emitting element LD may not include at least one of the electrode layer 14 and the insulating film INF.

In an embodiment, the light emitting element LD may have a substantially polypyramid shape extending in one direction or in a direction. For example, at least one area of the light emitting element LD may have a substantially hexagonal pyramid shape. However, the shape of the light emitting element LD may be changed in various ways.

If the direction in which the light emitting element LD extends is defined as a longitudinal direction, the light emitting element LD may have a first end and a second end with respect to the longitudinal direction. In an embodiment, one of the first and second conductivity type semiconductor layers 11 and 13 (or an electrode layer disposed on any one side or any side of the first and second conductivity type semiconductor layers 11 and 13) is disposed on one end of the light emitting element LD. The other one of the first and second conductivity type semiconductor layers 11 and 13 (or an electrode layer disposed on the other side of the first and second conductivity type semiconductor layers 11 and 13) may be disposed on the other end of the light emitting element LD.

In an embodiment, the light emitting element LD may be a light emitting diode, which may have a core-shell structure one end or an end of which protrudes in a substantially polypyramid shape (for example, a substantially hexagonal pyramid shape), and may have a subminiature size. In an embodiment, the light emitting element LD may have a small size ranging from the nanometer scale to the micrometer scale, for example, a width W and/or a length L corresponding to the nanometer scale or the micrometer scale. Here, the size and the shape of the light emitting element LD may be changed depending on design conditions of various devices, for example, a display device, which employs the light emitting element LD as a light source.

In an embodiment, the opposite ends of the first conductivity type semiconductor layer 11 may have shapes protruding in the longitudinal direction of the light emitting element LD. The shapes in which the opposite ends of the first conductivity type semiconductor layer 11 protrude outward may differ from each other. For example, disposed at an upper position, a first end of the opposite ends of the first conductivity type semiconductor layer 11 may have a conical shape the width of which is reduced upward to form one apex. Furthermore, disposed at a lower position, a second end of the opposite ends of the first conductivity type semiconductor layer 11 may have a substantially prismatic shape (for example, a substantially hexagonal prism shape) having a constant width, but the disclosure is not limited thereto. For example, in an embodiment, the first conductivity type semiconductor layer 11 may have a polygonal or stepped cross-section, the width of which is gradually reduced downward. The shapes of the opposite ends of the first conductivity type semiconductor layer 11 may be changed in various ways depending on embodiments, and are not limited to those of the foregoing embodiments.

In an embodiment, the first conductivity type semiconductor layer 11 may be disposed in a core of the light emitting element LD, for example, a central (or middle) portion of the light emitting element LD. Furthermore, the light emitting element LD may have a shape corresponding to or substantially corresponding to the shape of the first conductivity type semiconductor layer 11. For instance, if the first conductivity type semiconductor layer 11 has a substantially hexagonal pyramid shape on at least one end thereof, the light emitting element LD may have a substantially hexagonal pyramid shape on at least one end thereof.

The active layer 12 may be provided or disposed and/or formed in a shape enclosing an outer circumferential surface of the first conductivity type semiconductor layer 11. For example, the active layer 12 may be provided or disposed and/or formed in a shape enclosing an area of the first conductivity type semiconductor layer 11, other than one end (for example, one end disposed at a lower position) of the first conductivity type semiconductor layer 11 with respect to the longitudinal direction of the light emitting element LD.

The second conductivity type semiconductor layer 13 may be provided or disposed and/or formed in a shape enclosing an outer circumferential surface of the active layer 12, and include a semiconductor layer having a type different from that of the first conductivity type semiconductor layer 11. For example, in the case where the first conductivity type semiconductor layer 11 may include at least one N-type semiconductor layer, the second conductivity type semiconductor layer 13 may have at least one P-type semiconductor layer.

In an embodiment, the light emitting element LD may include an electrode layer 14 that encloses an outer circumferential surface of the second conductivity type semiconductor layer 13. The electrode layer 14 may be an ohmic contact electrode electrically connected to the second conductivity type semiconductor layer 13, but the disclosure is not limited thereto.

As described above, the light emitting element LD may have a core-shell structure with the opposite ends protruding outward, and may include the first conductivity type semiconductor layer 11 provided or disposed in the central portion thereof, the active layer 12 which encloses the first conductivity type semiconductor layer 11, the second conductivity type semiconductor layer 13 which encloses the active layer 12, and the electrode layer 14 which encloses the second conductivity type semiconductor layer 13. The first conductivity type semiconductor layer 11 may be disposed on the first end of the light emitting element LD, and the electrode layer 14 may be disposed on the second end of the light emitting element LD.

In an embodiment, the light emitting element LD may further include an insulating film INF provided or disposed on the surface or on a surface thereof. The insulating film INF may include transparent insulating material. However, the insulating film INF may be selectively provided or disposed and/or formed on the light emitting element LD. For example, in an embodiment, the insulating film INF may not be provided or disposed on the surface or on a surface of the light emitting element LD.

In an embodiment, the insulating film INF may be provided to cover or overlap a portion of the outer circumferential surface of the first conductivity type semiconductor layer 11 and a portion of the outer circumferential surface of the electrode layer 14. In an embodiment, after the insulating film INF is first formed to cover or overlap the entirety of the outer circumferential surface of the electrode layer 14 included in the light emitting element LD, the insulating film INF may be partially removed to expose one area of the electrode layer 14 for electrical connection with an electrode, which is not shown, (for example, a first electrode of a pixel).

A light emitting device including the light emitting element LD described above may be used in various devices which requires a light source. For example, the light emitting device may also be used in various electronic devices such as a display device or a lighting device, which requires a light source.

Figure 5:
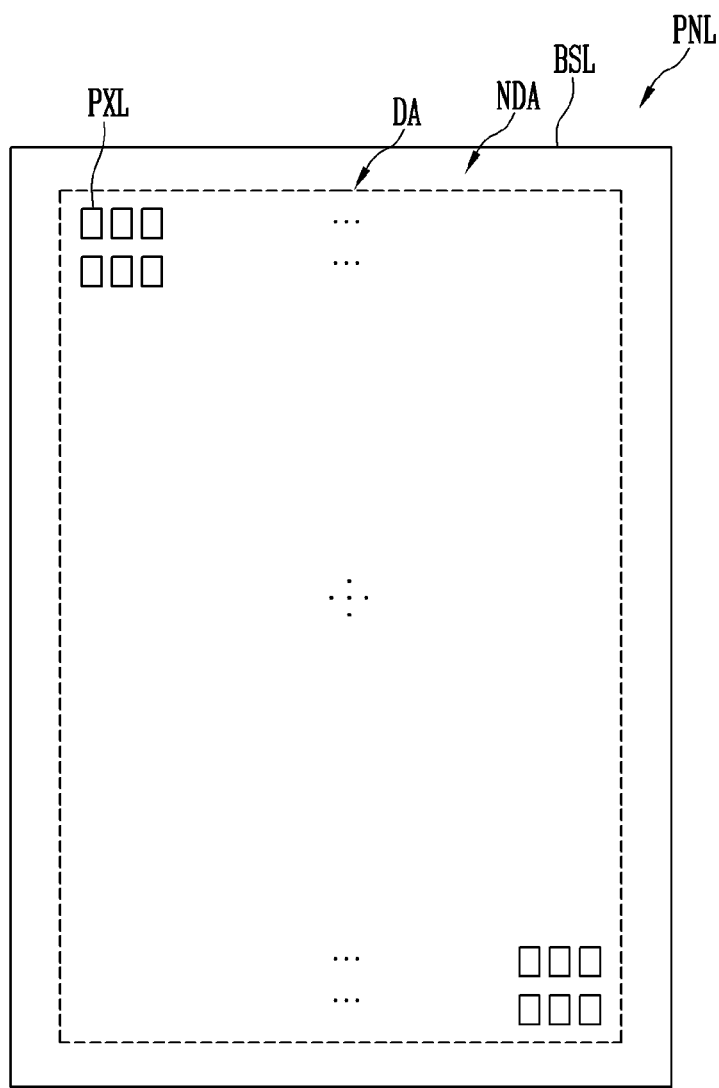
FIG. 5 is a schematic plan view illustrating a display device in accordance with an embodiment.

FIG. 5 is a schematic plan view illustrating a display device in accordance with an embodiment. In an embodiment, FIG. 5 illustrates a display device, for example, a display panel PNL provided or disposed in the display device, as an example of a device which may use, as a light source, the light emitting element LD in accordance with the embodiments of FIGS. 1A to 4B. For example, each pixel PXL of the display panel PNL may have at least one light emitting element LD.

For the sake of explanation, FIG. 5 illustrates the structure of the display panel PNL in accordance with an embodiment, focused on a display area DA. In an embodiment, although not illustrated, at least one driving circuit (for example, at least one of a scan driver and a data driver) and/or lines may be further provided or disposed in the display panel PNL.

Referring to FIG. 5, the display panel PNL in accordance with an embodiment may include a base layer BSL, and pixels PXL disposed on the base layer BSL. In detail, the display panel PNL and the base layer BSL for forming the display panel PNL may include a display area DA for displaying an image, and a non-display area NDA formed in an area other than the display area DA. The pixels PXL may be disposed in the display area DA on the base layer BSL.

In an embodiment, the display area DA may be disposed in a central area of the display panel PNL, and the non-display area NDA may be disposed in a peripheral area of the display panel PNL in such a way as to enclose the display area DA. The locations of the display area DA and the non-display area NDA are not limited to this, and the locations thereof may be changed. The display area DA may form a screen on which an image is displayed.

The base layer BSL may form a base of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

One area on the base layer BSL may be defined as the display area DA in which the pixels PXL are disposed, and the other area thereof may be defined as the non-display area NDA. For example, the base layer BSL may include the display area DA including pixel areas in which the respective pixels PXL are formed, and the non-display area NDA disposed around the display area DA. Various lines and/or internal circuits which are connected to the pixels PXL of the display area DA may be disposed in the non-display area NDA.

In an embodiment, the pixels PXL (also referred to as "sub-pixels") may be disposed in each pixel area of the display area DA. In an embodiment, the pixels PXL may be arranged or disposed in the display area DA in a stripe or PenTile® arrangement manner, but the disclosure is not limited thereto. For example, the pixels PXL may be arranged or disposed in the display area DA in various arrangement manners. Furthermore, each pixel PXL may be a white pixel or a pixel that may emit light having a specific or given color (for example, red, green, or blue). In the case where each pixel PXL is a pixel that may emit light of a specific or given color, pixels PXL which emit light of different colors may be assembled adjacent to each other to form each pixel unit (also referred to as "unit pixel") that may generate various colors of light.

Each pixel PXL may include at least one light source which is driven by a control signal (for example, a scan signal and a data signal) and/or a power source (for example, a first power source (or first power supply) and a second power source (or second power supply)). In an embodiment, each of the pixels PXL may include at least one light emitting element LD in accordance with any one of the embodiments of FIGS. 1A to 3B, for example, at least one subminiature rod-type light emitting element LD having a small size corresponding to the nanometer scale or the micrometer scale. In an embodiment, each of the pixels PXL may include at least one light emitting element LD in accordance with the embodiment of FIGS. 4A and 4B, for example, at least one subminiature core-shell light emitting element LD having a small size corresponding to the nanometer scale or the micrometer scale. Different types of light emitting elements LD may be used as a light source of the pixel PXL.

In an embodiment, each pixel PXL may be formed of an active pixel. However, the types, structures, and/or driving schemes of the pixels PXL capable of being applied to the display device according to the disclosure are not particularly limited. For example, each pixel PXL may have the same structure as that of a pixel for passive or active light emitting display devices which may have various structures and/or may be operated in various driving schemes.

FIGS. 6A to 6G are schematic diagrams of equivalent circuits each illustrating a pixel PXL in accordance with an. For example, FIGS. 6A to 6G illustrate different embodiments of the pixel PXL which can be applied to an active display device. However, the types of pixels PXL and display devices to which embodiments may be applied are not limited thereto. In an embodiment, each pixel PXL illustrated in FIGS. 6A to 6G may be any one of the pixels PXL provided or disposed in the display panel PNL of FIG. 5. The pixels PXL may have substantially the same or similar structure.

Figure 6A:
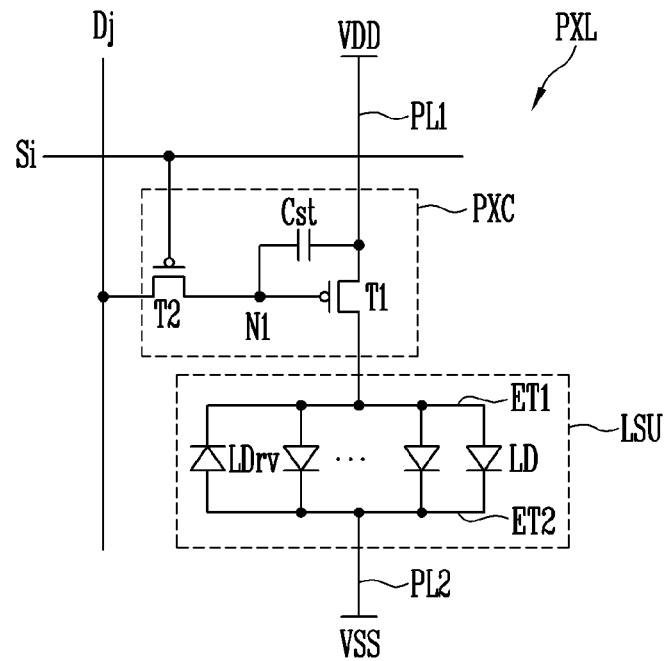
FIGS. 6A to 6G are schematic diagrams of equivalent circuits each illustrating a pixel in accordance with an embodiment.

Referring to FIG. 6A, the pixel PXL in accordance with an embodiment may include a light source unit LSU that may generate light having a luminance corresponding to a data signal. The pixel PXL may further include a pixel circuit PXC that may drive the light source unit LSU.

In an embodiment, the light source unit LSU may include light emitting elements LD that are connected between the first power source VDD and the second power source VSS. For example, the light source unit LSU may include a first electrode ET1 (also referred to as "first pixel electrode") connected to the first power source VDD via the pixel circuit PXC and the first power line PL1, a second electrode ET2 connected to the second power source VSS through the second power line PL2, and light emitting elements LD connected in parallel to each other in an identical direction between the first and second electrodes ET1 and ET2. In an embodiment, the first electrode ET1 may be an anode electrode, and the second electrode ET2 may be a cathode electrode.

In an embodiment, each of the light emitting elements LD may include a P-type end connected to the first power source VDD through the first electrode ET1 and/or the pixel circuit PXC, and an N-type end connected to the second power source VSS through the second electrode ET2. In an embodiment, the light emitting elements LD may be connected in parallel between the first electrode ET1 and the second electrode ET2 in a forward direction. As such, each of the light emitting elements LD connected in a forward direction between the first power source VDD and the second power source VSS may form a valid light source. A group of valid light sources may form the light source unit LSU of the pixel PXL.

In an embodiment, the first and second power sources VDD and VSS may have different potentials to make it possible for the light emitting elements LD to emit light. For example, the first power source VDD may be set as a high-potential power source, and the second power source VSS may be set as a low-potential power source. Here, a difference in potential between the voltages of the first and second power sources VDD and VSS may be set to a threshold voltage of the light emitting elements LD or more during at least an emission period of the pixel PXL.

In an embodiment, the first ends (for example, the P-type ends) of the light emitting elements LD that form each light source unit LSU may be connected in common to the pixel circuit PXC through one electrode of the light source unit LSU (for example, the first electrode ET1 (referred also as to "first pixel electrode" or "first alignment electrode") of each pixel PXL), and be connected to the first power source VDD through the pixel circuit PXC and the first power line PL1. The second ends (for example, the N-type ends) of the light emitting elements LD may be connected in common to the second power source VSS through another electrode of the light source unit LSU (for example, a second electrode ET2 (referred also as to "second pixel electrode" or "second alignment electrode") of each pixel PXL) and the second power line PL2.

The light emitting elements LD of the light source unit LSU may emit light having a luminance corresponding to driving current supplied thereto through the pixel circuit PXC. For example, during each frame period, the pixel circuit PXC may supply, to the light source unit LSU, driving current corresponding to a gray scale value of data of the corresponding frame. The driving current supplied to the light source unit LSU may be divided into parts that flow to the light emitting elements LD connected in the forward direction. Hence, each of the light emitting elements LD may emit light having a luminance corresponding to current applied thereto, so that the light source unit LSU may emit light having a luminance corresponding to the driving current.

In an embodiment, the light source unit LSU may further include at least one invalid light source, as well as including the light emitting elements LD that form each valid light source. For example, at least one reverse light emitting element LDrv may be further connected between the first and second electrodes ET1 and ET2 of the light source unit LSU.

Each reverse light emitting element LDrv, along with the light emitting elements LD that form the valid light sources, may be connected in parallel to each other between the first and second electrodes ET1 and ET2, and may be connected between the first and second electrodes ET1 and ET2 in a direction opposite to that of the light emitting elements LD. For example, the N-type end of the reverse light emitting element LDrv may be connected to the first power source VDD via the first electrode ET1 and the pixel circuit PXC. The P-type end of the reverse light emitting element LDrv may be connected to the second power source VSS via the second electrode ET2. Even in case that a driving voltage (for example, a forward directional driving voltage) is applied between the first and second electrodes ET1 and ET2, the reverse light emitting element LDrv remains deactivated. Hence, current substantially does not flow through the reverse light emitting element LDrv.

The pixel circuit PXC may be connected to a scan line Si and a data line Dj of the corresponding pixel PXL. For example, if the pixel PXL is disposed on an i-th row (i is a natural number) and a j-th column (j is a natural number) of the display area DA, the pixel circuit PXC of the pixel PXL may be connected to an i-th scan line Si and a j-th data line Dj of the display area DA. In an embodiment, the pixel circuit PXC may include first and second transistors T1 and T2, and a storage capacitor Cst.

The first transistor T1 (also referred to as "driving transistor") may be connected between the first power source VDD and the light source unit LSU. A gate electrode of the first transistor T1 may be connected to a first node N1. The first transistor T1 may control driving current to be supplied to the light source unit LSU in response to the voltage of the first node N1.

The second transistor T2 (also referred to as "switching transistor") may be connected between the data line Dj and the first node N1. A gate electrode of the second transistor T2 may be connected to the scan line Si. In case that a scan signal having a gate-on voltage (for example, a low level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2. Thereby, a voltage corresponding to the data signal is charged to the storage capacitor Cst.

One electrode of the storage capacitor Cst may be connected to the first power source VDD, and the other electrode thereof may be connected to the first node N1. The storage capacitor Cst may charge a voltage corresponding to a data signal to be supplied to the first node N1 during each frame period.

Although in FIG. 6A the transistors, for example, the first and second transistors T1 and T2, included in the pixel circuit PXC have been illustrated as being formed of P-type transistors, the disclosure is not limited to this. In other words, at least one of the first and second transistors T1 and T2 may be changed to an N-type transistor.

Figure 6B:
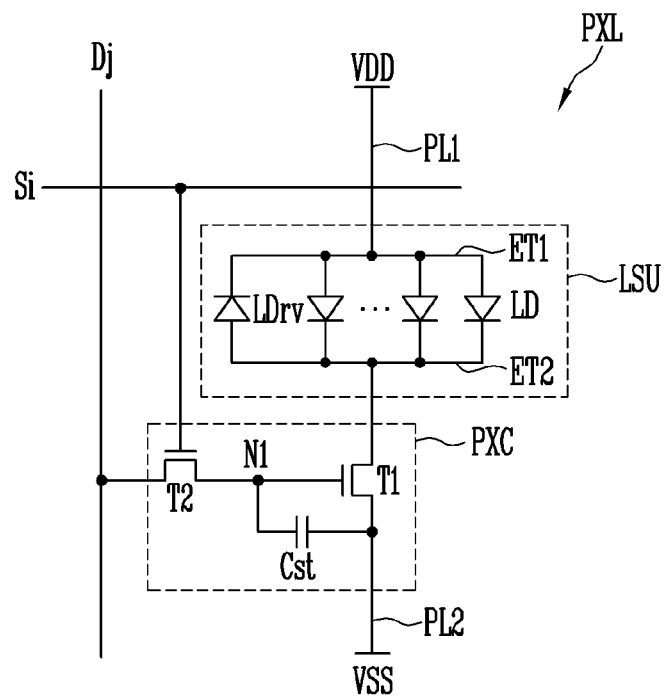

For example, as shown in FIG. 6B, both the first and second transistors T1 and T2 may be formed of N-type transistors. The gate-on voltage of the scan signal for writing the data signal supplied to the data line Dj in each frame period to the pixel PXL may be a high level voltage (also referred to as "gate-high voltage"). Likewise, the voltage of the data signal for turning on the first transistor T1 may be a voltage having a level opposite to that of the embodiment of FIG. 6A. For example, in the embodiment of FIG. 6B, as a gray scale value that is to be expressed increases, a data signal having a higher voltage may be supplied.

In an embodiment, an interconnection position between the pixel circuit PXC and the light source unit LSU may be changed. For example, as illustrated in FIG. 6B, in case that both the first and second transistors T1 and T2 that form the pixel circuit PXC are N-type transistors, the pixel circuit PXC may be connected between the light source unit LSU and the second power source VSS, and the storage capacitor Cst may be connected between the first node N1 and the second power source VSS. However, the disclosure is not limited thereto. For example, in an embodiment, even in case that the pixel circuit PXC is formed of N-type transistors, the pixel circuit PXC may be connected between the first power source VDD and the light source unit LSU.

The pixel PXL shown in FIG. 6B is substantially similar in configuration and operation to the pixel PXL of FIG. 6A, except that the connection positions of some or part of circuit elements and the voltage levels of control signals (for example, a scan signal and a data signal) are changed depending on a change in type of the transistor. Therefore, detailed description of the pixel PXL of FIG. 6B will be omitted.

The structure of the pixel circuit PXC is not limited to the embodiments shown in FIGS. 6A and 6B. For example, the configuration of the pixel circuit PXC may be similar to that of embodiments illustrated in FIGS. 6C and 6D. In other words, the pixel circuit PXC may be formed of a pixel circuit which may have various structures and/or be operated by various driving schemes.

Figure 6C:
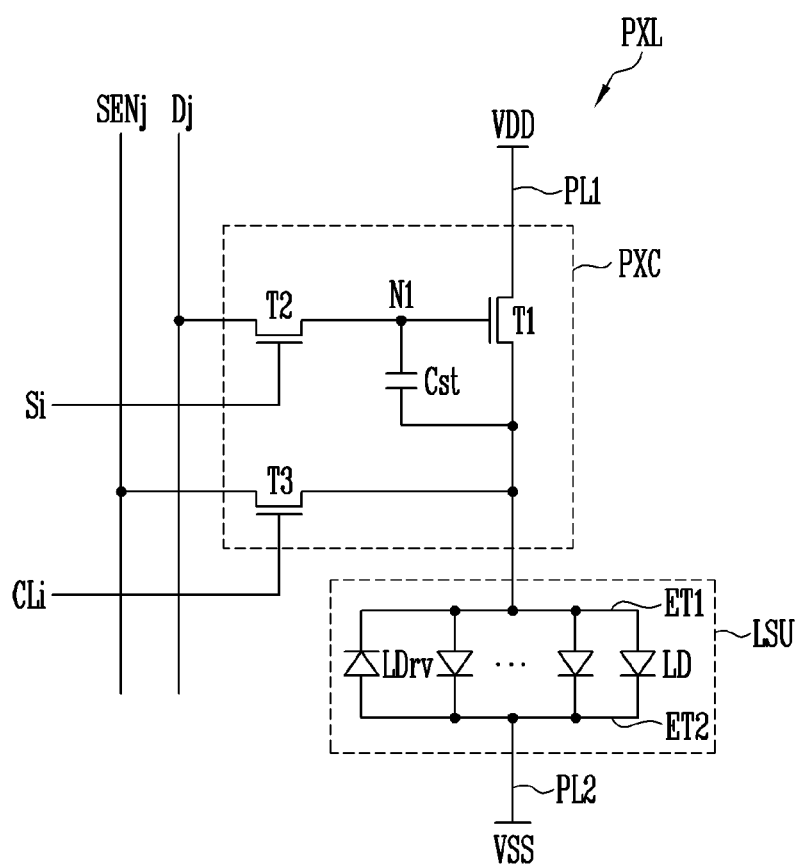

Referring to FIG. 6C, the pixel circuit PXC may be further connected to a control line CLi and a sensing line SENj. For example, the pixel circuit PXC of the pixel PXL disposed on the i-th row and the j-th column of the display area DA may be connected to an i-th control line CLi and a j-th sensing line SENj of the display area DA. The pixel circuit PXC may further include a third transistor T3.

The third transistor T3 may be connected between the first transistor T1 and the sensing line SENj. For example, a first electrode of the third transistor T3 may be connected to one electrode (for example, a source electrode) of the first transistor T1 connected to the first electrode ET1, and a second electrode of the third transistor T3 may be connected to the sensing line SENj. In the case where the sensing line SENj is omitted, a second electrode of the third transistor T3 may be connected to the data line Dj.

In an embodiment, the gate electrode of the third transistor T3 may be connected to the control line CLi. In the case where the control line CLi is omitted, the gate electrode of the third transistor T3 may be connected to the scan line Si. The third transistor T3 may be turned on by a control signal having a gate-on voltage (for example, a high level voltage) supplied to the control line CLi during a sensing period, and thus electrically connect the sensing line SENj with the first transistor T1.

In an embodiment, the sensing period may be a period in which characteristic information of each of the pixels PXL disposed in the display area DA (for example, a threshold voltage, etc. of the first transistor T1) are extracted. During the sensing period, the first transistor T1 may be turned on by supplying a reference voltage capable of turning on the first transistor T1 to the first node N1 through the data line Dj and the second transistor T2, or connecting each pixel PXL to a current source or the like within the spirit and the scope of the disclosure. Furthermore, the third transistor T3 may be turned on by supplying a control signal having a gate-on voltage to the third transistor T3, so that the first transistor T1 can be connected to the sensing line SENj. Hence, the characteristic information of each pixel PXL that may include the threshold voltage, etc. of the first transistor T1 may be extracted through the sensing line SENj. The extracted characteristic information may be used to convert image data to compensate for a deviation in characteristics between the pixels PXL.

Although FIG. 6C illustrates an embodiment where all of the first, second, and third transistors T1, T2, and T3 are N-type transistors, the disclosure is not limited thereto. For example, at least one of the first, second, and third transistors T1, T2, and T3 may be changed to a P-type transistor. Furthermore, although FIG. 6C illustrates an embodiment where the light source unit LSU may be connected between the pixel circuit PXC and the second power source VSS, the light source unit LSU may be connected between the first power source VDD and the pixel circuit PXC.

Figure 6D:
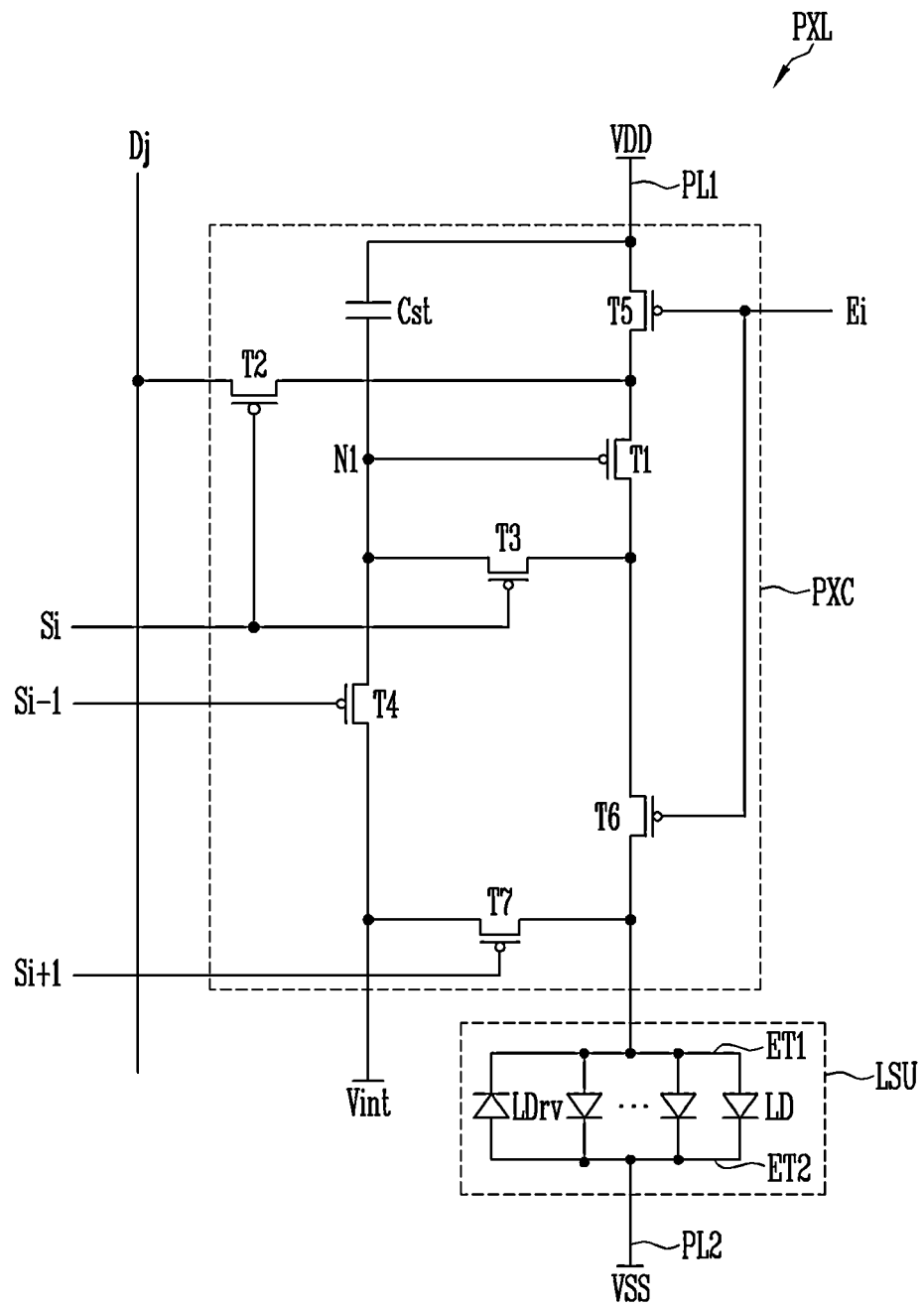

Referring to FIG. 6D, the pixel circuit PXC may be connected not only to a scan line Si of a corresponding horizontal line but also to at least one another scan line (or a control line). For example, the pixel circuit PXC of the pixel PXL disposed on the i-th row of the display area DA may be further connected to an i−1-th scan line Si−1 and/or an i+1-th scan line Si+1. In an embodiment, the pixel circuit PXC may be connected not only to the first and second power sources VDD and VSS but also to a third power source. For instance, the pixel circuit PXC may also be connected to an initialization power source Vint. In an embodiment, the pixel circuit PXC may include first to seventh transistors T1 to T7 and a storage capacitor Cst.

The first transistor T1 may be connected between the first power source VDD and the light source unit LSU. For example, a first electrode (for example, a source electrode) of the first transistor T1 may be connected to the first power source VDD through the fifth transistor T5 and the first power line PL1, and a second electrode (for example, a drain electrode) of the first transistor T1 may be connected via the sixth transistor T6 to the first electrode ET1 (for example, the first pixel electrode of the corresponding pixel PXL) of the light source unit LSU. A gate electrode of the first transistor T1 may be connected to a first node N1. The first transistor T1 may control driving current to be supplied to the light source unit LSU in response to the voltage of the first node N1.

The second transistor T2 may be connected between the data line Dj and the first electrode of the first transistor T1. A gate electrode of the second transistor T2 may be connected to the corresponding scan line Si. In case that a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be connected between the other electrode of the first transistor T1 and the first node N1. A gate electrode of the third transistor T3 may be connected to the corresponding scan line Si. In case that a scan signal having a gate-on voltage is supplied from the scan line Si, the third transistor T3 may be turned on to connect the first transistor T1 in the form of a diode.

The fourth transistor T4 may be connected between the first node N1 and the initialization power source Vint. A gate electrode of the fourth transistor T4 may be connected to a preceding scan line, for example, an i−1-th scan line Si−1. In case that a scan signal of a gate-on voltage is supplied to the i−1-th scan line Si−1, the fourth transistor T4 may be turned on so that the voltage of the initialization power source Vint may be transmitted to the first node N1. In an embodiment, in case that the first transistor T1 is a P-type transistor, the voltage of the initialization power source Vint for initializing the gate voltage of the first transistor T1 may be the lowest voltage of the data signal or less.

The fifth transistor T5 may be connected between the first power source VDD and the first transistor T1. A gate electrode of the fifth transistor T5 may be connected to a corresponding emission control line, for example, an i-th emission control line Ei. The fifth transistor T5 may be turned off in case that an emission control signal having a gate-off voltage (for example, a high level voltage) is supplied to the emission control line Ei, and may be turned on in other cases.

The sixth transistor T6 may be connected between the first transistor T1 and the light source unit LSU. A gate electrode of the sixth transistor T6 may be connected to a corresponding emission control line, for example, the i-th emission control line Ei. The sixth transistor T6 may be turned off in case that an emission control signal having a gate-off voltage is supplied to the emission control line Ei, and may be turned on in other cases.

The seventh transistor T7 may be connected between a second node N2 and the first electrode ET1 of the light source unit LSU (for example, the first pixel electrode of the corresponding pixel PXL) and the initialization power source Vint. A gate electrode of the seventh transistor T7 may be connected to any one of scan lines of a subsequent stage (a subsequent horizontal pixel column), for example, to the i+1-th scan line Si+1. In case that a scan signal having a gate-on voltage is supplied to the i+1-th scan line Si+1, the seventh transistor T7 may be turned on so that the voltage of the initialization power source Vint may be supplied to the first electrode ET1 of the light source unit LSU. During each initialization period in which the voltage of the initialization power source Vint is transmitted to the light source unit LSU, the voltage of the first electrode ET1 of the light source unit LSU may be initialized. The control signal for controlling the operation of the seventh transistor T7 may be changed in various ways. For example, in an embodiment, the gate electrode of the seventh transistor T7 may be connected to a scan line of a corresponding horizontal line, for example, an i-th scan line Si. In case that a scan signal having a gate-on voltage is supplied to the i-th scan line Si, the seventh transistor T7 may be turned on so that the voltage of the initialization power source Vint may be supplied to the first electrode ET1 of the light source unit LSU.

The storage capacitor Cst may be connected between the first power source VDD and the first node N1. The storage capacitor Cst may store a voltage corresponding both to the data signal applied to the first node N1 during each frame period and to the threshold voltage of the first transistor T1.

Although in FIG. 6D the transistors included in the pixel circuit PXC, for example, the first to seventh transistors T1 to T7, have been illustrated as being formed of P-type transistors, the disclosure is not limited thereto. For example, at least one of the first to seventh transistors T1 to T7 may be changed to an N-type transistor.

Figure 6E:
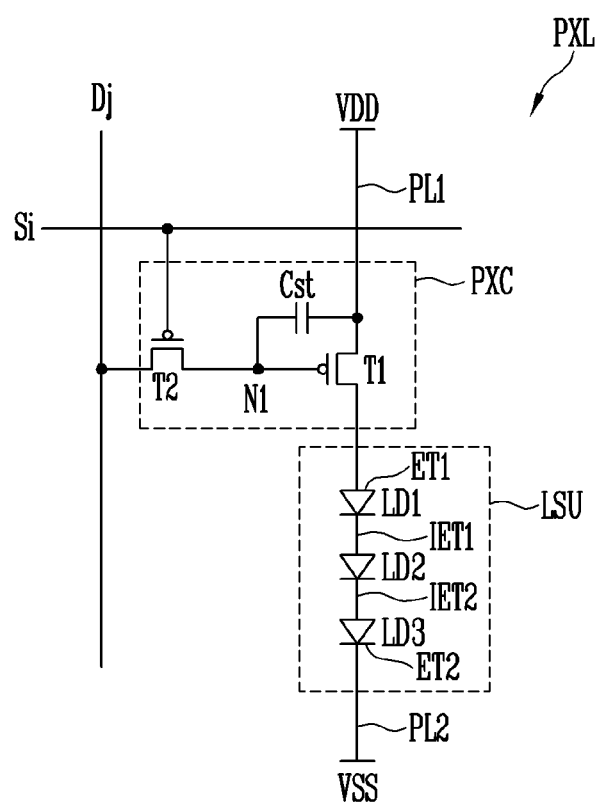
Figure 6F:
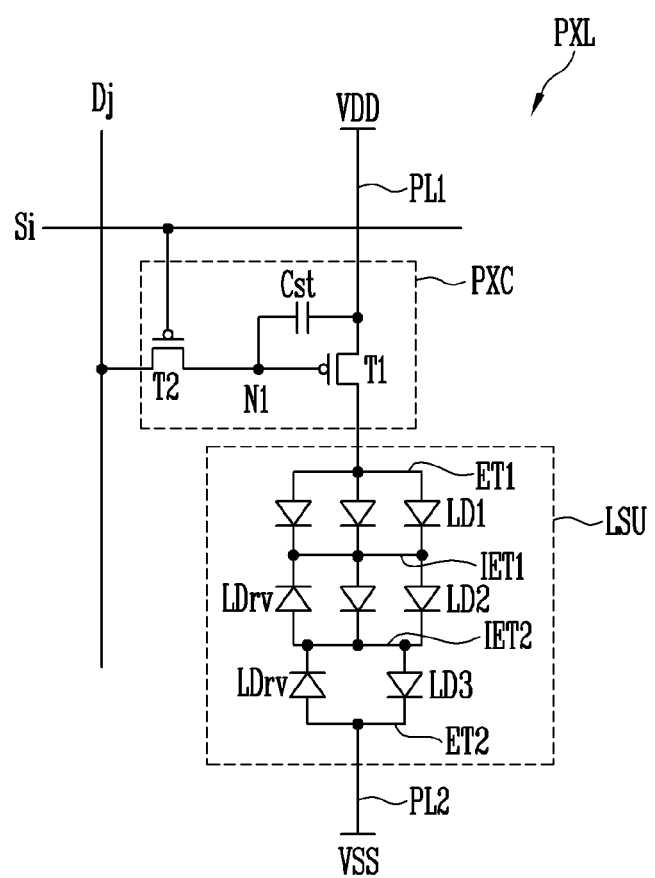
Figure 6G:
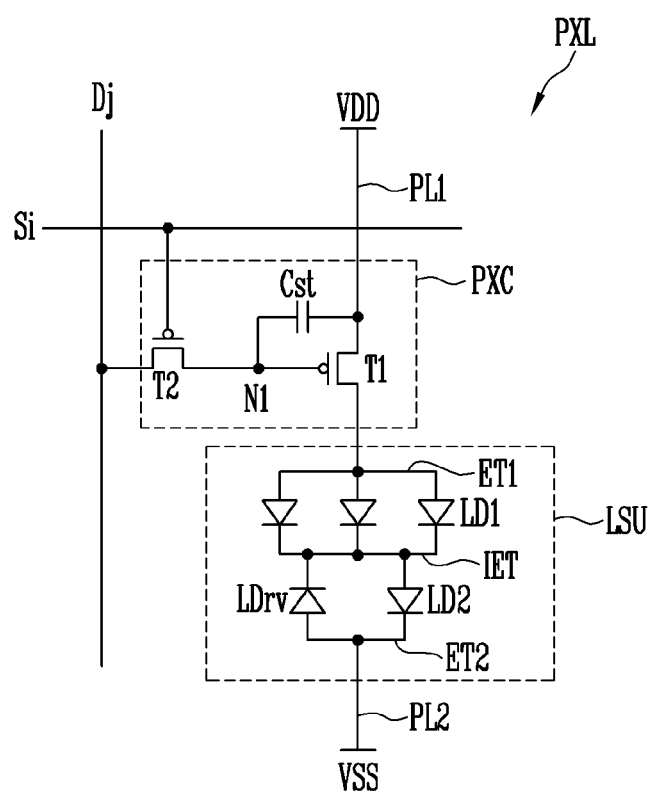

Although FIGS. 6A to 6D illustrate embodiments in which all valid light sources, for example, light emitting elements LD, constituting each light source unit LSU are connected in parallel to each other, the disclosure is not limited thereto. For example, in an embodiment, as illustrated in FIGS. 6E to 6G, the light source unit LSU of each pixel PXL may include a serial connection structure. In the following descriptions of embodiments of FIGS. 6E to 6G, detailed explanations of components (for example, the pixel circuit PXC) similar or equal to that of the embodiments of FIGS. 6A to 6D will be omitted.

Referring to FIG. 6E, the light source unit LSU may include at least two light emitting elements connected in series to each other. For example, the light source unit LSU may include a first light emitting element LD1, a second light emitting element LD2, and a third light emitting element LD3 which are connected in series in a forward direction between the first power source VDD and the second power source VSS and thus form each valid light source. Hereinafter, in case that a specific or given light emitting element among the first, second, and third light emitting elements LD1, LD2, and LD3 is designated, the corresponding light emitting element will be referred to as "first light emitting element LD1", "second light emitting element LD2", or "third light emitting element LD3". The term "light emitting element LD" or "light emitting elements LD" will be used to arbitrarily designate at least one light emitting element of the first, second, and third light emitting elements LD1, LD2, and LD3 or collectively designate the first, second, and third light emitting elements LD1, LD2, and LD3.

The P-type end of the first light emitting element LD1 may be connected to the first power source VDD through the first electrode ET1 of the light source unit LSU, etc., within the spirit and the scope of the disclosure. The N-type end of the first light emitting element LD1 may be connected to the P-type end of the second light emitting element LD2 through a first intermediate electrode IET1. The P-type end of the second light emitting element LD2 may be connected to the N-type end of the first light emitting element LD1. The N-type end of the second light emitting element LD2 may be connected to the P-type end of the third light emitting element LD3 through a second intermediate electrode IET2. The P-type end of the third light emitting element LD3 may be connected to the N-type end of the second light emitting element LD2. An N-type end of the third light emitting element LD3 may be connected to the second power source VSS through the second electrode ET2 of the light source unit LSU and the second power line PL2. In this way, the first, second, and the third light emitting elements LD1, LD2, and LD3 may be successively connected in series between the first and second electrodes ET1 and ET2 of the light source unit LSU.

Although in FIG. 6E there is illustrated an embodiment where the light emitting elements LD are connected to have a three-stage serial structure, the disclosure is not limited thereto. For example, in an embodiment, two light emitting elements LD may be connected to have a two-stage serial structure, or four or more light emitting elements LD may be connected to have a four- or more-stage serial structure.

In case that it is assumed that the same luminance is expressed using light emitting elements LD having the same conditions (for example, the same size and/or number), in a light source unit LSU having a structure in which light emitting elements LD are connected in series, the voltage to be applied between the first and second electrodes ET1 and ET2 may be increased, and the amount of driving current flowing to the light source unit LSU may be reduced, compared to a light source unit LSU having a structure in which light emitting elements LD are connected in parallel. Therefore, in the case where the serial connection structure of the light emitting elements LD is used to form the light source unit LSU of each pixel PXL, panel current flowing through the display panel PNL may be reduced as the display device is driven.

In an embodiment, at least one serial stage may include light emitting elements LD connected in parallel to each other. The light source unit LSU may be formed of a serial or parallel combination structure. For example, the light source unit LSU may be as illustrated in an embodiment of FIG. 6F.

Referring to FIG. 6F, at least one serial stage that forms the light source unit LSU may include light emitting elements LD connected in parallel to each other in a forward direction. For example, the light source unit LSU may include first light emitting elements LD1 disposed in a first serial stage (also referred to as "first stage" or "first row"), at least one second light emitting element LD2 disposed in a second serial stage (also referred to as "second stage" or "second row") subsequent to the first serial stage, and at least one third light emitting element LD3 disposed in a third serial stage (also referred to as "third stage" or "third row") subsequent to the second serial stage.

Although in FIG. 6F there has been illustrated the light source unit LSU formed of light emitting elements LD disposed in three serial stages, the disclosure is not limited thereto. For example, the light source unit LSU may include light emitting elements LD disposed in only two serial stages, as illustrated in FIG. 6G. For example, the light source unit LSU may include at least one first light emitting element LD1 disposed in a first serial stage and having a P-type end and an N-type end which are respectively connected to a first electrode ET1 and an intermediate electrode IET, and at least one second light emitting element LD2 disposed in a second serial stage and having a P-type end and an N-type end which are respectively connected to the intermediate electrode IET and a second electrode ET2.

The number of serial stages that form the light source unit LSU may be changed in various ways. For example, the light source unit LSU may include light emitting elements LD distributed in four or more serial stages. Furthermore, the number of light emitting elements LD connected in the forward direction in each serial stage may be changed in various ways. In an embodiment, the numbers of light emitting elements LD included in the pixels PXL disposed in the display area (DA of FIG. 5) may be identical or similar to each other. For example, at the step of supplying the light emitting elements LD to each pixel PXL, the light emitting elements LD may be aligned in such a way that light emitting element ink (or also referred to as "light emitting element solution") including the light emitting elements LD is controlled to be uniformly applied to an emission area of each pixel PXL, and an electric field is controlled to be applied to each pixel PXL under uniform conditions. In this way, the light emitting elements LD may be relatively uniformly supplied to and aligned in each pixel PXL.

In an embodiment, as illustrated in FIGS. 6F and 6G, each pixel PXL may further include at least one reverse light emitting element LDrv disposed in at least one serial stage. For example, at least one of serial stages may further include at least one reverse light emitting element LDrv connected in a direction opposite to that of the light emitting elements LD.

Even in case that the reverse light emitting element LDrv may be connected to at least one serial stage, the driving current of the pixel PXL may flow successively via the serial stages if at least one valid light source (for example, the first, second, and/or third light emitting elements LD1, LD2, and/or LD3) connected in the forward direction to the serial stage is disposed. Hence, the light source unit LSU may emit light at a luminance corresponding to the driving current.

As described in the foregoing embodiments, each light source unit LSU may include light emitting elements LD which are connected in a forward direction between the first and second power sources VDD and VSS and form respective valid light sources. Furthermore, the connection structure between the light emitting elements LD may be changed in various ways depending on embodiments. For example, the light emitting elements LD may be connected only in series or parallel to each other, or in a series or parallel combination structure.

As described above, the pixel PXL may include a pixel circuit PXC and/or a light source unit LSU which may have various structures. The structure of the pixel PXL which may be applied to the disclosure is not limited to the embodiments illustrated in FIGS. 6A to 6G, and each pixel PXL may have various structures. For example, the pixel circuit PXC included in each pixel PXL may be formed of a pixel circuit which may have various structures and/or be operated by various driving schemes. In an embodiment each pixel PXL may be formed in a passive light emitting display device, or the like within the spirit and the scope of the disclosure. The pixel circuit PXC may be omitted, and each of the first and second electrodes ET1 and ET2 of the light source unit LSU may be connected to or directly connected to the scan line Si, the data line Dj, a power line, and/or a control line.

Figure 7:
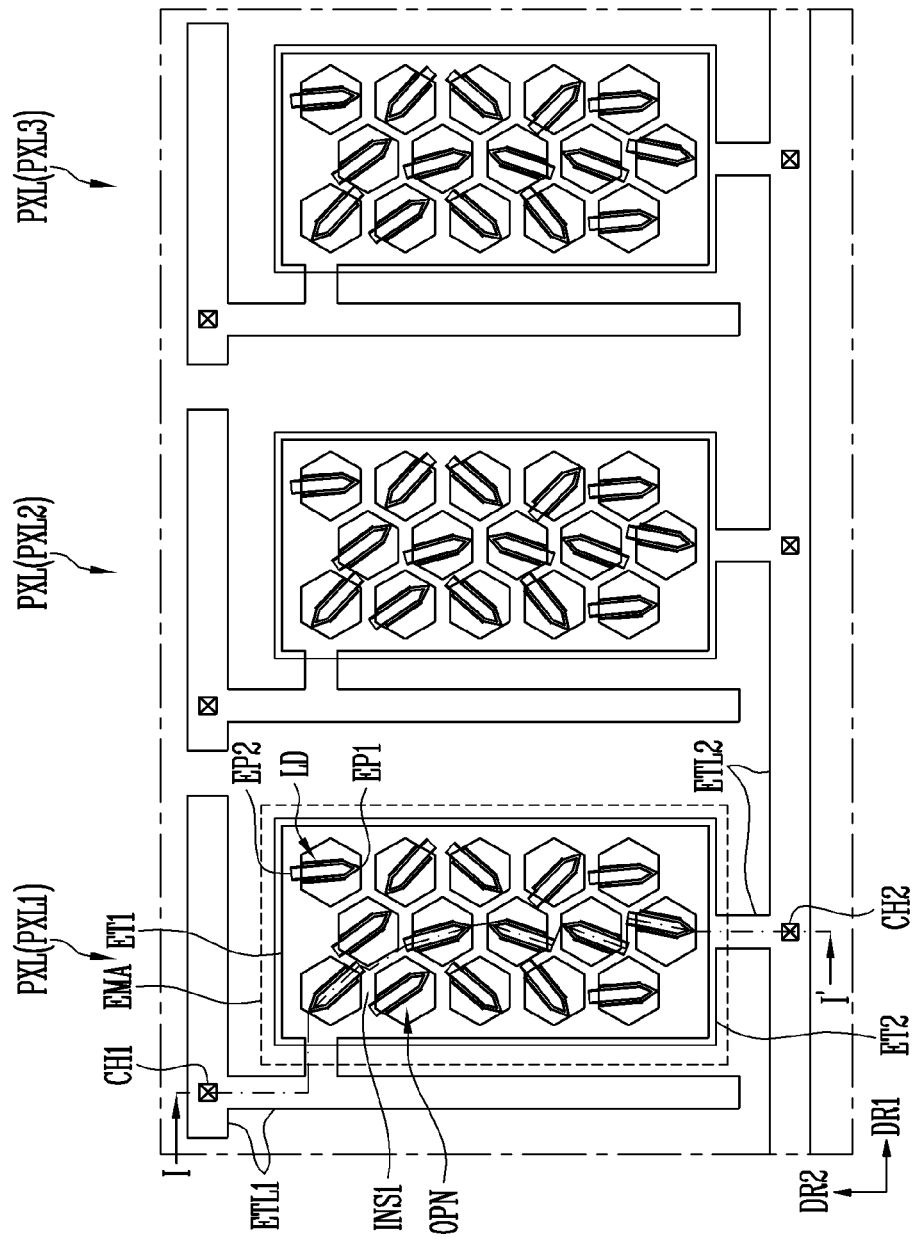
FIG. 7 is a schematic plan view illustrating a pixel in accordance with an embodiment.

FIG. 7 is a schematic plan view illustrating a pixel PXL in accordance with an embodiment. In an embodiment, each pixel PXL illustrated in FIG. 7 may be any one of the pixels PXL illustrated in FIGS. 5 to 6G. For example, each pixel PXL illustrated in FIG. 7 may be a pixel PXL including a light source unit LSU having a parallel structure, as shown in the embodiments of FIGS. 6A to 6D. In an embodiment, FIG. 7 illustrates the structure of each pixel PXL, focused on the light source unit LSU. In an embodiment, each pixel PXL may selectively further include circuit elements (for example, circuit elements that form each pixel circuit PXC) connected to the light source unit LSU.

Furthermore, FIG. 7 illustrates an embodiment in which each light source unit LSU may be connected, through first and second contact holes CH1 and CH2, to a power line (for example, first and/or second power lines PL1 and/or PL2), a circuit element (for example, at least one circuit element that forms the pixel circuit PXC), and/or a signal line (for example, a scan line Si and/or a data line Dj), but the disclosure is not limited thereto. For example, in an embodiment, at least one of the first and second electrodes ET1 and ET2 of each pixel PXL may be connected to or directly connected to a power line and/or signal line without using, for example, a contact hole and/or an intermediate line.

Referring to FIGS. 5 to 7, pixels PXL may be regularly arranged or disposed in the display area DA. For example, a first pixel PXL1 that may emit a first color of light, a second pixel PXL2 that may emit a second color of light, and a third pixel PXL3 that may emit a third color of light may be disposed successively in a first direction DR1 in the display area DA. The first, second, and third pixels PXL1, PXL2, and PXL3 adjacent to each other may be assembled to form one pixel unit capable of emitting various colors of light. Although FIG. 7 illustrates an embodiment in which the first, second, and third pixels PXL1, PXL2, and PXL3 are disposed successively in the first direction DR1 (for example, the row direction), an arrangement structure of the pixels PXL disposed in the display area DA may be changed in various ways.

In an embodiment, the first, second, and third pixels PXL1, PXL2, and PXL3 may be respectively a red pixel, a green pixel, and a blue pixel, but the disclosure is not limited thereto. For example, the first, second, and third pixels PXL1, PXL2, and PXL3 may include light emitting elements LD which emit different colors of light, so that the first, second, and third pixels PXL1, PXL2, and PXL3 may emit different colors of light. The color of light emitted from each of the first, second, and third pixels PXL1, PXL2, and PXL3 may be changed in various ways depending on embodiments.

In an embodiment, the first, second, and third pixels PXL1, PXL2, and PXL3 may be color pixels that may emit an identical color of light. Color conversion layers and/or color filters having different colors may be disposed over the first, second, and third pixels PXL1, PXL2, and PXL3 so that different colors of light can be controlled to be emitted from the first, second, and third pixels PXL1, PXL2, and PXL3 to the outside of the display panel PNL. The number and/or types of pixels PXL that form each pixel unit may be changed in various ways depending on embodiments.

In an embodiment, the first, second, and third pixels PXL1, PXL2, and PXL3 may have a substantially identical or similar structure. For the sake of explanation, description of a structure of each pixel PXL with reference to FIG. 7 will be focused on a structure of the first pixel PXL1.

In this specification, to designate a specific or given pixel of the first, second, third pixels PXL1, PXL2, and PXL3, the corresponding pixel will be referred to as "first pixel PXL1", "second pixel PXL2", or "third pixel PXL3". The term "pixel PXL" or "pixels PXL" will be used to arbitrarily designate at least one pixel of the first, second, and the third pixels PXL1, PXL2, and PXL3 or collectively designate the first, second, and third pixels PXL1, PXL2, and PXL3.

Each pixel PXL may include a first electrode ET1 and a second electrode ET2 each of which is disposed to overlap the corresponding emission area EMA, and light emitting elements LD electrically connected between the first and second electrodes ET1 and ET2. The first and second electrodes ET1 and ET2 and the light emitting elements LD may form the light source unit LSU of each pixel PXL.

The emission area EMA of each pixel PXL may be an area in which valid light sources, for example, light emitting elements LD, for forming the light source unit LSU of the pixel PXL are disposed. The first and second electrodes ET1 and ET2 electrically connected to the light emitting elements LD may be further disposed in the emission area EMA. In an embodiment, each emission area EMA may be an area enclosed by an opaque bank (also referred to as "pixel defining layer"), which is not shown. For example, in the display area DA, a substantially mesh-shaped bank (not shown) including openings may be formed to correspond to the emission area EMA of each pixel PXL. The bank may define each emission area EMA and prevent light from leaking between the pixels PXL.

The first electrode ET1 may be a planar electrode having a shape and/or size corresponding to that of each emission area EMA. Here, the disclosure is not limited thereto. The first electrode ET1 may have a shape regardless of the shape of the emission area EMA.

In an embodiment, the first electrode ET1 may be a substantially rectangular planar electrode having a width in the first direction DR1 (or in the second direction DR2) and a length in the second direction DR2 (or in the first direction DR1). In an embodiment, the first electrode ET1 may be a plate electrode having a substantially polygonal shape except a rectangular shape, a circular or elliptical plate electrode, or a plate electrode including a combination of boundaries of a linear line and a substantially curved line. In an embodiment, the first electrode ET1 may be a mesh type electrode including openings. In other words, the shape and/or structure of the first electrode ET1 may be changed in various ways depending on embodiments.

In an embodiment, the first electrode ET1 may have a separate pattern for each of the pixels PXL. The first electrode ET1 may be electrically connected to a first electrode line ETL1 (also referred to as "first alignment line" or "first connection line"), and may be electrically connected to the pixel circuit PXC and/or the first power source VDD through the first electrode line ETL1 and/or the first contact hole CH1. In an embodiment, the first electrode ET1 and the first electrode line ETL1 may be integrally or non-integrally connected to each other. In the case where the first electrode ET1 and the first electrode line ETL1 are integrally connected to each other, the first electrode ET1 and the first electrode line ETL1 may be regarded as being different areas of a single electrode, line, or pattern.

The second electrode ET2 may be disposed on each emission area EMA and overlap each first electrode ET1. In an embodiment, the second electrode ET2 may be disposed on a layer different from that of the corresponding first electrode ET1 at a position spaced apart from the first electrode ET1. For example, the second electrode ET2 may be disposed on a layer different from that of the first electrode ET1 with the light emitting elements LD disposed in each emission area EMA interposed therebetween. For example, the first electrode ET1 may be disposed under or below the light emitting elements LD, and the second electrode ET2 may be disposed over the light emitting elements LD.

In an embodiment, the second electrode ET2 may be a planar electrode having a shape and/or size corresponding to that of the corresponding first electrode ET1. For example, the first and second electrodes ET1 and ET2 of each pixel PXL may have shapes and/or sizes corresponding to each other in at least the emission area EMA, and overlap each other. Here, the disclosure is not limited thereto. The second electrode ET2 may have a shape regardless of the shape of the emission area EMA.

In an embodiment, the second electrode ET2 may be a plate electrode having a polygonal shape including a substantially rectangular shape, a circular or elliptical plate electrode, or a plate electrode including a combination of boundaries of a substantially linear line and a substantially curved line. In an embodiment, the second electrode ET2 may be a mesh type electrode including openings. In other words, the shape and/or structure of the second electrode ET2 may be changed in various ways depending on embodiments.

In an embodiment, the second electrode ET2 may be electrically connected to the second electrode line ETL2 (also referred to as "second alignment line" or "second connection line"), and may be electrically connected to the second power source VSS through the second electrode line ETL2 and/or the second contact hole CH2. In an embodiment, the second electrode ET2 and the second electrode line ETL2 may be integrally or non-integrally connected to each other. In the case where the second electrode ET2 and the second electrode line ETL2 are integrally connected to each other, the second electrode ET2 and the second electrode line ETL2 may be regarded as being different areas of a single electrode, line, or pattern.

In an embodiment, the second electrodes ET2 of the pixels PXL may be integrally or non-integrally connected to each other. For example, the second electrodes ET2 of the pixels PXL may be electrically connected to each other through the second electrode line ETL2 connected thereto.

The first electrode line ETL1 may be connected between the first power line PL1 and the first electrode ET1. The first electrode line ETL1 may receive a voltage of the first power source VDD (or a first driving signal such as a scan signal, a data signal or a other control signal) supplied from the first power line PL1 during a period in which the display device is driven, and transmit the voltage of the first power source VDD to the first electrode ET1. In an embodiment, the first electrode line ETL1 may be electrically connected to a circuit element (for example, at least one transistor that forms the pixel circuit PXC), a power line (for example, the first power line PL1), and/or a signal line (for example, a scan line Si, a data line Dj, or a control line) via a first contact hole CH1. For example, the first electrode line ETL1 may be electrically connected to a circuit element disposed thereunder through the first contact hole CH1, and be connected to the first power line PL1 through the circuit element. For example, each pixel PXL may further include a pixel circuit PXC connected between the first electrode line ETL1 and the first power source VDD. In an embodiment, the pixel circuit PXC may be disposed under or below each light source unit LSU and be electrically connected to the first electrode line ETL1 of the light source unit LSU through the first contact hole CH1. In an embodiment, the first electrode line ETL1 may be connected, via the first contact hole CH1, etc., to a signal line to which a first driving signal is supplied. In an embodiment, the first electrode line ETL1 may be connected to or directly connected to the first power line PL1 or a signal line without using the first contact hole CH1, and/or the circuit element. The first electrode line ETL1 may be integrally or non-integrally connected to the first power line PL1 or the signal line.

In an embodiment, the first electrode line ETL1 connected to the respective first electrodes ET1 of the pixels PXL may be first fabricated to be connected in common to the first electrodes ET1 of pixels PXL, and may be supplied with a first alignment signal (or a first alignment voltage) at the step of aligning the light emitting elements LD. Thereafter, the first electrode line ETL1 between the pixels PXL may be open, so that the pixels PXL can be fabricated to be individually operable. For example, the first electrode lines ETL1 of the pixels PXL may be separated from each other between the adjacent pixels PXL.

The second electrode line ETL2 may be connected between the second power line PL2 and the second electrode ET2. The second electrode line ETL2 may receive a voltage of the second power source VSS (or a second driving signal such as a scan signal, a data signal or a other control signal) during a period in which the display device is driven, and transmit the voltage of the second power source VSS to the second electrode ET2. In an embodiment, the second electrode line ETL2 may be electrically connected to a circuit element (for example, at least one transistor that forms the pixel circuit PXC), a power line (for example, the second power line PL2), and/or a signal line (for example, a scan line Si, a data line Dj, or a control line) via a second contact hole CH2. For example, the second electrode line ETL2 may be connected, through the second contact hole CH2, to the second power line PL2 disposed thereunder. In an embodiment, the second electrode line ETL2 may be connected to or directly connected to the second power line PL2 or a signal line without using, for example, the second contact hole CH2, and/or the circuit element. The second electrode line ETL2 may be integrally or non-integrally connected to the second power line PL2 or the signal line.

The second electrode line ETL2 may be supplied with a second alignment signal (or a second alignment voltage) at the step of aligning the light emitting elements LD. During a period in which the display device is actually driven, the second electrode line ETL2 may be supplied with the voltage of the second power source VSS or a second driving signal.

For example, the first and second electrode lines ETL1 and ETL2 may be alignment lines which are supplied with alignment signals to be applied to each light source unit LSU at the step of aligning the light emitting elements LD in each pixel PXL to fabricate the display device and are disposed on a path along which alignment current corresponding to the alignment signal flows. Furthermore, the first and second electrode lines ETL1 and ETL2 may be connection lines which are supplied with driving voltages to be applied to each light source unit LSU at the step of driving the display device (for example, in case that in use) and are disposed on a path along which driving current of each pixel PXL flows.

A first insulating layer INS1 and the light emitting elements LD may be disposed between the first and second electrodes ET1 and ET2. For example, the first insulating layer INS1 may include openings OPN (also referred to as "through holes" or "alignment holes") which define respective cells in the emission area EMA of each pixel PXL. Each light emitting element LD may be disposed in any one opening OPN. Although FIG. 7 illustrates an embodiment in which only one light emitting element LD is disposed in each opening OPN, the disclosure is not limited thereto. For example, light emitting elements LD may be disposed in at least one opening OPN, or no light emitting element LD may be disposed therein.

The first insulating layer INS1 may be disposed on the first electrode ET1 of each pixel PXL, and include openings OPN which expose respective different areas of the first electrode ET1 and define respective cells. In an embodiment, the first insulating layer INS1 may be formed on an overall surface of the display area DA, but the disclosure is not limited thereto. For example, in an embodiment, each first insulating layer INS1 may be individually formed in the emission area EMA of each pixel PXL. In other words, in an embodiment, the first insulating layer INS1 may be formed in the form of an individual pattern provided or disposed separately for each of the pixels PXL.

In an embodiment, each opening OPN may be formed to have a width (or a diameter) identical with or greater than a width (or a diameter) of each light emitting element LD and less than a length of each light emitting element LD. Each light emitting element LD may be disposed to stand vertically or diagonally in any one opening OPN such that the light emitting element LD is arranged or disposed in a vertical or diagonal direction with respect to the first and second electrodes ET1 and ET2.

In an embodiment, the openings OPN may have various shapes and/or arrangement structures. For example, in a plan view, the openings OPN each may have a substantially polygonal shape, a substantially circular shape, a substantially elliptical shape, or a combination thereof, and be disposed adjacent to each other in the emission area EMA of each pixel PXL. For instance, in a plan view, the openings OPN each may have a substantially hexagonal shape, and be disposed adjacent to each other in the emission area EMA of each pixel PXL. For example, the first insulating layer INS1 may have, in each emission area EMA, a honeycomb structure including hexagonal cells defined by the openings OPN. At least one light emitting element LD may be disposed in at least some cells of or part of the cells. If the openings OPN are densely disposed adjacent to each other in each emission area EMA, limited space may be more efficiently used. For example, as the openings OPN are densely disposed, space which can receive a larger number of light emitting elements LD compared to the surface area of the emission area EMA may be secured.

Each of the light emitting elements LD may be disposed in a cell defined by any one opening OPN. In an embodiment, each of the light emitting elements LD may include a first end EP1 that is electrically connected to the first electrode ET1, and a second end EP2 that protrudes upward from the first insulating layer INS1. In an embodiment, the second electrode ET2 may be disposed over the light emitting elements LD. The second electrode ET2 may be electrically connected to the second ends EP2 of the light emitting elements LD that protrude upward from the first insulating layer INS1.

In an embodiment, each light emitting element LD may be a light emitting element having a core-shell structure. For example, as illustrated in FIGS. 4A and 4B, each light emitting element LD may be a core-shell light emitting element having a polypyramid (for example, a substantially hexagonal pyramid) shape.

Furthermore, each light emitting element LD may include a first end EP1 disposed to face the first electrode ET1, and a second end EP2 located or disposed at a position opposite to the first end EP1 and disposed to face the second electrode ET2. In an embodiment, the first end EP1 may be a P-type end, and the second end EP2 may be an N-type end, but the disclosure is not limited thereto. For example, in an embodiment, the first end EP1 may be an N-type end, and the second end EP2 may be a P-type end.

In the pixel PXL in accordance with the foregoing embodiment and the display device including the pixel PXL, openings OPN may be formed in the first insulating layer INS1, and the light emitting elements LD may be disposed to stand between the first electrode ET1 and the second electrode ET2 by using the openings OPN. Hence, process limitation which occurs in case that the light emitting elements LD are horizontally aligned may be overcome, and the light emitting elements LD may be reliably connected between the first and second electrodes ET1 and ET2.

Figure 8:
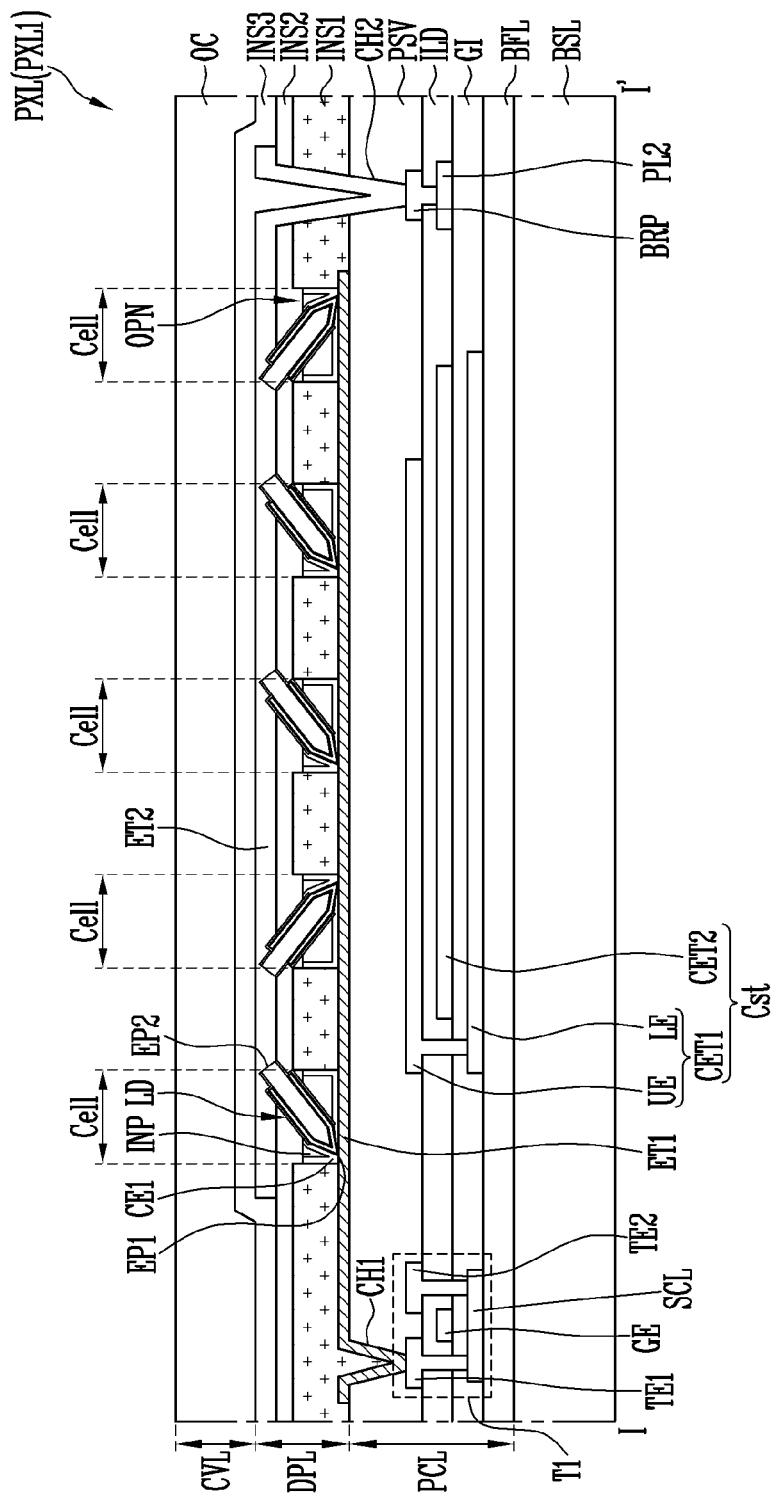
FIG. 8 is a schematic cross-sectional view illustrating a pixel in accordance with an embodiment and for example illustrates an embodiment of a cross-section corresponding to line I-I' of FIG. 7.

FIG. 8 is a schematic cross-sectional view illustrating a pixel PXL in accordance with an embodiment and for example illustrates an embodiment of a cross-section corresponding to line I-I' of FIG. 7. In an embodiment, FIG. 8 representatively illustrate only one transistor (for example, a first transistor T1) and a storage capacitor Cst of the circuit elements disposed in each pixel area of the circuit element layer PCL. In an embodiment, transistors that form each pixel circuit PXC may have a substantially identical or similar structure, but the disclosure is not limited thereto.

Referring to FIGS. 5 to 8, the pixel PXL in accordance with an embodiment and the display device including the pixel PXL may include a display element layer DPL including light emitting elements LD disposed in the emission area EMA of each pixel PXL. The pixel PXL and the display device including the pixel PXL may selectively further include at least one of a circuit element layer PCL (also referred to as "pixel circuit layer") and a cover layer CVL. For example, the pixel PXL and the display device including the pixel PXL may include a circuit element layer PCL, a display element layer DPL, and a cover layer CVL which may be successively disposed on one surface or a surface of the base layer BSL. In an embodiment, the circuit element layer PCL and/or the cover layer CVL may be omitted.

The circuit element layer PCL may include at least one circuit element electrically connected to the light emitting elements LD of the corresponding pixel PXL. For example, the circuit element layer PCL may include at least one circuit element which forms the pixel circuit PXC of each pixel PXL.

For example, the circuit element layer PCL may include transistors and a storage capacitor Cst that are disposed in each pixel area and form the corresponding pixel circuit PXC, and further include at least one power line and/or a signal line that may be connected to the pixel circuit PXC and/or the light source unit LSU. Here, the term "pixel area" may comprehensively refer to an area where components for constituting each pixel PXL are disposed and/or formed. For example, each pixel area may include an emission area EMA where a first electrode ET1 and a second electrode ET2 that form the light source unit LSU of the corresponding pixel PXL, and light emitting elements LD connected between the first and second electrodes ET1 and ET2 are disposed. Each pixel area may selectively further include a pixel circuit area where circuit elements (for example, transistors and at least one capacitor that form each pixel circuit PXC) that are electrically connected to the light emitting elements LD are disposed. For example, in case that each pixel PXL may include the light source unit LSU and the pixel circuit PXC connected thereto, each pixel area may include an emission area EMA and a pixel circuit area.

Here, in the case where the pixel circuit PXC is omitted and each light source unit LSU may be connected to or directly connected to the first and second power lines PL1 and PL2 (or signal lines), the circuit element layer PCL may be omitted. For the sake of explanation, FIG. 8 representatively illustrates a transistor (for example, the first transistor T1) connected to each first electrode ET1 and a power line (for example, the second power line PL2) connected to each second electrode ET2, among the circuit elements and the lines that are disposed in the circuit element layer PCL. Here, the planar or sectional structure of the circuit element layer PCL may be changed in various ways. The position and cross-sectional structure of each of the transistors including the first transistor T1 may be changed in various ways depending on embodiments.

Furthermore, the circuit element layer PCL may include insulating layers disposed between respective electrodes and/or lines. In an embodiment, the circuit element layer PCL may include a buffer layer BFL, a gate insulating layer GI, an interlayer insulating layer ILD, and a passivation layer PSV which may be successively stacked each other on one surface or a surface of the base layer BSL. In an embodiment, the circuit element layer PCL may further include at least one light shielding pattern (not shown) disposed under or below at least some transistors or a part of transistors.

The buffer layer BFL may prevent impurities from diffusing into each circuit element. The buffer layer BFL may be formed of a single layer, or may be formed of multiple layers having at least double layers. In the case where the buffer layer BFL is formed of multiple layers, the respective layers may be formed of the same material or similar material or different materials. In an embodiment, the buffer layer BFL may be omitted.

The first transistor T1 may include a semiconductor layer SCL, a gate electrode GE, and first and second transistor electrodes TE1 and TE2. Although FIG. 8 illustrates an embodiment in which the first transistor T1 may include the first and second electrodes and TE2 that are formed separately from the semiconductor layer SCL, the disclosure is not limited thereto. For example, in an embodiment, the first and/or second transistor electrode and/or TE2 provided or disposed in the first transistor T1 may be integrated with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which comes into contact with each first transistor electrode TE1, a second area which comes into contact with each second transistor electrode TE2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc., within the spirit and the scope of the disclosure. The channel area of the semiconductor layer SCL may be an intrinsic semiconductor, which is an undoped semiconductor pattern. Each of the first and second areas of the semiconductor layer SCL may be a semiconductor pattern doped with an impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap one area of the semiconductor layer SCL.

The first and second transistor electrodes TE1 and TE2 may be disposed on each semiconductor layer SCL with at least one interlayer insulating layer ILD interposed therebetween. For example, the first and second transistor electrodes TE1 and TE2 may be disposed on respective different ends of the semiconductor layer SCL with the gate insulating layer GI and the interlayer insulating layer ILD interposed therebetween. The first and second transistor electrodes TE1 and TE2 may be electrically connected to each semiconductor layer SCL. For example, the first and second transistor electrodes TE1 and TE2 may be connected to the first and second areas of the semiconductor layer SCL through corresponding contact holes which pass through the gate insulating layer GI and the interlayer insulating layer ILD. In an embodiment, any one of the first and second transistor electrodes TE1 and TE2 may be a source electrode, and the other may be a drain electrode.

At least one transistor provided or disposed in the pixel circuit PXC may be electrically connected to the first or second electrode ET1 or ET2 of at least one corresponding pixel PXL. For example, any one (for example, the drain electrode) of the first and second transistor electrodes TE1 and TE2 of the first transistor T1 may be electrically connected to the first electrode ET1 of the corresponding pixel PXL through the first contact hole CH1 passing through the passivation layer PSV and/or the first electrode line ETL1 provided or disposed over the passivation layer PSV.

The storage capacitor Cst may include a first capacitor electrode CET1 and a second capacitor electrode CET2 which overlap each other. In an embodiment, each of the first and second capacitor electrodes CET1 and CET2 may be formed of a single layer or multiple layers. Furthermore, at least one of the first and second capacitor electrodes CET1 and CET2 may be disposed on a layer identical with that of at least one electrode or the semiconductor layer SCL of the first transistor T1.

For example, the first capacitor electrode CET1 may be formed of a multilayer electrode including a lower electrode LE disposed on a layer identical with that of the semiconductor layer SCL of the first transistor T1, and an upper electrode UE disposed on a layer identical with that of the first and second transistor electrodes and TE2 of the first transistor T1 and electrically connected to the lower electrode LE. The second capacitor electrode CET2 may be formed of a single layer electrode which is disposed on a layer identical with that of the gate electrode GE of the first transistor T1 and overlaps the lower electrode LE and the upper electrode UE of the first capacitor electrode CET1.

Here, the disclosure is not limited thereto. The structure and/or position of each of the first and second capacitor electrodes CET1 and CET2 may be changed in various ways. For example, in an embodiment, any one of the first and second capacitor electrodes CET1 and CET2 may include at least one layer or a layer of conductive pattern disposed on a layer different from that of the electrodes (for example, the gate electrode GE, and the first and second transistor electrodes and TE2) and the semiconductor layer SCL that form the first transistor T1.

In an embodiment, at least one signal line and/or power line that may be connected to each pixel PXL may be disposed on a layer identical with that of one electrode of each of the circuit elements that form the pixel circuit PXC. For example, the scan line Si of each pixel PXL may be disposed on a layer identical with that of the gate electrode GE of the first transistor T1. The data line Dj of each pixel PXL may be disposed on a layer identical with that of the first and second transistor electrodes TE1 and TE2 of the first transistor T1. Furthermore, the first and/or second power lines PL1 and/or PL2 may be disposed on a layer identical with that of the gate electrode GE or the first and second transistor electrodes TE1 and TE2 of the first transistor T1. For example, the second power line PL2 for supplying the voltage of the second power source VSS may be disposed on a layer identical with that of the gate electrodes GE of the first transistor T1, and electrically connected to the second electrode ET2 of the light source unit LSU and/or the second electrode line ETL2, both through a bridge pattern BRP disposed on a layer identical with that of the first and second transistor electrodes TE1 and TE2 of the first transistor T1 and through a second contact hole CH2 passing through at least the passivation layer PSV. However, the structures and/or positions of the second power line PL2, etc. may be changed in various ways.

The display element layer DPL may include a light source unit LSU of each of the pixels PXL. For example, the display element layer DPL may include a first electrode ET1 and a second electrode ET2 which are disposed in the emission area EMA of each pixel PXL and overlap each other, and a first insulating layer INS1 and light emitting elements LD which are disposed between the first and second electrodes ET1 and ET2. Furthermore, the display element layer DPL may further include at least one contact electrode to more reliably connect the light emitting elements LD to the first or second electrode ET1 or ET2. For example, the display element layer DPL may further include first contact electrodes CE1 which come into contact with the respective first ends EP1 of the light emitting elements LD and the first electrode ET1. The display element layer DPL may selectively further include at least one insulating layer and/or insulating pattern. For example, the display element layer DPL may further include insulating patterns INP embedded in the respective openings OPN, and at least one of a second insulating layer INS2 interposed between the first insulating layer INS1 and the second electrode ET2, and a third insulating layer INS3 disposed on the second electrode ET2 to cover or overlap the second electrode ET2.

The first electrode ET1 may be disposed on one surface or a surface of the base layer BSL. For example, the first electrode ET1 may be disposed on one surface or a surface of the base layer BSL on which the circuit element layer PCL may be formed or disposed.

The first electrode ET1 may include at least one conductive material. For example, the first electrode ET1 may include at least one material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), zinc oxide (ZnO), antimony zinc oxide (AZO), indium tin zinc oxide (ITZO), tin oxide ($SnO_2$), and a conductive polymer such as PEDOT, but the disclosure is not limited thereto. For example, the first electrode ET1 may include other conductive materials including a carbon nano tube, a graphene, etc., within the spirit and the scope of the disclosure. In other words, the first electrode ET1 may include at least one of various conductive materials to have conductivity, and the constituent material thereof is not particularly limited. In other words, the first electrode ET1 may be a reflective electrode, a transparent electrode, or an opaque electrode, and the material or property thereof is not particularly limited so long as it can provide satisfactory conductivity. For example, synthetically taking into account a contrast ratio, light efficiency, etc., the constituent material, structure, thickness, and/or the like of the first electrode ET1 may be determined. For example, as the first electrode ET1 is formed of a reflective electrode including at least one reflective electrode layer, the light output efficiency of the pixel PXL may be enhanced.

In an embodiment, the first electrode ET1 may be formed of a single layer or multiple layers. For example, the first electrode ET1 may include a reflective electrode layer including reflective conductive material. Furthermore, the first electrode ET1 may selectively further include at least one of at least one transparent electrode layer disposed over and/or under or below the reflective electrode layer, and at least one conductive capping layer covering or overlapping an upper portion of the reflective electrode layer and/or the transparent electrode layer.

In an embodiment, the reflective electrode layer of the first electrode ET1 may be formed of conductive material having a uniform reflectivity. For example, the reflective electrode layer may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, but the disclosure is not limited thereto. In other words, reflective electrode layer may be formed of various reflective conductive materials. In the case where the first electrode ET1 may include the reflective electrode layer, light emitted from the light emitting elements LD may more efficiently travel in a direction (for example, a frontal direction) in which an image is displayed.

Furthermore, the transparent electrode layer of the first electrode ET1 may be formed of various transparent conductive materials. For example, the transparent electrode layer may include ITO, IZO or ITZO, but the disclosure is not limited thereto. In an embodiment, the first electrode ET1 may have a triple-layer structure having a stacked structure of ITO/Ag/ITO. As such, if the first electrode ET1 is formed of multiple layers having at least two layers, voltage drop due to signal delay (RC delay) may be minimized. Thus, a desired voltage can be effectively transmitted to the light emitting elements LD.

If the first electrode ET1 may include a conductive capping layer covering or overlapping the reflective electrode layer and/or the transparent electrode layer, it is possible to prevent the reflective electrode layer of the first electrode ET1 from being damaged due to defects caused during the process of manufacturing the pixel PXL. However, the conductive capping layer may be selectively included in the first electrode ET1, and may be omitted in an embodiment. Furthermore, the conductive capping layer may be regarded as a component of the first electrode ET1 or a separate component disposed on the first electrode ET1.

The first insulating layer INS1 may be disposed on the first electrode ET1. For example, the first insulating layer INS1 may be formed to cover or overlap an area of the first electrode ET1, and include openings OPN which exposes other areas of the first electrode ET1. The openings OPN may expose different areas of the first electrode ET1 and define respective cells for receiving the corresponding light emitting elements LD.

The first insulating layer INS1 may be formed of a single layer or multiple layers, and include at least one inorganic insulating material and/or organic insulating material. For example, the first insulating layer INS1 may include various types of inorganic insulating materials and/or organic insulating materials, and the constituent material of the first insulating layer INS1 is not particularly limited.

In an embodiment, the first insulating layer INS1 may include at least one organic layer. An upper surface of the first insulating layer INS1 may be substantially planar.

Light emitting elements LD may be supplied to and aligned in each pixel area, for example, the emission area EMA of each pixel PXL, in which the first insulating layer INS1 is formed. For example, light emitting elements LD may be supplied to each emission area EMA by an inkjet scheme, a slit coating scheme, or the like within the spirit and the scope of the disclosure. Thereafter, the light emitting elements LD may be aligned in a vertical or diagonal direction in the respective openings OPN by applying alignment signals (or alignment voltages) to the first electrode ET1 and an alignment electrode (not shown) disposed on the first insulating layer INS1. In an embodiment, the alignment electrode may be formed on the first insulating layer INS1 before the alignment of the light emitting elements LD, and removed after the alignment of the light emitting elements LD are completed.

Each of the light emitting elements LD may include a first end EP1 that is electrically connected to the first electrode ET1, and a second end EP2 that is electrically connected to the second electrode ET2. In an embodiment, the first ends EP1 of the light emitting elements LD may come into direct contact with the first electrode ET1 and thus be electrically connected to the first electrode ET1. However, the disclosure is not limited thereto. For example, the first end EP1 of at least one of the light emitting elements LD may be electrically connected to the first electrode ET1 through the first contact electrode CE1 rather than coming into direct contact with the first electrode ET1.

Likewise, the second ends EP2 of the light emitting elements LD may come into direct contact with the second electrode ET2 and thus be electrically connected to the second electrode ET2. However, the disclosure is not limited thereto. For example, the second end EP2 of at least one of the light emitting elements LD may be electrically connected to the second electrode ET2 through at least one electrode (for example, a second contact electrode, which is not shown) rather than coming into direct contact with the second electrode ET2.

The first contact electrodes CE1 may be embedded in the respective openings OPN and be brought into contact with the first electrode ET1 of each pixel PXL and the first ends EP1 of the light emitting elements LD. If the first contact electrodes CE1 are formed, the first ends EP1 of the light emitting elements LD may be more reliably connected to the first electrode ET1.

The first contact electrodes CE1 may include at least one conductive material identical with or different from that of the first electrode ET1, and the constituent material thereof is not particularly limited. Furthermore, each of the first contact electrodes CE1 may be formed of a single layer or multiple layers, and the structure thereof may be variously changed.

In an embodiment, the first contact electrodes CE1 may be formed of a transparent electrode including transparent conductive material. Light emitted from the respective first ends EP1 of the light emitting elements LD may pass through the first contact electrodes CE1.

The insulating patterns INP may be embodied in the respective openings OPN to cover or overlap respective areas of the first ends EP1 of the light emitting elements LD and the first contact electrodes CE1. For example, the insulating patterns INP may be formed in the openings OPN in which the light emitting elements LD and the first contact electrodes CE1 are formed, so that the insulating patterns INP may at least partially enclose the first ends EP1 of the light emitting elements LD. If the insulating patterns INP are formed, the first ends EP1 of the light emitting elements LD may be prevented or mitigated from being damaged during a subsequent process after the alignment of the light emitting elements LD.

In an embodiment, each of the insulating patterns INP may include at least one organic insulating material and be formed of a single layer or multiple layers. For example, each of the insulating patterns INP may include at least one organic layer. During a process of forming the insulating patterns INP, organic insulating material may be smoothly drawn into each of the openings OPN, so that the first ends EP1 of the light emitting elements LD may be prevented from being damaged during a subsequent process.

The second insulating layer INS2 may be disposed between the first insulating layer INS1 and the second electrode ET2 and enclose exposed sidewalls of the light emitting elements LD. If the second insulating layer INS2 is formed, a short-circuit defect may be effectively prevented from occurring between the first electrode ET1 and the second electrode ET2, and the light emitting elements LD may be more reliably supported.

In an embodiment, the second insulating layer INS2 may include at least one organic insulating material and be formed of a single layer or multiple layers. For example, the second insulating layer INS2 may include at least one organic layer. During a process of forming the second insulating layer INS2, organic insulating material may be smoothly drawn into each of the openings OPN. For example, a portion of the second insulating layer INS2 may be drawn into the openings OPN to enclose the light emitting elements LD and completely fill in space formed in the openings OPN. Consequently, electrical stability between the first and second electrodes ET1 and ET2 may be secured, and the light emitting elements LD may be reliably supported.

The second electrode ET2 may be disposed on the light emitting elements LD to cover or overlap upper portions of the light emitting elements LD. For example, the second electrode ET2 may be disposed on the light emitting elements LD to completely cover or overlap the second ends EP2 of the light emitting elements LD that are exposed upward from the first and second insulating layers INS1 and INS2. Furthermore, the second electrode ET2 may be electrically connected to the second power line PL2 through the bridge pattern BRP and/or the second contact hole CH2 that passes through the passivation layer PSV, the first insulating layer INS1, and the second insulating layer INS2. Therefore, the voltage of the second power source VSS may be applied to the second ends EP2 of the light emitting elements LD.

The second electrode ET2 may include at least one conductive material. For example, the second electrode ET2 may include at least one conductive material identical with or different from that of the first electrode ET1, and be formed of a single layer or multiple layers.

In an embodiment, the second electrode ET2 may be formed of a transparent electrode including at least one transparent conductive material so as to allow light to pass therethrough. For example, in the case where the display panel PNL is a frontal emission display panel PNL which emits light in an upward direction of the second electrode ET2, the second electrode ET2 may be substantially transparent. Here, the words "substantially transparence" may mean that light is allowed to be transmitted to satisfy a degree or more of transmissivity.

In an embodiment, the second electrode ET2 may include at least one opaque conductive material, and be formed to be substantially transparent by having a mesh structure with holes allowing light to pass therethrough or having a very small thickness. In other words, to allow light emitted from the light emitting elements LD to pass through the second electrode ET2, the constituent material, structure, and/or thickness of the second electrode ET2 may be accordingly adjusted.

The third insulating layer INS3 may be disposed on the second electrode ET2. For example, the third insulating layer INS3 may be formed on the overall surface of the display area DA to cover or overlap the second electrodes ET2 of the pixels PXL.

The third insulating layer INS3 may be formed of a single layer or multiple layers, and include at least one inorganic insulating material and/or organic insulating material. For example, the third insulating layer INS3 may include various kinds of organic or inorganic insulating materials including silicon nitride (SiNx), silicon oxide (SiOx), aluminum oxide ($Al_2O_3$), etc., within the spirit and the scope of the disclosure. The constituent material of the third insulating layer INS3 is not particularly limited.

In an embodiment, the third insulating layer INS3 may include a thin-film encapsulation layer having a multi-layered structure. For example, the third insulating layer INS3 may be formed of a thin-film encapsulation layer having a multilayer structure including at least two inorganic insulating layers, and at least one organic insulating layer interposed between the at least two inorganic insulating layers. Here, the constituent material and/or structure of the third insulating layer INS3 may be changed in various ways.

A cover layer CVL may be selectively disposed on the third insulating layer INS3. In an embodiment, the cover layer CVL may include an overcoat layer OC, a window, or the like, and further include various other functional films, etc., within the spirit and the scope of the disclosure.

In the pixel PXL in accordance with the embodiment of FIGS. 7 and 8 and the display device including the pixel PXL, the openings OPN are formed in the first insulating layer INS1, whereby cells for receiving the light emitting elements LD are defined. Hence, the light emitting elements LD may be aligned to stand vertically or diagonally between the first electrode ET1 and the second electrode ET2. A process limitation which may occur in case that the light emitting elements LD are horizontally aligned may be overcome, and the light emitting elements LD may be more reliably connected between the first and second electrodes ET1 and ET2.

For example, in the case where the light emitting elements LD are horizontally arranged or disposed and the first and second ends EP1 and EP2 of the light emitting elements LD are thereafter connected to the first and second electrodes ET1 and ET2 through the respective contact electrodes, a separation distance for preventing reliably a short-circuit from occurring between the first and second electrodes ET1 and ET2 is required taking into account process distribution in case that the contact electrodes are formed. Hence, a reduction in length of the light emitting elements LD is limited. Furthermore, if the length of the light emitting elements LD is increased, it may be difficult to uniformly disperse the light emitting elements LD in the light emitting element ink, so that it may be difficult to uniformly distribute the light emitting elements LD in each emission area EMA. However, as shown in embodiments, if the first and second electrodes ET1 and ET2 are disposed on different layers and the light emitting elements LD are connected, to stand vertically or diagonally, between the first and second electrodes ET1 and ET2, the process limitation that occurs in case that the light emitting elements LD are horizontally arranged or disposed may be overcome, and the light emitting elements LD may be reliably connected between the first and second electrodes ET1 and ET2.

Furthermore, in the pixel PXL in accordance with the foregoing embodiments and the display device including the pixel PXL, the light efficiency (for example, the light output rate) of each pixel PXL may be enhanced. In detail, the light emitting elements LD may emit light from opposite ends thereof with respect to the longitudinal direction, for example, from the first and second ends EP1 and EP2. Therefore, if the light emitting elements LD are horizontally disposed, the light emitting elements LD emit light sideways with respect to each pixel PXL, so that the efficiency of light that is emitted in the frontal direction may be reduced. Furthermore, in the structure in which the light emitting elements LD may be horizontally disposed, a separate structure such as a reflective partition wall (or wall) or bank (or bank pattern) or the like may be formed around the light emitting elements LD to guide, in the frontal direction, light emitted sideways, additional space and process may be required. However, as shown in embodiments, if the light emitting elements LD are connected to stand vertically or diagonally, the amount of light that is emitted in the frontal direction of each pixel PXL (for example, an image display surface of the display panel PNL) may be increased even if an additional structure for enhancing the output rate is not formed. Consequently, the light efficiency of each pixel PXL may be enhanced.

FIGS. 9A to 9M are schematic cross-sectional views illustrating a method of fabricating a display device in accordance with an embodiment and for example illustrate an embodiment of a method of fabricating a display device including the pixel PXL of FIGS. 7 and 8. FIG. 10 is a schematic plan view illustrating the pixel PXL in accordance with an embodiment and, a schematic plan view illustrating the emission area EMA of the pixel PXL after the openings OPN are formed in the first insulating layer INS1, as illustrated in FIG. 9D.

Referring to FIGS. 7 to 9A, the circuit element layer PCL may be formed on one surface or a surface of the base layer BSL, and the first electrode ET1 is formed on the base layer BSL on which the circuit element layer PCL may be formed. Here, in an embodiment, in the case where the circuit element layer PCL is omitted, the first electrode ET1 may be formed or disposed on or directly formed or disposed on one surface or a surface of the base layer BSL (or the base layer BSL on which the buffer layer BFL may be formed).

In an embodiment, the first electrode ET1 may be formed through a process of forming a conductive layer including at least one conductive material and/or a patterning process, and may be formed through various types of processes. In an embodiment, the first electrode ET1 may be formed of a single layer or multiple layers. For example, the first electrode ET1 may be formed of a conductive pattern having a single-layer structure, or a conductive pattern having a multilayer structure including a first reflective electrode and a first conductive capping layer.

Figure 9A:
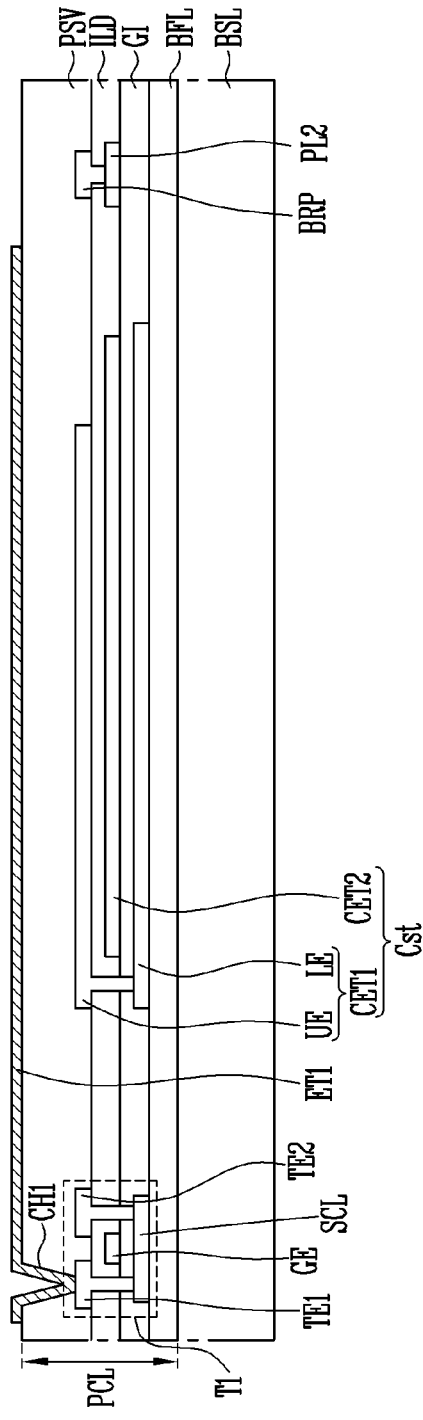
FIGS. 9A to 9M are schematic cross-sectional views illustrating a method of fabricating a display device in accordance with an embodiment and for example illustrate an embodiment of a method of fabricating a display device including the pixel of FIGS. 7 and 8.
Figure 9B:
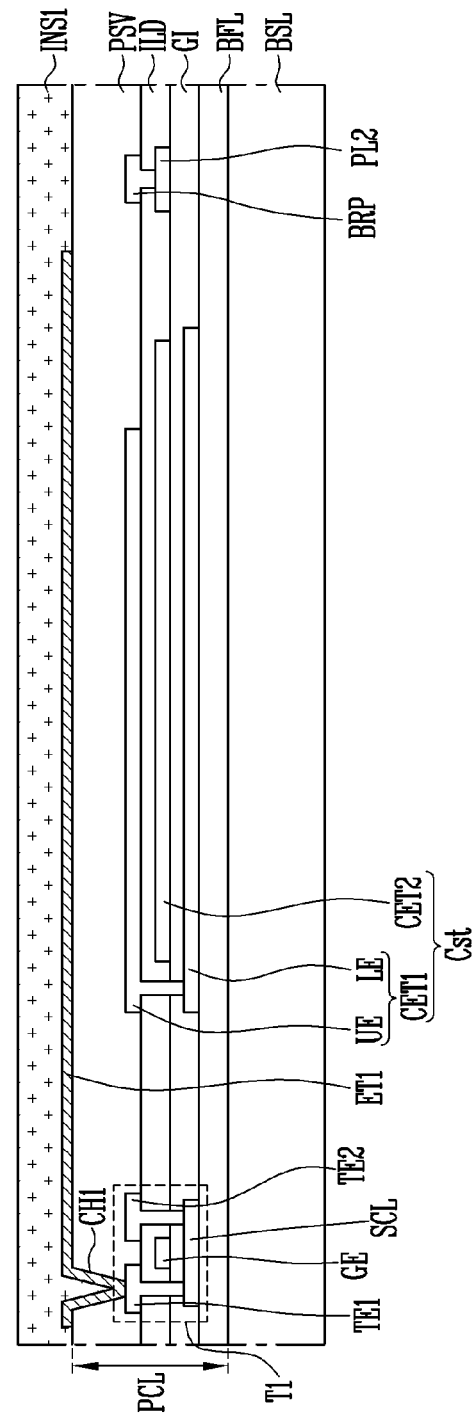
Figure 10:
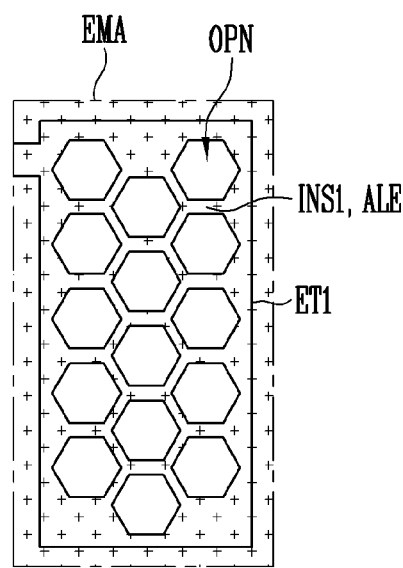
FIG. 10 is a schematic plan view illustrating a pixel in accordance with an embodiment and, in detail, a schematic plan view illustrating an emission area of a pixel after openings are formed in a first insulating layer, as shown in FIG. 9D.

Referring to FIG. 9B, the first insulating layer INS1 is formed on the first electrode ET1. The first insulating layer INS1 may be formed on the overall surface of the display area DA including the first electrodes ET1 of the pixels PXL, or may be formed in the form of an individual pattern in the emission area EMA of each of the pixels PXL.

In an embodiment, the first insulating layer INS1 may be formed, for example, by coating at least one organic insulating layer including at least one organic insulating material. The first insulating layer INS1 may be formed such that a surface thereof is substantially planar. Here, the material and/or method of forming the first insulating layer INS1 is not limited thereto. In other words, the first insulating layer INS1 may be formed through a deposition process of an insulating layer including at least one inorganic insulating material and/or organic insulating material, and may be formed through various types of processes.

Figure 9C:
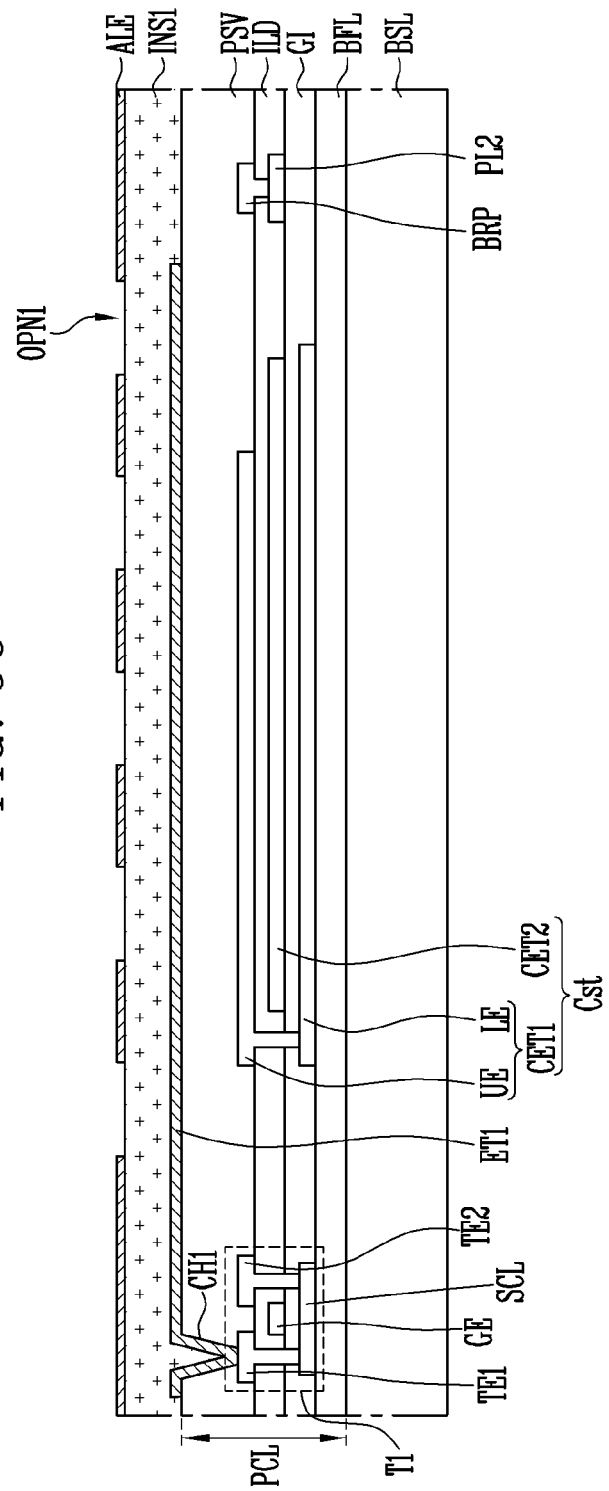
Figure 9D:
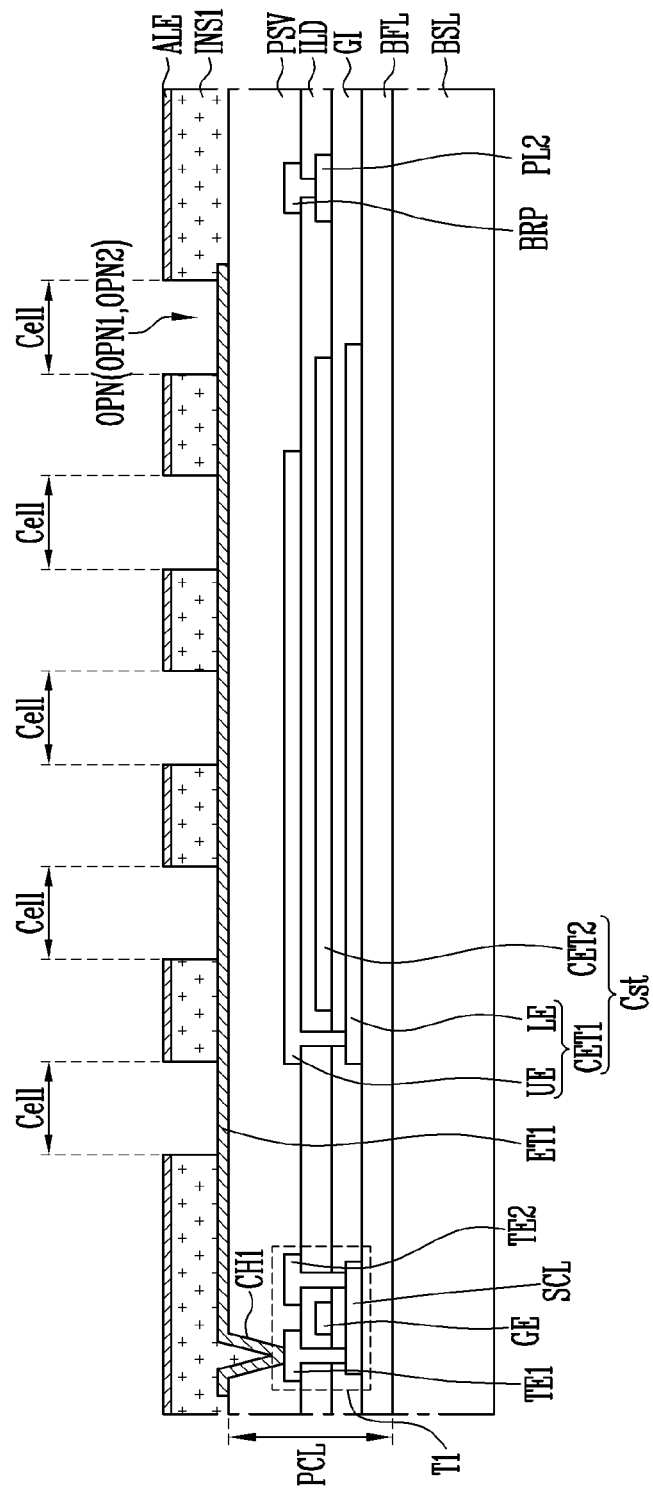

Referring to FIG. 9C, an alignment electrode ALE including first openings OPN1 is formed on the first insulating layer INS1. In an embodiment, the alignment electrode ALE may be formed through a process of forming a conductive layer including at least one conductive material and/or a patterning process, and may be formed through various types of processes.

In an embodiment, the alignment electrode ALE may be formed by forming a conductive layer on the overall surface of the display area DA such that the conductive layer overlaps the first electrodes ET1 of the pixel PXL, and patterning the conductive layer such that first openings OPN1 are included in an area overlapping the first electrodes ET1. In other words, the alignment electrode ALE may overlap the first electrode ET1 of each pixel PXL and be formed to include first openings OPN1 in an area overlapping each first electrode ET1. In an embodiment, each first opening OPN1 may be formed to have a width (or a diameter) identical with or greater than a width (or a diameter) of each of the light emitting elements LD and less than a length of each of the light emitting elements LD.

Referring to FIGS. 9D and 10, second openings OPN2 that overlap the first openings OPN1 may be formed in the first insulating layer INS1 by etching the first insulating layer INS1 using the alignment electrode ALE as a mask. A pair of first opening OPN1 and second opening OPN2 that correspond to each other may form an integrated opening OPN.

Hereinafter, to designate openings of the first and second openings OPN1 and OPN2, the corresponding openings will be referred to as "first openings OPN1" or "second openings OPN2". The term "opening OPN" or "openings OPN" will be used to arbitrarily designate at least one opening of the first and second openings OPN1 and OPN2, or collectively designate the first and second openings OPN1 and OPN2.

In an embodiment, the second openings OPN2 may be formed in the first insulating layer INS1 through a vertical dry etching process using the alignment electrode ALE as a mask. However, the scheme of etching the first insulating layer INS1 is not limited thereto. The second openings OPN2 may be formed in the first insulating layer INS1 through various other etching schemes.

Cells for receiving the light emitting elements LD may be defined by forming, in the first insulating layer INS1 and the alignment electrode ALE, openings OPN that overlap the respective first electrodes ET1. The openings OPN may expose different areas of the first electrode ET1 and be disposed adjacent to each other on the first electrode ET1.

Figure 9E:
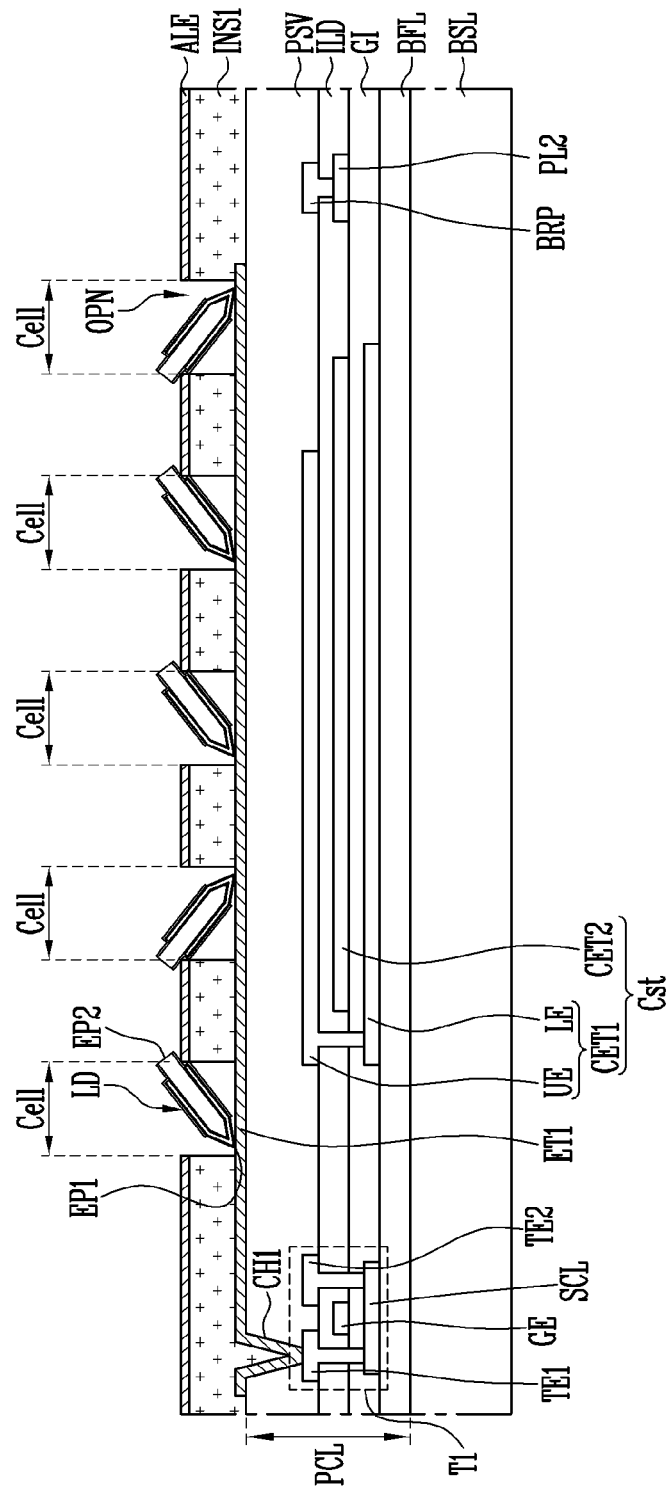

Referring to FIG. 9E, light emitting elements LD are supplied on the base layer BSL on which cells are defined on each first electrode ET1. Thereafter, alignment signals may be applied to the first electrode ET1 and the alignment electrode ALE. For example, an AC type alignment signal may be applied to any one electrode of the first electrode ET1 and the alignment electrode ALE, and a reference voltage having a reference potential (for example, a ground potential) may be supplied to the other electrode. Consequently, an electric field may be formed between the first electrode ET1 and the alignment electrode ALE, and the light emitting elements LD may be aligned in at least some openings or a part of openings OPN.

In an embodiment, the light emitting elements LD may be supplied into each emission area EMA by applying the light emitting element ink with light emitting elements LD dispersed therein onto the base layer BSL through an inkjet printing scheme, a slit coating scheme, or the like within the spirit and the scope of the disclosure. However, the scheme of supplying the light emitting elements LD is not limited thereto, and the light emitting elements LD may be supplied onto an area of the base layer BSL in various other ways.

In an embodiment, each of the light emitting elements LD may be aligned to stand vertically or diagonally in any one opening OPN. In an embodiment, the first ends EP1 of the light emitting elements LD may be brought into direct contact with portions of the first electrode ET1 that are exposed through the respective openings OPN, and be electrically connected to the first electrode ET1. However, the disclosure is not limited thereto. In an embodiment, the first end EP1 of at least one light emitting element LD may not completely come into contact with the first electrode ET1.

Figure 9F:
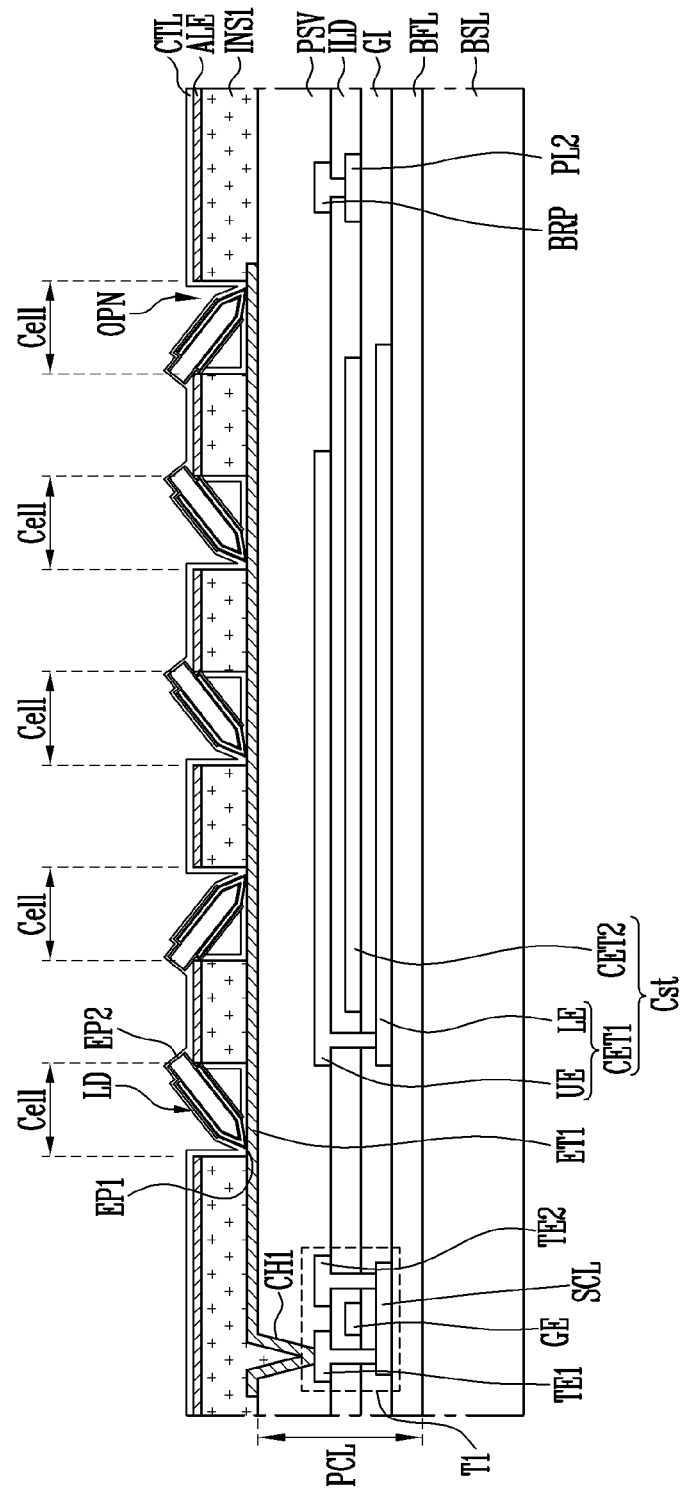

Referring to FIG. 9F, after the light emitting elements LD are aligned in the openings OPN, a conductive layer CTL for covering or overlapping the alignment electrode ALE and the light emitting elements LD may be formed. In an embodiment, the conductive layer CTL may be formed by applying, through a sputtering scheme or the like, transparent conductive material to one surface or a surface of the base layer BSL on which the alignment electrode ALE and the light emitting elements LD are disposed. However, the material and/or scheme of forming the conductive layer CTL is not limited thereto.

Figure 9G:
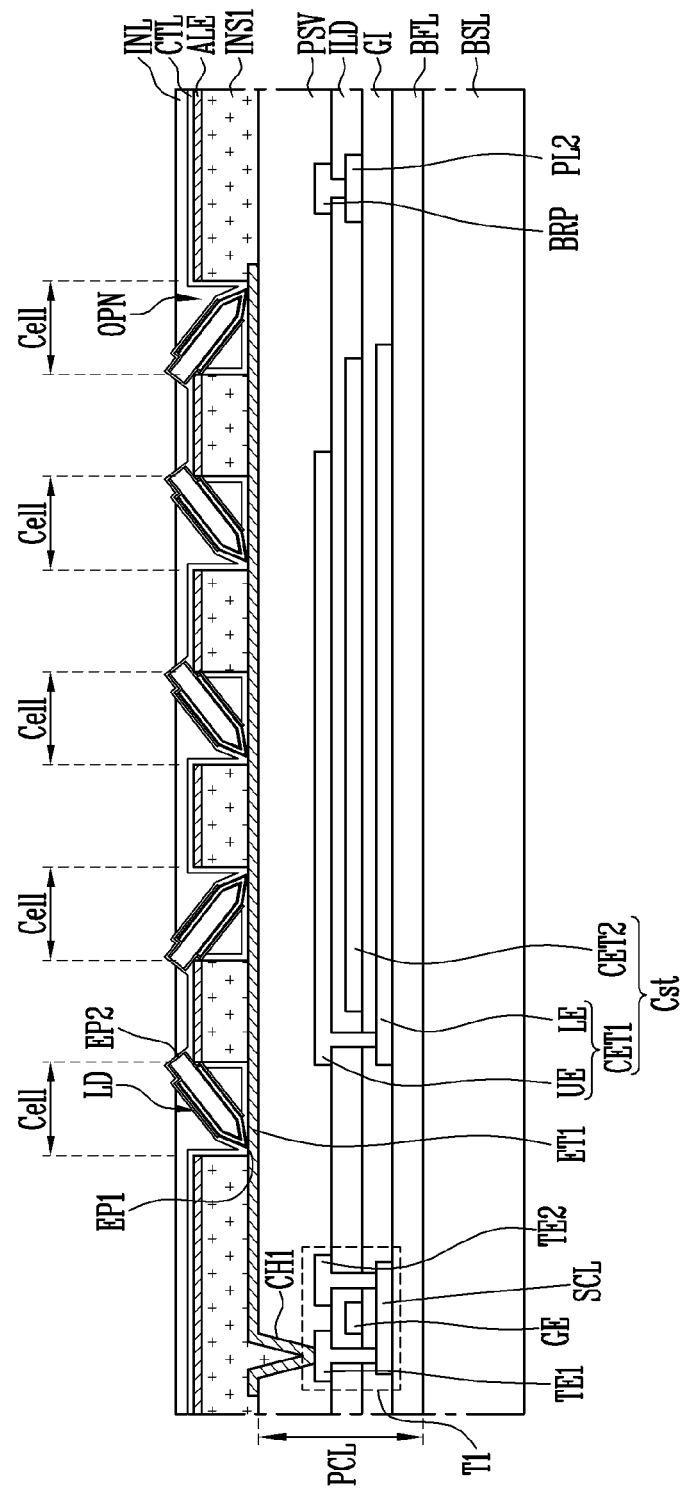

Referring to FIG. 9G, an insulating layer including organic insulating material, for example, an organic insulating layer INL, is formed on the conductive layer CTL. The organic insulating layer INL may be drawn into the openings OPN and charged into the internal space of the openings OPN.

Figure 9H:
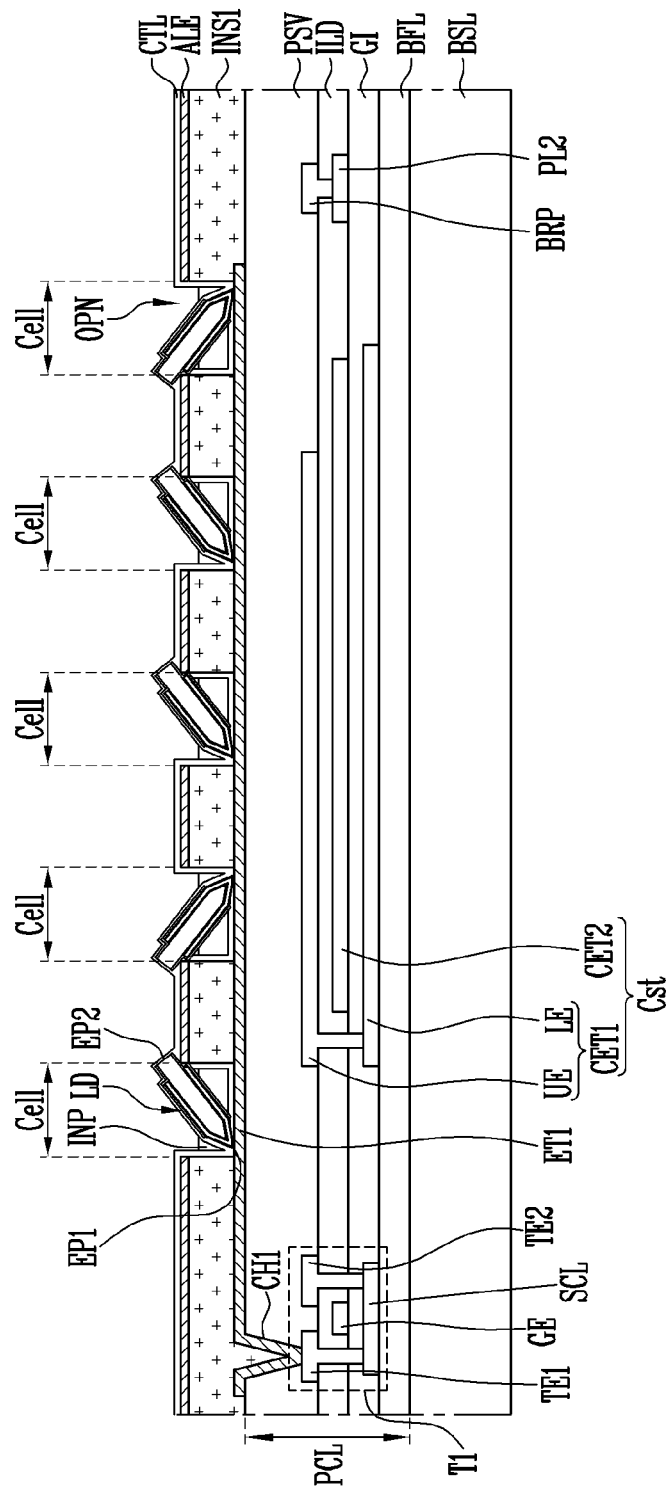

Referring to FIG. 9H, the organic insulating layer INL may be etched such that the organic insulating layer INL remains with a height or less in only the openings OPN. For example, the insulating patterns INP embedded in the respective openings OPN may be formed by etching the organic insulating layer INL by a thickness through a half ashing process. Here, the organic insulating layer INL has penetrated into the openings OPN, so that, in case that the organic insulating layer INL is etched in the thickness direction, areas of the organic insulating layer INL that has deeply penetrated into the openings OPN may remain, and only the other areas of the organic insulating layer INL may be selectively removed. In other words, the areas of the organic insulating layer INL that have deeply penetrated into the openings OPN may enclose areas of the light emitting elements LD (for example, the first ends EP1 and/or peripheral areas of the first ends EP1) rather than being removed.

Figure 9I:
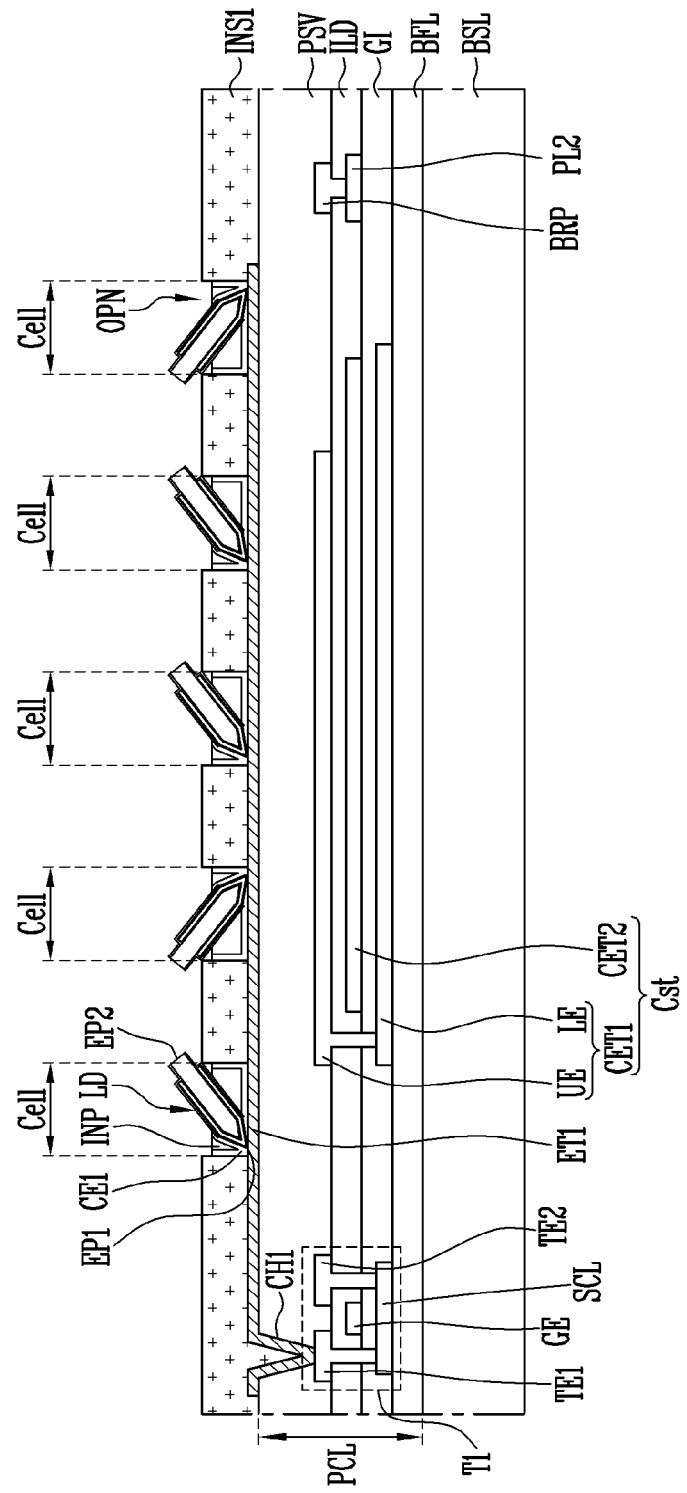

Referring to FIG. 9I, the first contact electrodes CE1 may be formed in the respective openings OPN by etching the conductive layer CTL such that the conductive layer CTL remains only in the openings OPN with a height or less. At the step of etching the conductive layer CTL, the alignment electrode ALE may be removed along therewith. In an embodiment, the conductive layer CTL and the alignment electrode ALE may be etched and/or removed simultaneously or successively. In an embodiment, although the conductive layer CTL and the alignment electrode ALE may be etched and/or removed through a wet etching process, the disclosure is not limited thereto. In an embodiment, the first contact electrodes CE1 may be embedded in the openings OPN such that the first contact electrodes CE1 comes into contact with the first ends EP1 of the light emitting elements LD and the first electrode ET1.

The first contact electrodes CE1 that electrically connect the first ends EP1 of the light emitting elements LD to the first electrode ET1 may be formed through the above-mentioned process of FIGS. 9F to 9I. Hence, the first ends EP1 of the light emitting elements LD may be reliably connected to the first electrode ET1. During a process of etching the conductive layer CTL and the alignment electrode ALE, the first ends EP1 of the light emitting elements LD and/or the peripheral areas thereof may be enclosed and protected by the insulating patterns INP. Hence, the light emitting elements LD may be prevented from being damaged during a subsequent process, and the connection between the light emitting elements LD and the first electrode ET1 may be reliably maintained.

Figure 9J:
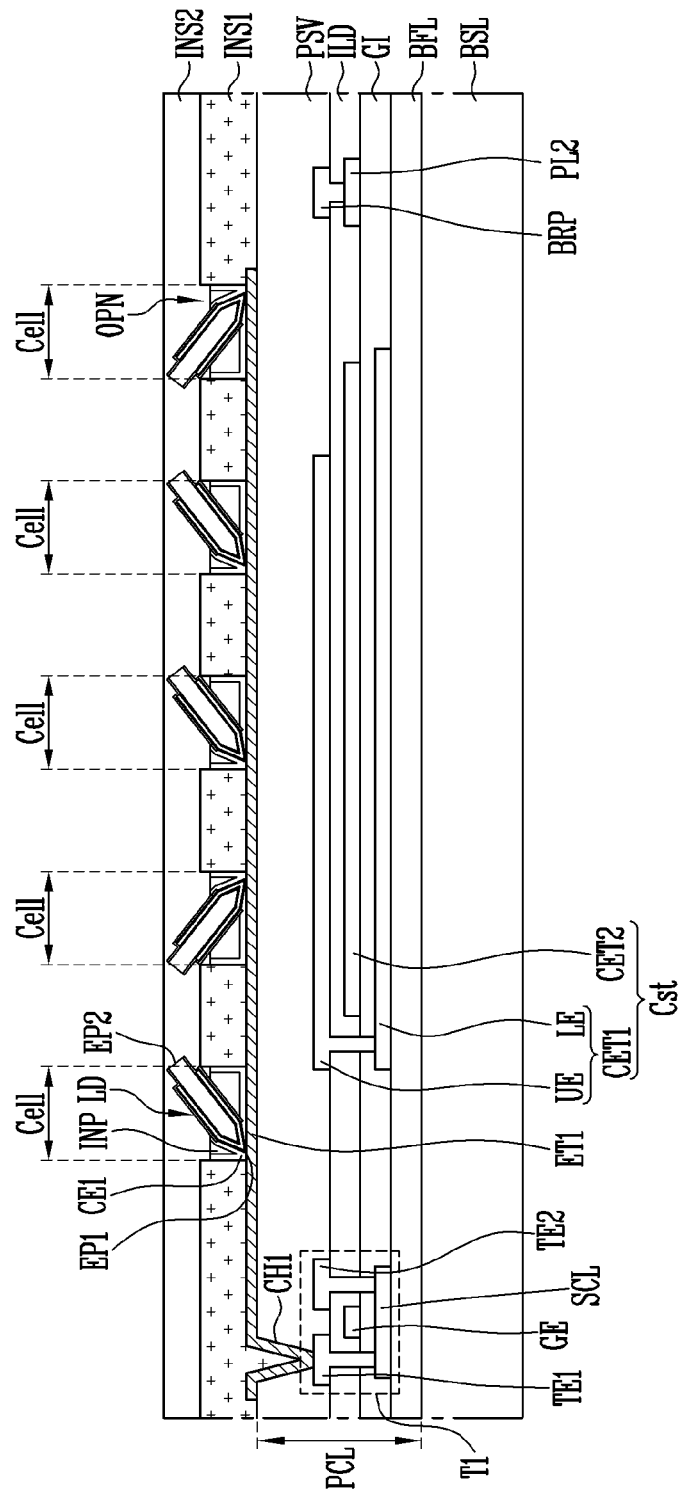
Figure 9K:
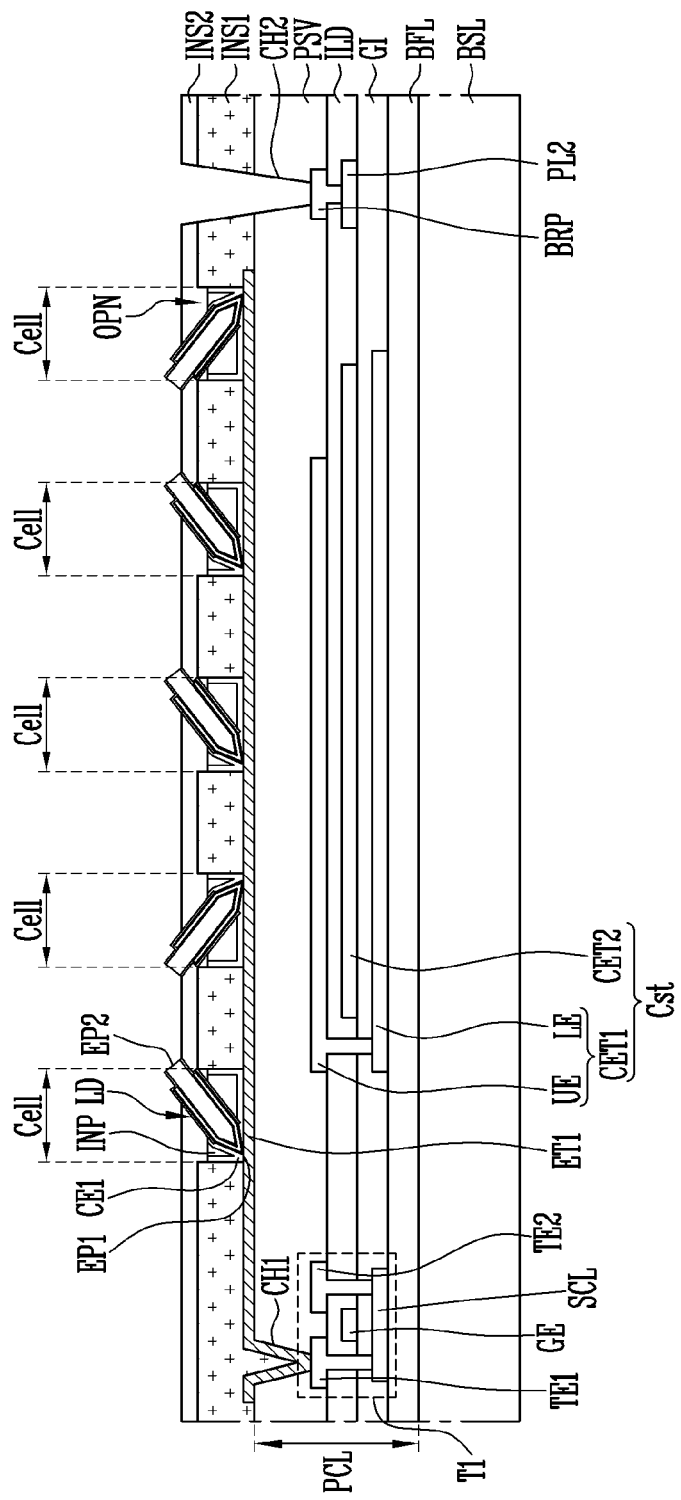

Referring to FIGS. 9J and 9K, after the alignment electrode ALE is removed, the second insulating layer INS2 may be formed on the first insulating layer INS1 and the light emitting elements LD. In an embodiment, as illustrated in FIG. 9J, the second insulating layer INS2 may be formed to have a thickness sufficient to completely cover or overlap the first insulating layer INS1 and the light emitting elements LD. Thereafter, the second insulating layer INS2 may be partially etched in a thickness direction to expose the second ends EP2 of the light emitting elements LD, as illustrated in FIG. 9K. For example, the second ends EP2 of the light emitting elements LD may be exposed by etching the second insulating layer INS2 by a distance through a half ashing process.

After the second insulating layer INS2 is formed, a second contact hole CH2 passing through at least the second insulating layer INS2 is formed. For example, the second contact hole CH2 may be formed to pass through the passivation layer PSV, the first insulating layer INS1, and the second insulating layer INS2 and expose the bridge pattern BRP. In embodiments of FIGS. 9A to 9M, there is illustrated that after the second insulating layer INS2 is formed, the second contact hole CH2 passing through the passivation layer PSV, the first insulating layer INS1, and the second insulating layer INS2 is formed at a time, the disclosure is not limited thereto. For example, to form the second contact hole CH2, the passivation layer PSV, the first insulating layer INS1, and the second insulating layer INS2 may be simultaneously or successively open.

In an embodiment, the second insulating layer INS2 may be at least one organic insulating layer coated with organic insulating material. In the case where the second insulating layer INS2 is formed of an organic insulating layer, the second insulating layer INS2 may be smoothly drawn into the openings OPN during a process of forming the second insulating layer INS2. Consequently, the second insulating layer INS2 may be charged into the space formed in the openings OPN (for example, space formed in upper areas of the openings OPN) and stably enclose the sidewalls of the light emitting elements LD. Furthermore, since the second insulating layer INS2 is formed, the first electrode ET1, the first contact electrodes CE1, etc. may be effectively prevented from short-circuiting with the second electrode ET2 to be formed during a subsequent process.

Figure 9L:
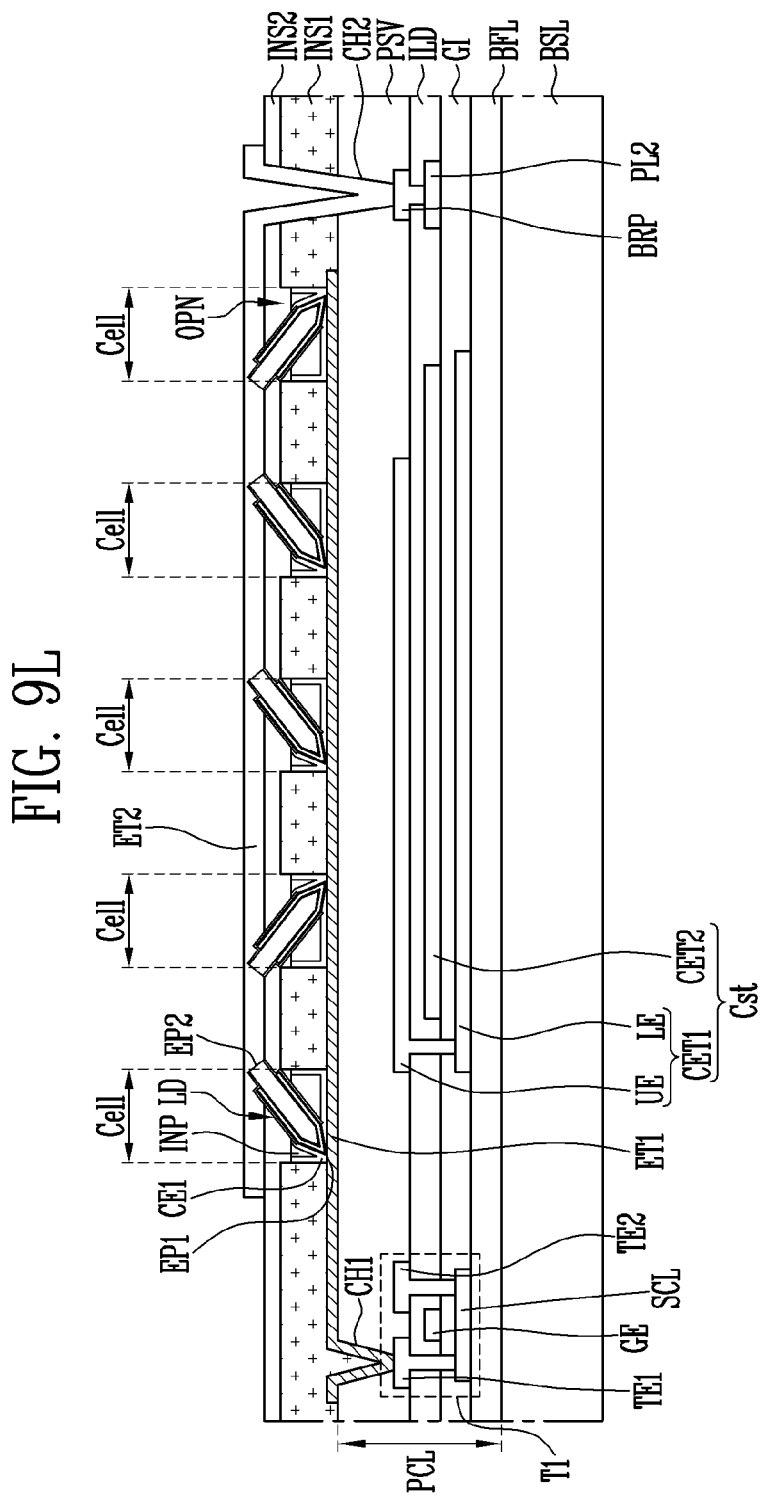

Referring to FIG. 9L, the second electrode ET2 is formed on the light emitting elements LD so that the second electrode ET2 is electrically connected with the second ends EP2 of the light emitting elements LD. For example, the second electrode ET2 may be formed on the second ends EP2 of the light emitting elements LD such that the second electrode ET2 comes into direct contact with the second ends EP2 of the light emitting elements LD that are exposed upward from the second insulating layer INS2. However, the disclosure is not limited thereto. For example, in an embodiment, a second contact electrode (not illustrated) may be formed on the second ends EP2 of the light emitting elements LD, and the second electrode ET2 may be thereafter formed on the second contact electrode such that the second electrode ET2 may be connected with the second contact electrode.

Figure 9M:
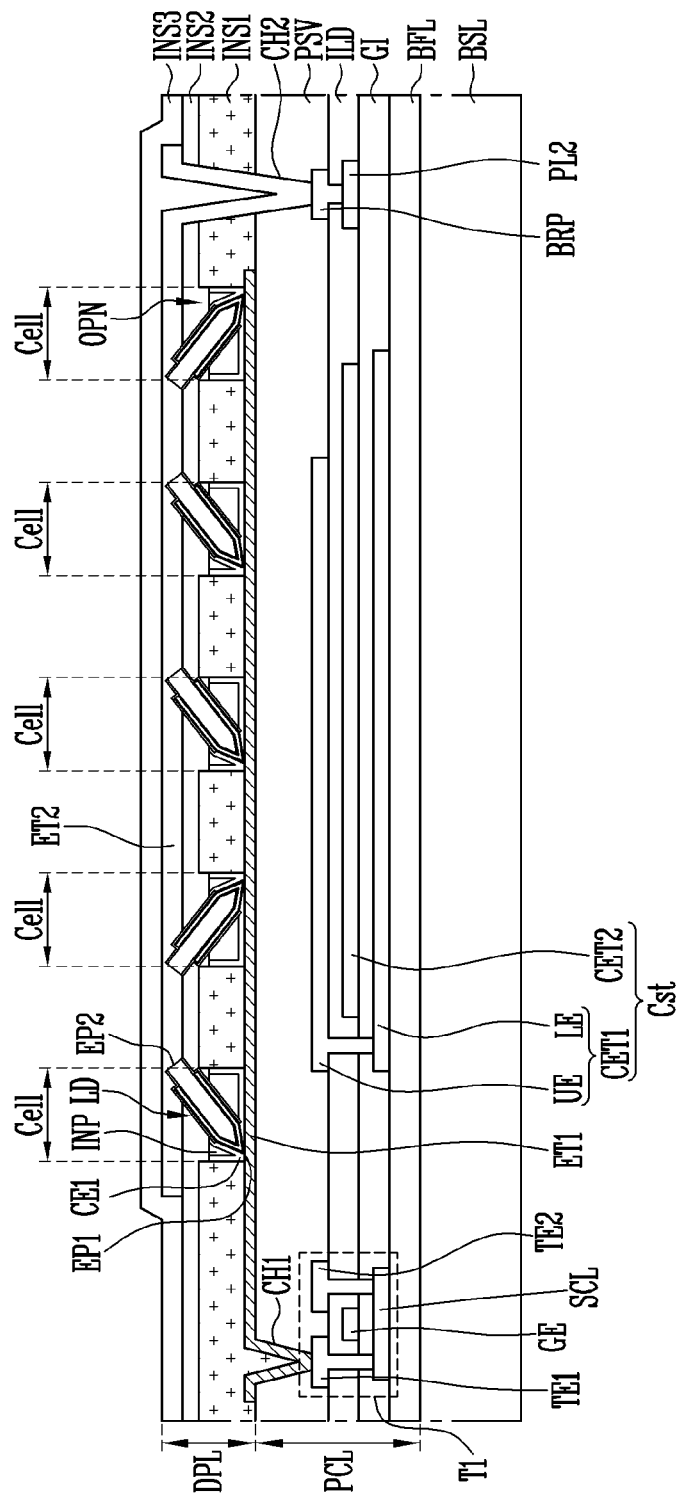

Referring to FIG. 9M, the third insulating layer INS3 may be formed or disposed on one surface or a surface of the base layer BSL on which the second electrode ET2 may be formed or disposed. In an embodiment, the third insulating layer INS3 may be formed in the overall area of the display area DA. In an embodiment, the third insulating layer INS3 may be a thin-film encapsulation layer having at least one organic or inorganic insulating layer, but the disclosure is not limited thereto.

Thereafter, as needed, the overcoat layer OC shown in FIG. 8, etc. may be formed on one surface or a surface of the base layer BSL on which the third insulating layer INS3 is formed. In other words, in an embodiment, the cover layer CVL may be selectively further formed after the third insulating layer INS3 is formed.

Through the above-mentioned process, the pixel PXL according to an embodiment and the display device including the pixel PXL may be fabricated. For example, the pixel PXL in accordance with the embodiments of FIGS. 7 and 8 and the display panel PNL including the pixel PXL may be fabricated.

Figure 11:
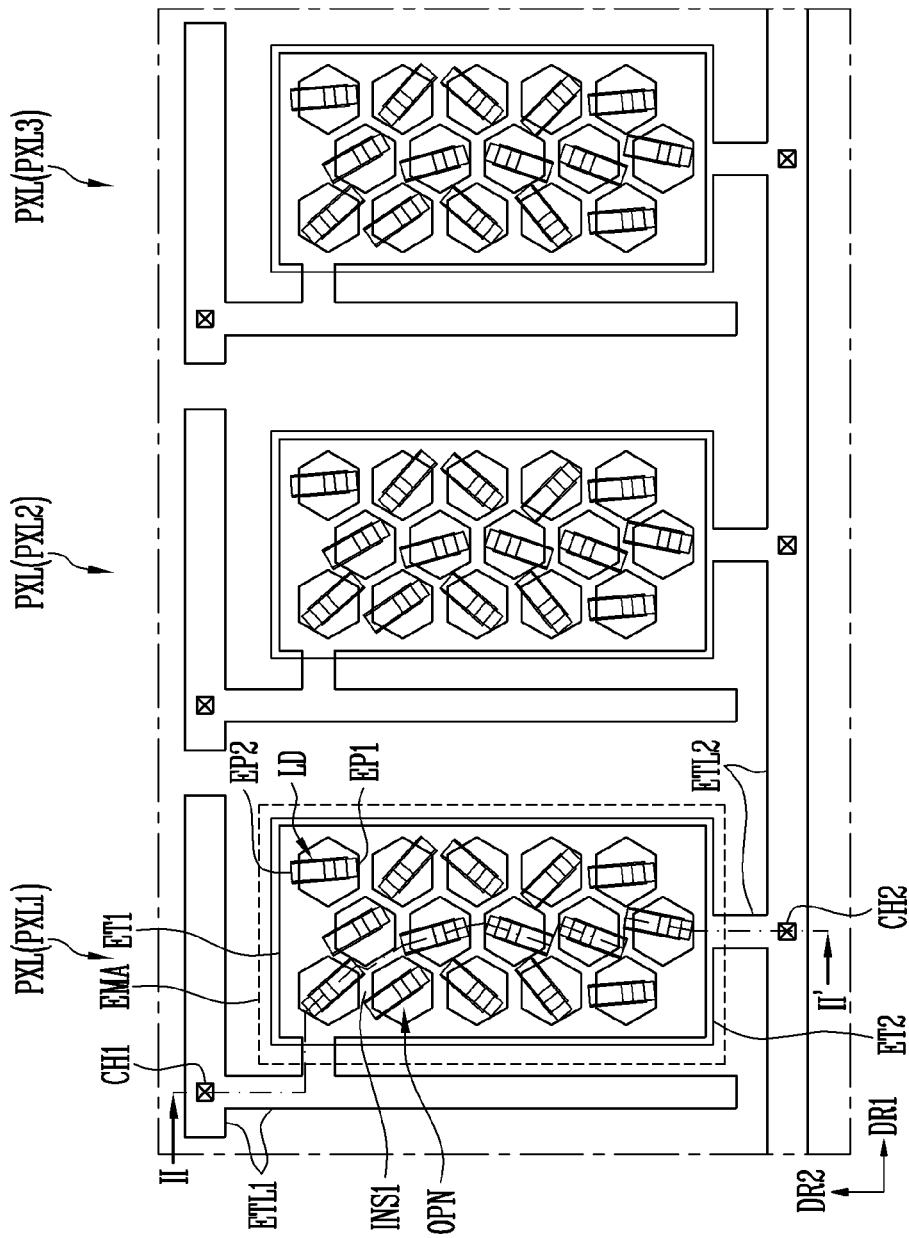
FIG. 11 is a schematic plan view illustrating a pixel in accordance with an embodiment.
Figure 12:
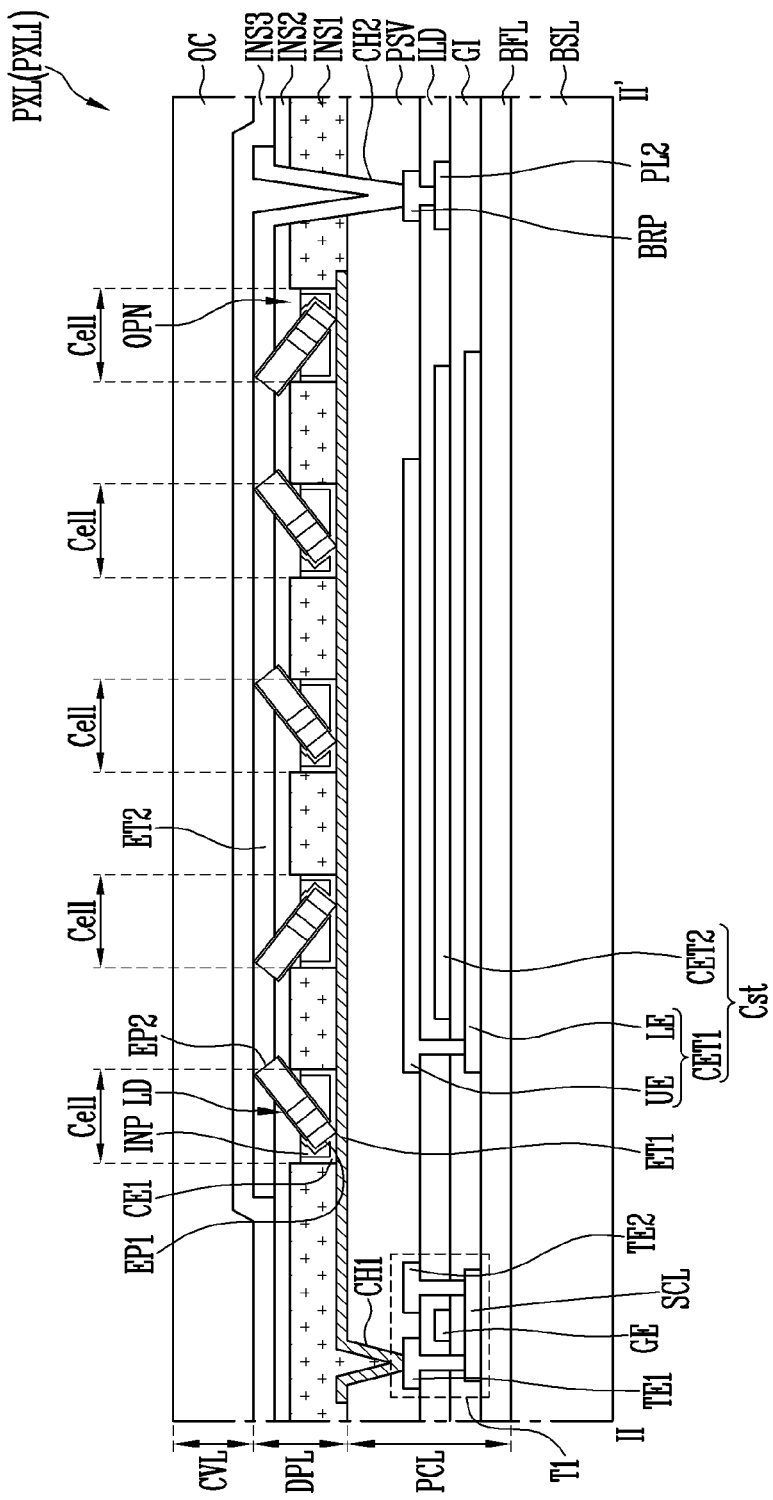
FIG. 12 is a schematic cross-sectional view illustrating a pixel in accordance with an embodiment and for example illustrates an embodiment of a cross-section corresponding to line II-II' of FIG. 11.

FIG. 11 is a schematic plan view illustrating a pixel PXL in accordance with an embodiment, and for example illustrates a modification of the embodiment of FIG. 7. FIG. 12 is a schematic cross-sectional view illustrating a pixel PXL in accordance with an embodiment and for example illustrates an embodiment of a cross-section corresponding to line II-IF of FIG. 11. In the description of the embodiment of FIGS. 11 and 12, like reference numerals will be used to designate components similar or equal to those of the embodiment of FIGS. 7 and 8, and detailed explanation thereof will be omitted.

Referring to FIGS. 11 and 12, the light emitting elements LD may be rod-type light emitting elements. For example, each light emitting element LD may be a rod-type light emitting element which may include a first conductivity type semiconductor layer 11, an active layer 12, a second conductivity type semiconductor layer 13, and an electrode layer 14 which may be successively stacked each other, as shown in FIGS. 2A and 2B and further may include an insulating film INF disposed on a surface thereof. The light emitting elements LD may be light emitting elements LD having various structures, shapes, and/or types. In an embodiment, the light emitting elements LD may be a substantially identical type of light emitting elements, but the disclosure is not limited thereto. For example, in an embodiment, a combination of core-shell light emitting elements LD and rod-type light emitting elements LD may form the light source unit LSU of each pixel PXL.

In an embodiment, the first ends EP1 of the light emitting elements LD that are disposed to face the first electrode ET1 and electrically connected to the first electrode ET1 may be P-type ends (for example, the respective ends each on which the electrode layer 14 of FIG. 2B is formed). The second ends EP2 of the light emitting elements LD that are disposed to face the second electrode ET2 and electrically connected to the second electrode ET2 may be N-type ends (for example, the respective ends each on which the first conductivity type semiconductor layer 11 of FIG. 2B is formed). However, this may be changed depending on the connection position of the light source unit LSU and/or the connection direction of the light emitting elements LD.

FIGS. 13A to 13I are schematic cross-sectional views illustrating a method of fabricating a display device in accordance with an embodiment and for example illustrate an embodiment of a method of fabricating a display device including the pixel PXL of FIGS. 11 and 12. FIGS. 13A to 13I respectively correspond to FIGS. 9E to 9L. In the description of a method of fabricating the display device in accordance with an embodiment of FIGS. 13A to 13I, like reference numerals are used to designate components similar or equal to those of the foregoing embodiment (for example, the embodiments of FIGS. 9A to 9M), and detailed explanation thereof will be omitted.

In the method of fabricating the display device including the pixel PXL in accordance with an embodiment, the process before supplying the light emitting elements LD may be substantially identical with that of the foregoing embodiment. For example, through the process shown in FIGS. 9A to 9D, the first electrode ET1 may be formed or disposed on one surface or a surface of the base layer BSL on which the circuit element layer PCL is formed, and the first insulating layer INS1 and the alignment electrode ALE each of which may include openings OPN may be formed on the first electrode ET1.

Figure 13A:
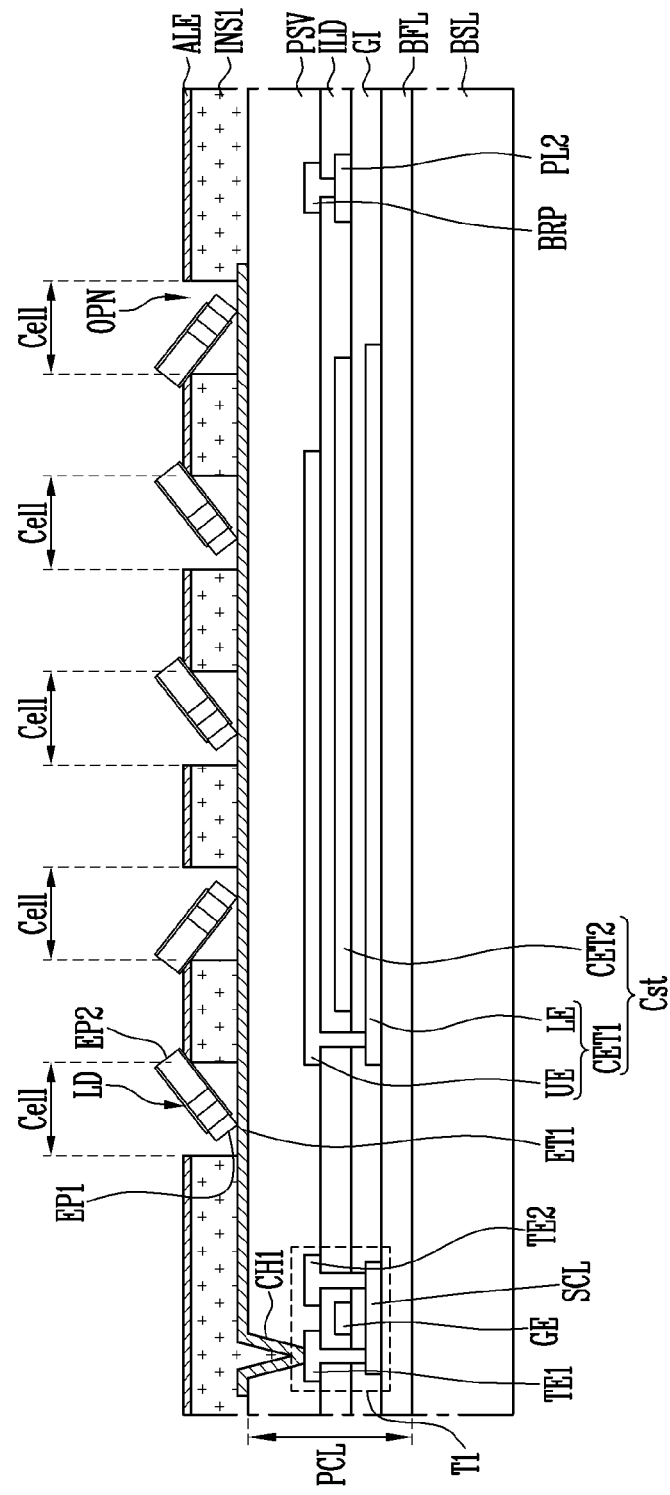
FIGS. 13A to 13I are schematic cross-sectional views illustrating a method of fabricating a display device in accordance with an embodiment and for example illustrate an embodiment of a method of fabricating a display device including the pixel of FIGS. 11 and 12.

Referring to FIG. 13A, light emitting elements LD are supplied onto the base layer BSL on which the first electrode ET1, the first insulating layer INS1, the alignment electrode ALE, etc. are formed, and the light emitting elements LD are aligned in the openings OPN. In an embodiment, each of the light emitting elements LD may be a rod-type light emitting element which may include a first end EP1 that comes into contact with the first electrode ET1, and a second end EP2 that faces the first end EP1.

Figure 13B:
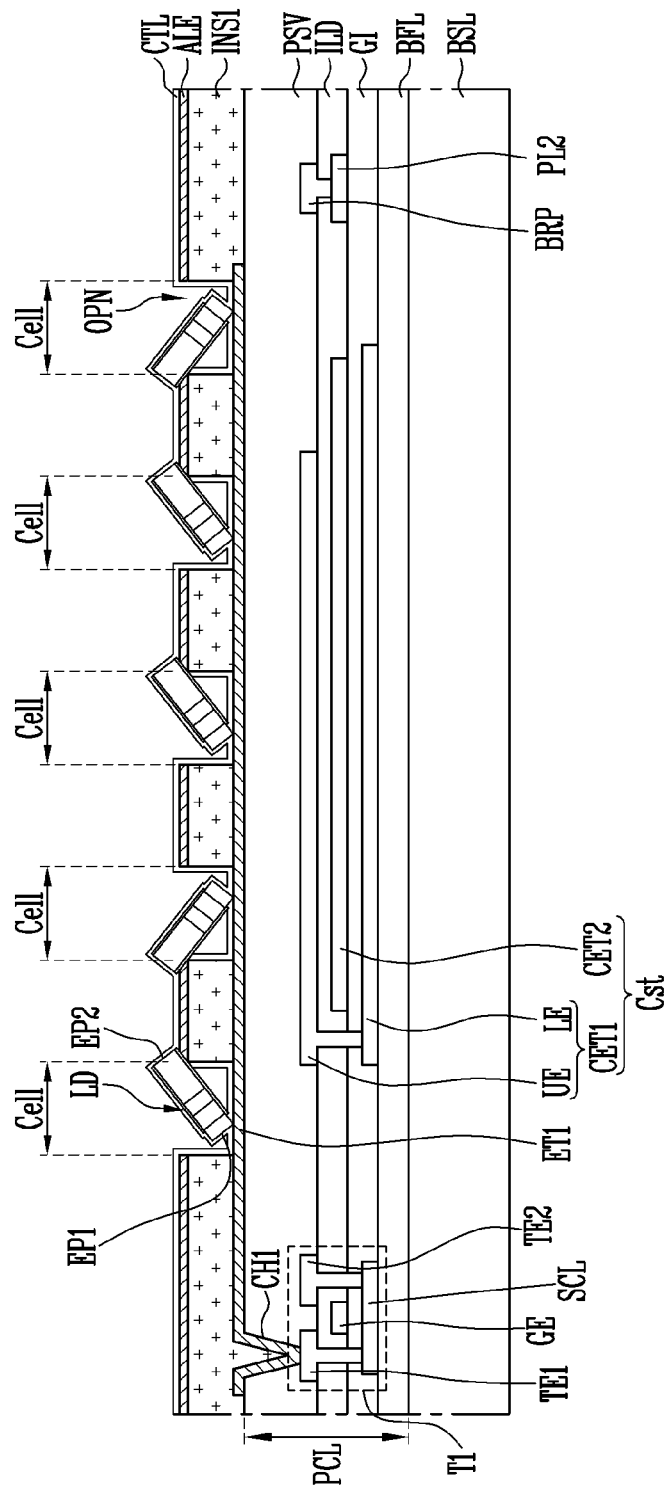
Figure 13C:
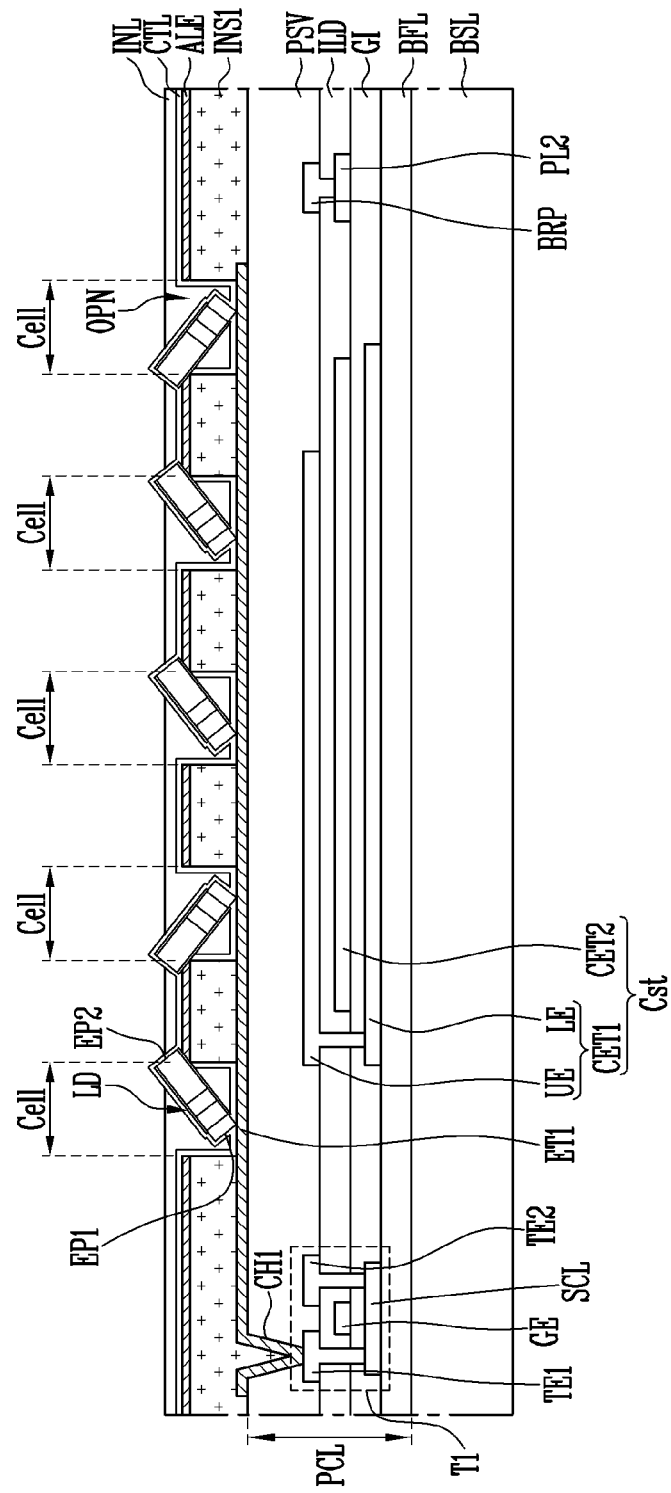

Referring to FIGS. 13B and 13C, the conductive layer CTL and the organic insulating layer INL may be successively formed to cover or overlap the alignment electrode ALE and the light emitting elements LD.

Figure 13D:
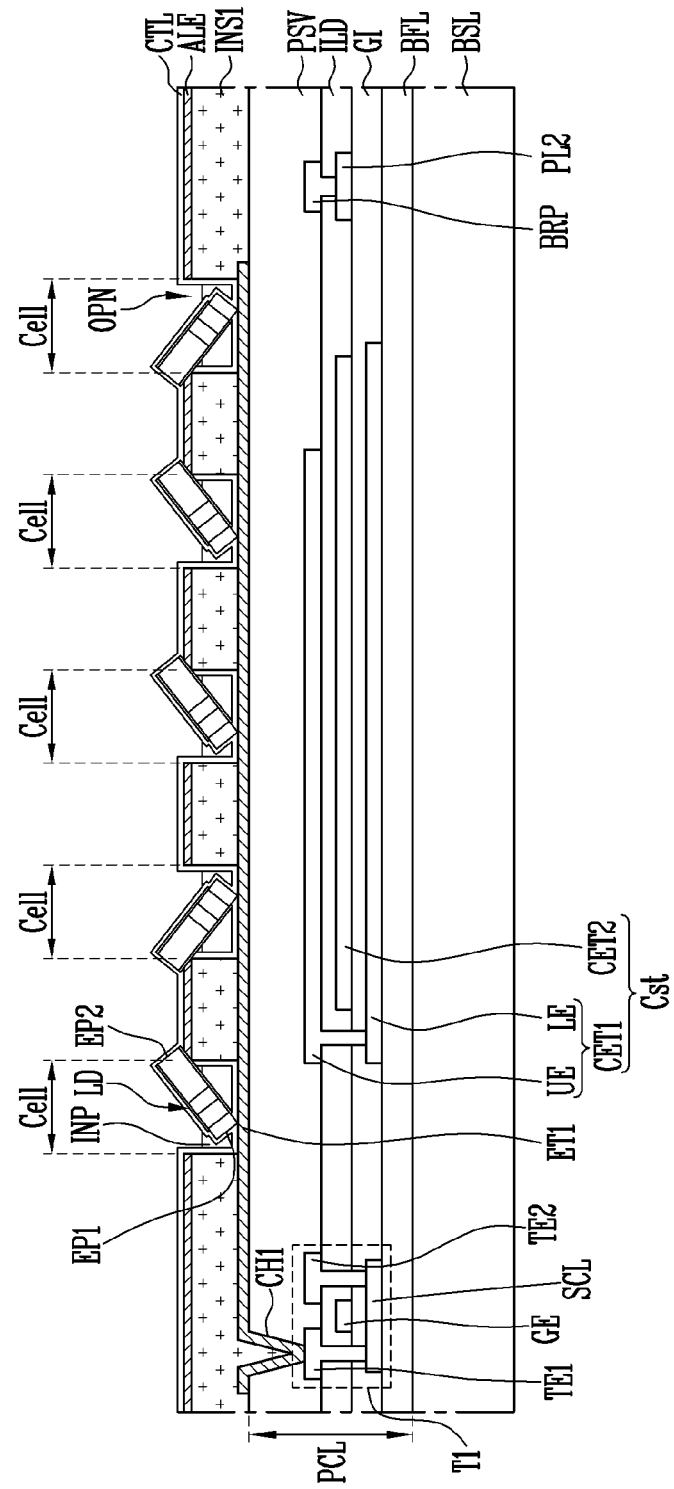
Figure 13E:
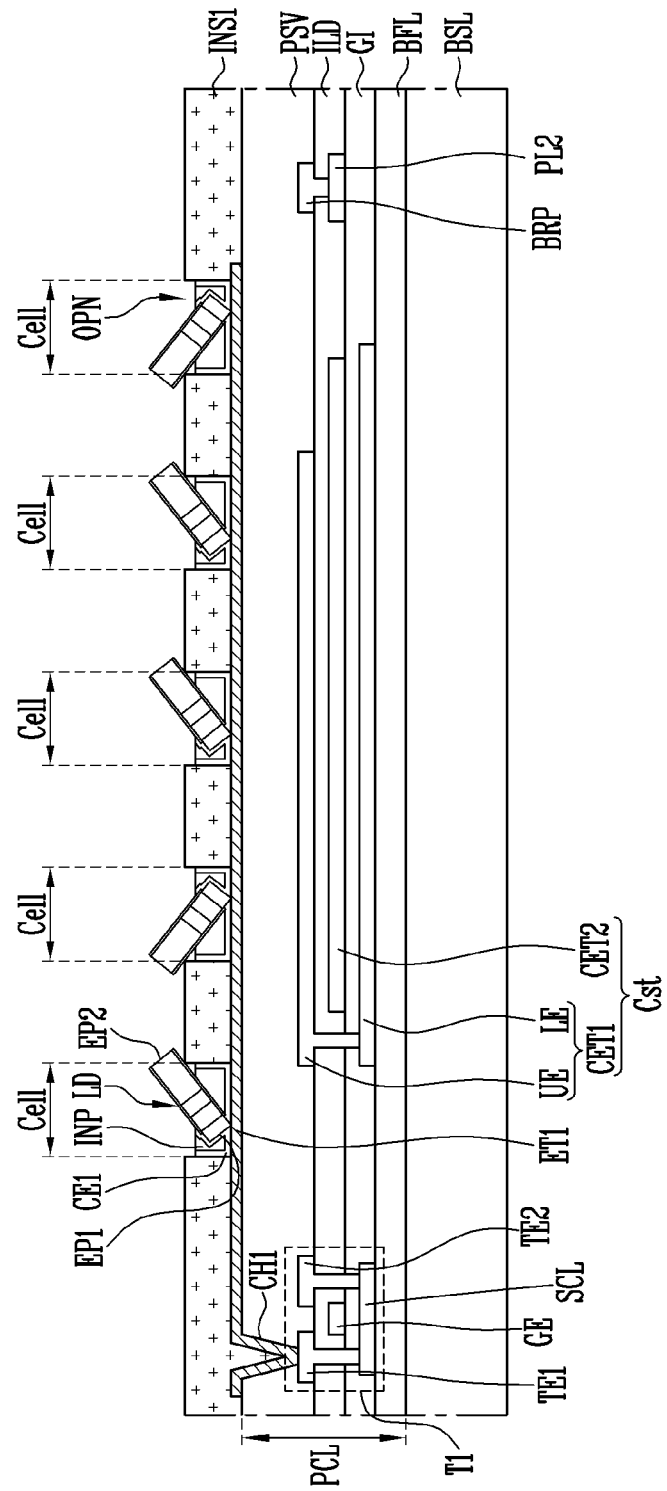

Referring to FIGS. 13D and 13E, the first contact electrodes CE1 and the insulating patterns INP may be formed by selectively etching the conductive layer CTL and the organic insulating layer INL. The alignment electrode ALE is removed.

Figure 13F:
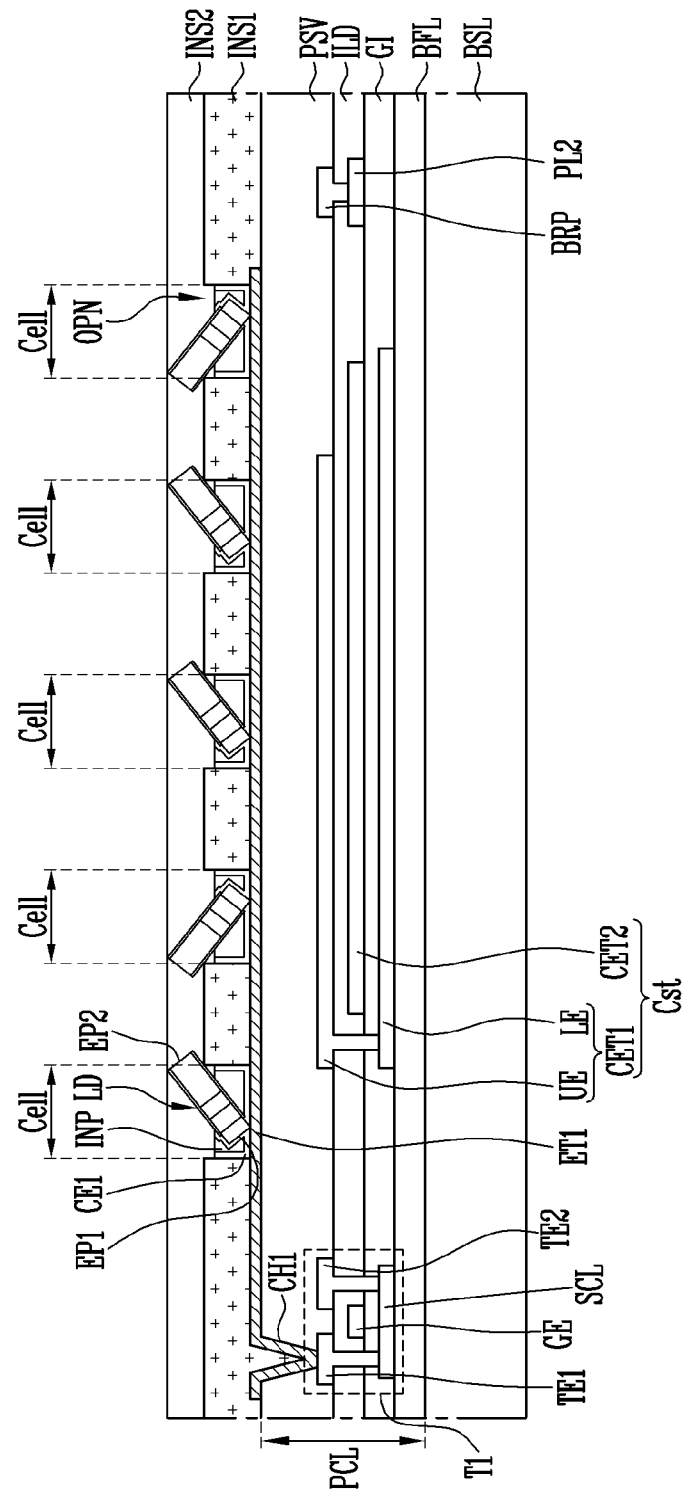
Figure 13G:
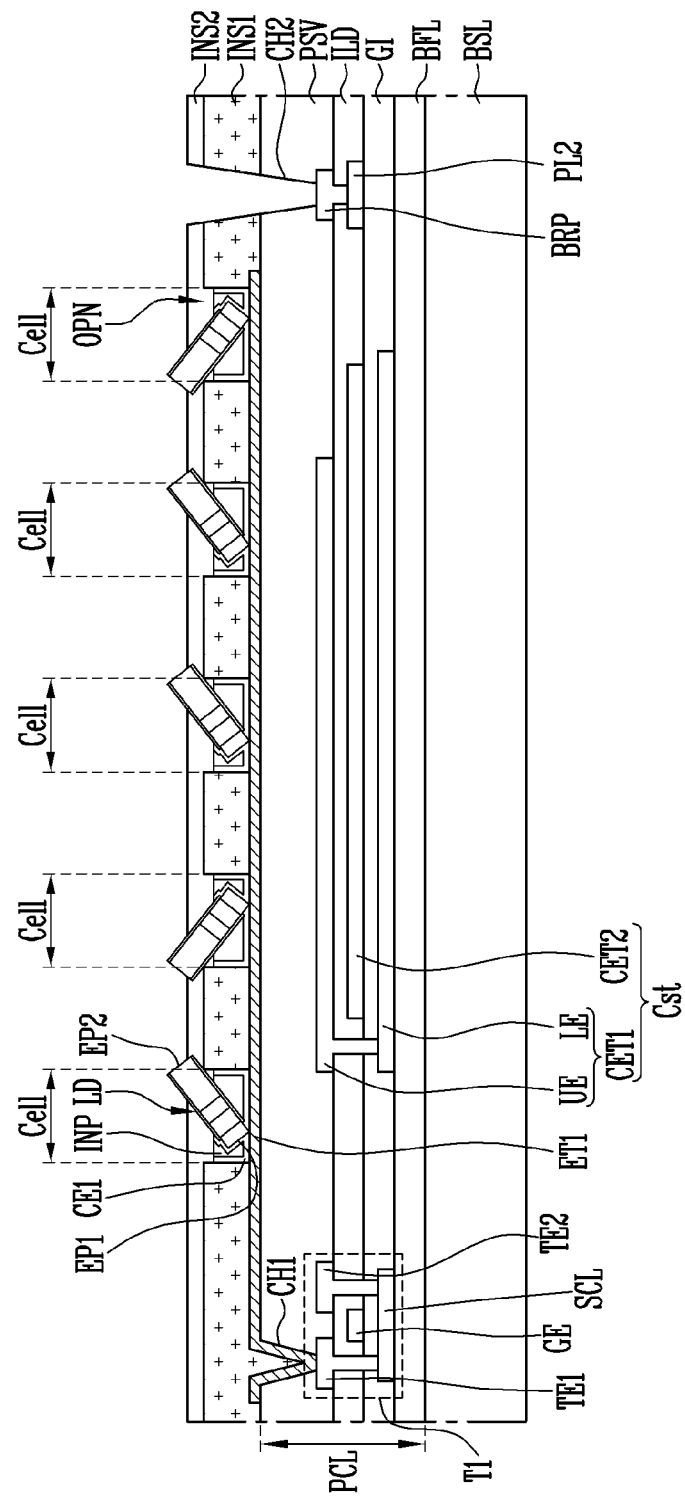

Referring to FIGS. 13F and 13G, after the second insulating layer INS2 is formed to completely cover or overlap the first insulating layer INS1 and the light emitting elements LD, the second insulating layer INS2 is partially etched in the thickness direction such that the second ends EP2 of the light emitting elements LD are exposed.

Figure 13H:
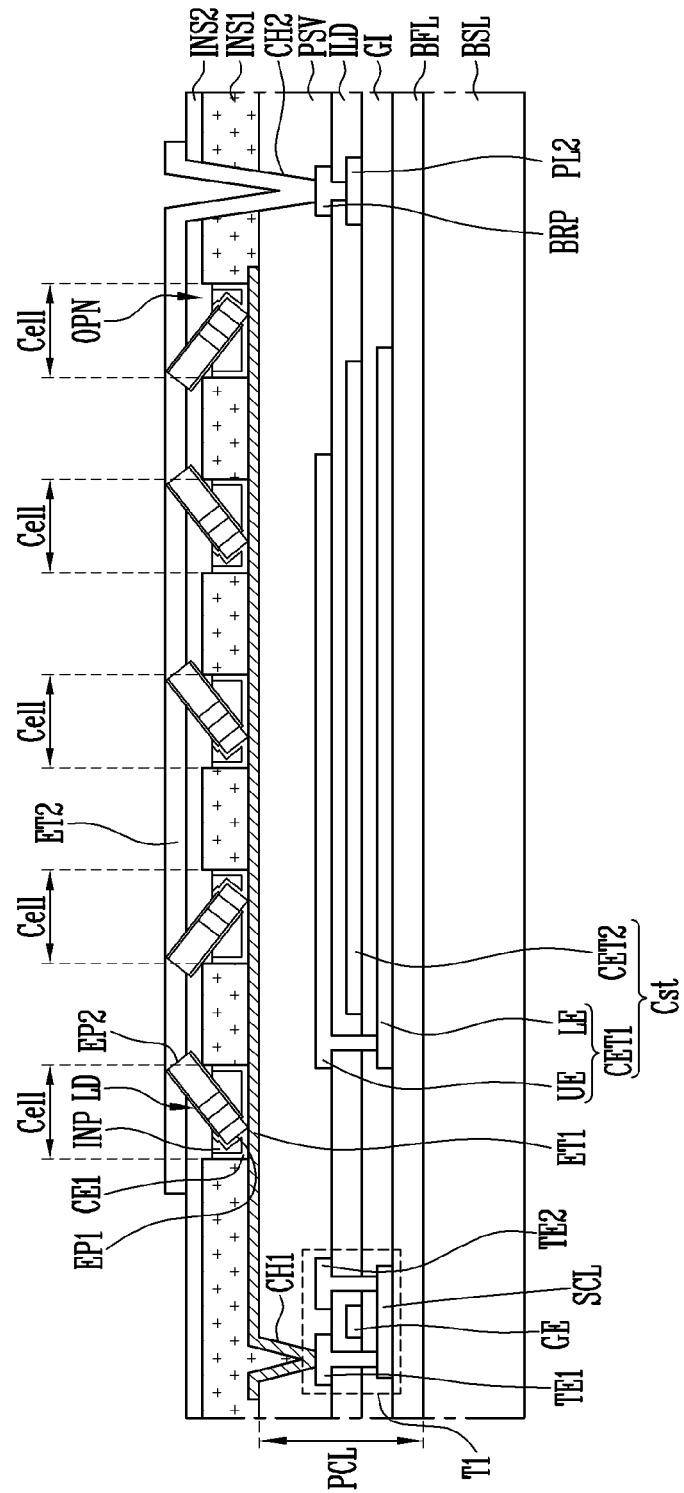
Figure 13I:
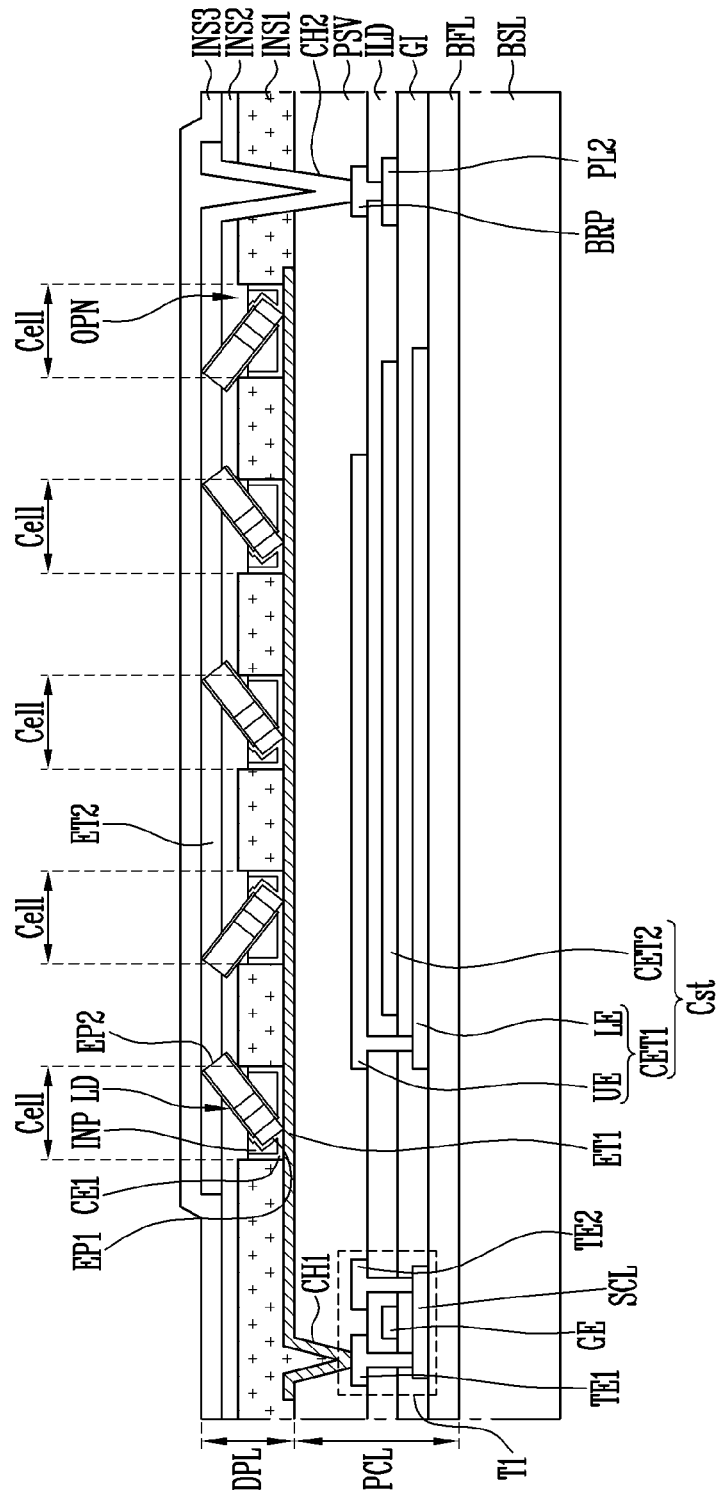

Referring to FIGS. 13H and 13I, the second electrode ET2 is formed on the light emitting elements LD such that the second electrode ET2 is electrically connected with the second ends EP2 of the light emitting elements LD. The third insulating layer INS3 may be formed or disposed on one surface or a surface of the base layer BSL on which the second electrode ET2 may be formed or disposed.

The overcoat layer OC shown in FIG. 12, etc. may be formed on one surface or a surface of the base layer BSL on which the third insulating layer INS3 may be formed or disposed. In other words, the cover layer CVL may be further formed or disposed after the third insulating layer INS3 may be formed or disposed.

Through the above-mentioned process, the pixel PXL according to an embodiment and the display device including the pixel PXL may be fabricated. For example, the pixel PXL in accordance with the embodiments of FIGS. 11 and 12 and the display panel PNL including the pixel PXL may be fabricated.

The method of fabricating the display device in accordance with the embodiments of FIGS. 13A to 13I may be substantially identical with the method of fabricating the display device in accordance with the embodiments of FIGS. 9A to 9M, except the type and/or shape of the light emitting elements LD. Therefore, detailed descriptions pertaining to this will be omitted.

Figure 14:
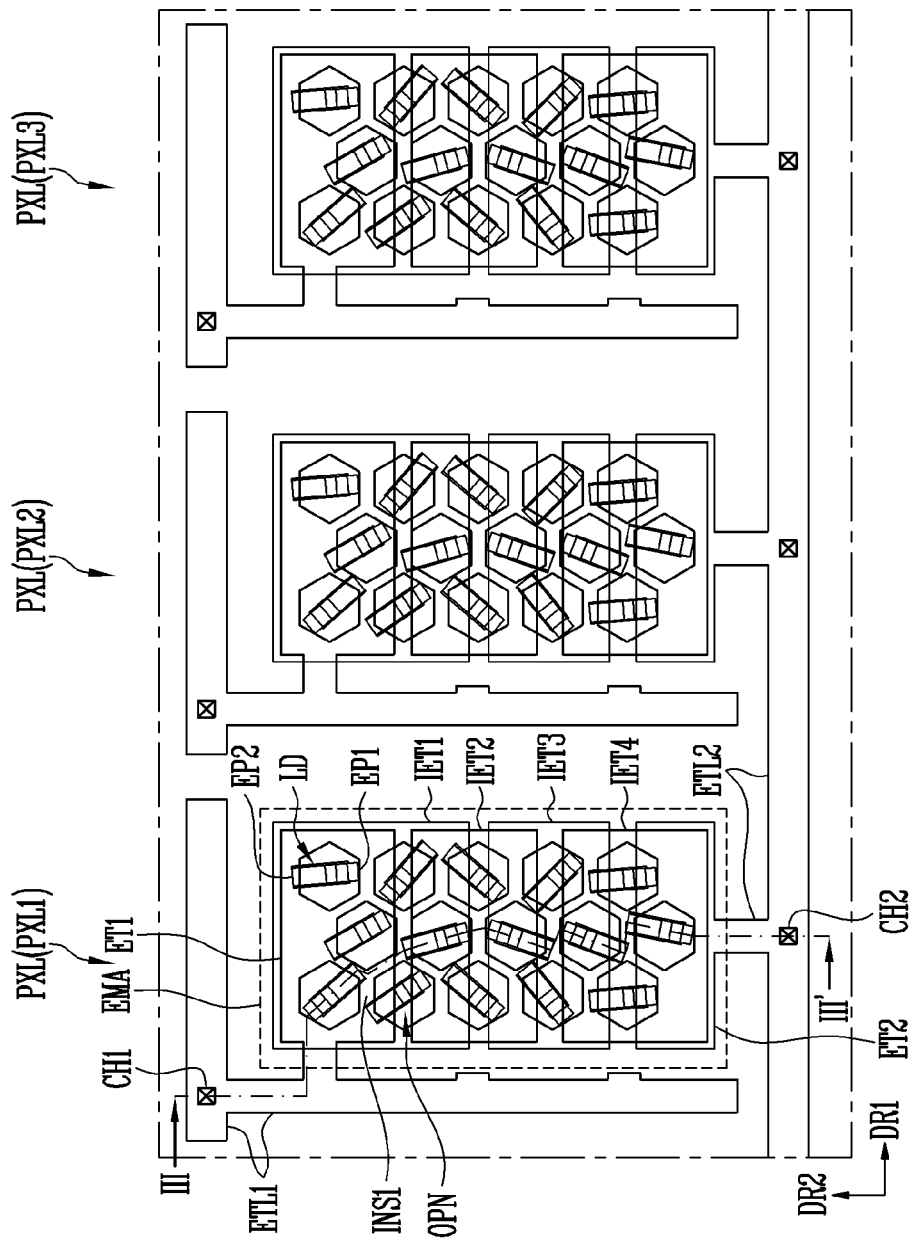
FIG. 14 is a schematic plan view illustrating a pixel in accordance with an embodiment.
Figure 15:
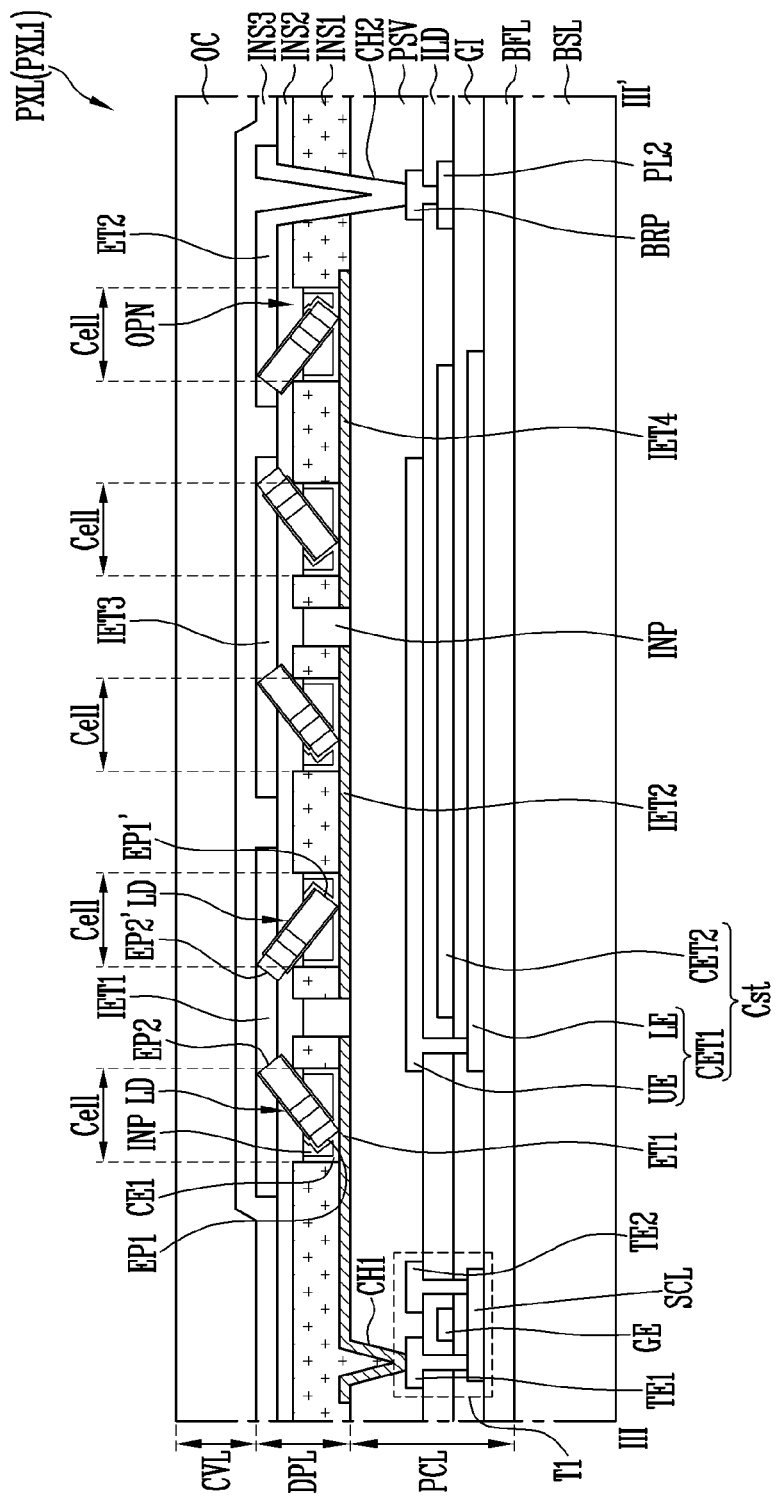
FIG. 15 is a schematic cross-sectional view illustrating a pixel in accordance with an embodiment and for example illustrates an embodiment of a cross-section corresponding to line III-III' of FIG. 14.

FIG. 14 is a schematic plan view illustrating a pixel PXL in accordance with an embodiment, and for example illustrates a modification of the embodiment of FIG. 11. FIG. 15 is a schematic cross-sectional view illustrating a pixel PXL in accordance with an embodiment and for example illustrates an embodiment of a cross-section corresponding to line of FIG. 14. Although FIGS. 14 and 15 illustrate the pixel PXL that forms a light source unit LSU using rod-type light emitting elements LD, as shown in embodiments of FIGS. 11 and 12, the type of light emitting elements LD in accordance with the disclosure is not limited thereto. For example, at least some or part of the rod-type light emitting elements LD in accordance with an embodiment may be replaced with core-shell light emitting elements LD disclosed in the embodiments of FIGS. 7 and 8. In the description of the embodiment of FIGS. 14 and 15, like reference numerals will be used to designate components similar or equal to those of the previous embodiments, and detailed explanation thereof will be omitted.

Referring to FIGS. 14 and 15, each pixel PXL may further include at least one intermediate electrode which is spaced apart from the first electrode ET1 and the second electrode ET2 and electrically connected between the first and second electrodes ET1 and ET2 via at least one light emitting element LD. For example, the pixel PXL may include intermediate electrodes which are alternately disposed on a layer on which the first electrode ET1 may be disposed, and a layer on which the second electrode ET2 may be disposed. For example, the pixel PXL may include first to fourth intermediate electrodes IET1 to IET4 which may be successively connected between the first electrode ET1 and the second electrode ET2.

The first intermediate electrode IET1 along with the second electrode ET2 may be disposed on the second insulating layer INS2, and be disposed to partially overlap the first electrode ET1. The first intermediate electrode IET1 may be electrically connected to the first electrode ET1 through at least one light emitting element LD. The at least one light emitting element LD may be connected in a forward direction between the first electrode ET1 and the first intermediate electrode IET1. For example, the at least one light emitting element LD may include a first end EP1 and a second end EP2 which are respectively connected to the first electrode ET1 and the first intermediate electrode IET1. The first end EP1 and the second end EP2 may be respectively a P-type end and an N-type end. In other words, among the light emitting elements LD aligned between the first electrode ET1 and the first intermediate electrode IET1, each light emitting element LD of which the P-type end may be connected to the first electrode ET1 and of which the N-type end may be connected to the first intermediate electrode IET1 may form a valid light source of a corresponding serial stage (for example, the first serial stage).

The second intermediate electrode IET2 along with the first electrode ET1 may be disposed on the passivation layer PSV, and be disposed to partially overlap the first intermediate electrode IET1. The second intermediate electrode IET2 may be electrically connected to the first intermediate electrode IET1 through at least one light emitting element LD. The at least one light emitting element LD may be connected in the forward direction between the first intermediate electrode IET1 and the second intermediate electrode IET2. For example, the at least one light emitting element LD may include a second end EP2' and a first end EP1' which are respectively connected to the first intermediate electrode IET1 and the second intermediate electrode IET2. The second end EP2' and the first end EP1' may be respectively a P-type end and an N-type end. In other words, among the light emitting elements LD aligned between the first intermediate electrode IET1 and the second intermediate electrode IET2, each light emitting element LD of which the P-type end may be connected to the first intermediate electrode IET1 and of which the N-type end may be connected to the second intermediate electrode IET2 may form a valid light source of a corresponding serial stage (for example, the second serial stage).

The third intermediate electrode IET3 along with the second electrode ET2 may be disposed on the second insulating layer INS2, and be disposed to partially overlap the second intermediate electrode IET2. The third intermediate electrode IET3 may be electrically connected to the second intermediate electrode IET2 through at least one light emitting element LD. The at least one light emitting element LD may be connected in the forward direction between the second intermediate electrode IET2 and the third intermediate electrode IET3. For example, the at least one light emitting element LD may include a first end EP1 and a second end EP2 which are respectively connected to the second intermediate electrode IET2 and the third intermediate electrode IET3. The first end EP1 and the second end EP2 may be respectively a P-type end and an N-type end. In other words, among the light emitting elements LD aligned between the second intermediate electrode IET2 and the third intermediate electrode IET3, each light emitting element LD of which the P-type end may be connected to the second intermediate electrode IET2 and of which the N-type end may be connected to the third intermediate electrode IET3 may form a valid light source of a corresponding serial stage (for example, the third serial stage).

The fourth intermediate electrode IET4 along with the first electrode ET1 may be disposed on the passivation layer PSV, and be disposed to partially overlap the third intermediate electrode IET3. The fourth intermediate electrode IET4 may be electrically connected to the third intermediate electrode IET3 through at least one light emitting element LD. The at least one light emitting element LD may be connected in the forward direction between the third intermediate electrode IET3 and the fourth intermediate electrode IET4. For example, the at least one light emitting element LD may include a second end EP2' and a first end EP1' which are respectively connected to the third intermediate electrode IET3 and the fourth intermediate electrode IET4. The second end EP2' and the first end EP1' may be respectively a P-type end and an N-type end. In other words, among the light emitting elements LD aligned between the third intermediate electrode IET3 and the fourth intermediate electrode IET4, each light emitting element LD of which the P-type end may be connected to the third intermediate electrode IET3 and of which the N-type end may be connected to the fourth intermediate electrode IET4 may form a valid light source of a corresponding serial stage (for example, the fourth serial stage).

The fourth intermediate electrode IET4 may also be disposed to partially overlap the second electrode ET2. The fourth intermediate electrode IET4 may be electrically connected to the second electrode ET2 through at least one light emitting element LD. The at least one light emitting element LD may be connected in the forward direction between the fourth intermediate electrode IET4 and the second electrode ET2. For example, the at least one light emitting element LD may include a first end EP1 and a second end EP2 which are respectively connected to the fourth intermediate electrode IET4 and the second electrode ET2. The first end EP1 and the second end EP2 may be respectively a P-type end and an N-type end. In other words, among the light emitting elements LD aligned between the fourth intermediate electrode IET4 and the second electrode ET2, each light emitting element LD of which the P-type end may be connected to the fourth intermediate electrode IET4 and of which the N-type end may be connected to the second electrode ET2 may form a valid light source of a corresponding serial stage (for example, the fifth serial stage).

In an embodiment, each of the first to fourth intermediate electrodes IET1 to IET4 may be electrically connected to the first electrode ET1 or the second electrode ET2 and supplied with an alignment signal, at the step of aligning the light emitting elements LD. After the alignment of the light emitting elements LD are completed, each of the first to fourth intermediate electrodes IET1 to IET4 may be separated in the form of an individual electrode. In an embodiment, an area between the first electrode ET1 and at least one intermediate electrode disposed on a layer identical with the first electrode ET1 may be filled with insulating material drawn thereinto during a process of depositing the insulating pattern INP and/or the second insulating layer INS2 after an electrode separation process. For example, the insulating pattern INP and/or the second insulating layer INS2 may be interposed between the first electrode ET1, the second intermediate electrode IET2, and the fourth intermediate electrode IET4.

In accordance with the foregoing embodiment, light emitting elements LD for forming each light source unit LSU may be connected in a serial or parallel combination structure.

FIGS. 16A to 16E are schematic cross-sectional views illustrating a method of fabricating a display device in accordance with an embodiment and for example illustrate an embodiment of a method of fabricating a display device including the pixel PXL of FIGS. 14 and 15. In the description of the method of fabricating the display device in accordance with the embodiment of FIGS. 16A to 16E, like reference numerals will be used to designate components similar or equal to those of the previous embodiments, and detailed explanation thereof will be omitted.

Referring to FIGS. 9A to 9D and 14 to 16A, in the method of fabricating the display device including the pixel PXL in accordance with an embodiment, a process before supplying the light emitting elements LD may be substantially identical or similar to that of the embodiment described with reference to FIGS. 9A to 9D. For example, a lower electrode pattern ETP including the first electrode ET1 and at least one intermediate electrode may be formed or disposed on one surface or a surface of the base layer BSL on which the circuit element layer PCL may be formed or disposed. For example, the lower electrode pattern ETP that integrally may include the first electrode ET1, the second intermediate electrode IET2, and the fourth intermediate electrode IET4 may be formed or disposed on one surface or a surface of the base layer BSL. Thereafter, the first insulating layer INS1 and the alignment electrode ALE each of which may include openings OPN may be formed on the lower electrode pattern ETP.

Figure 16A:
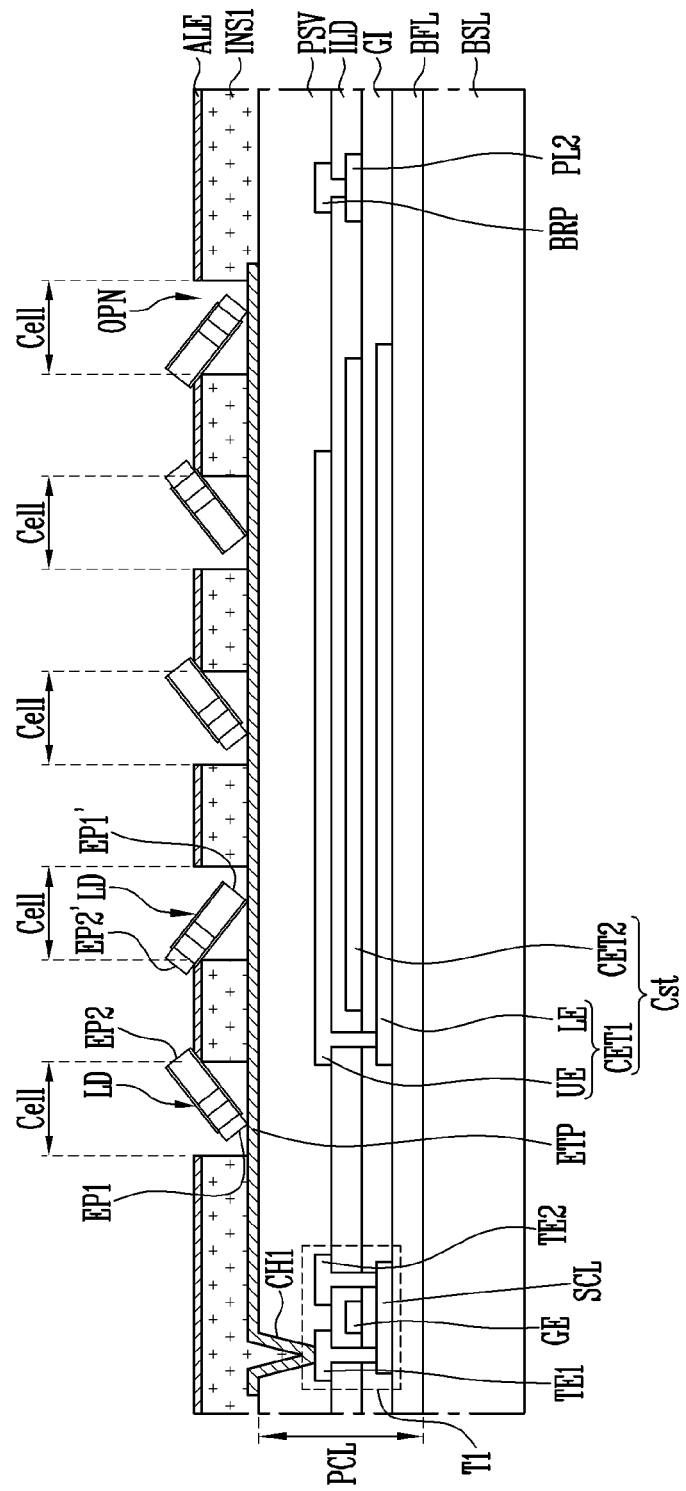
FIGS. 16A to 16E are schematic cross-sectional views illustrating a method of fabricating a display device in accordance with an embodiment and for example illustrate an embodiment of a method of fabricating a display device including the pixel of FIGS. 14 and 15.
Figure 16B:
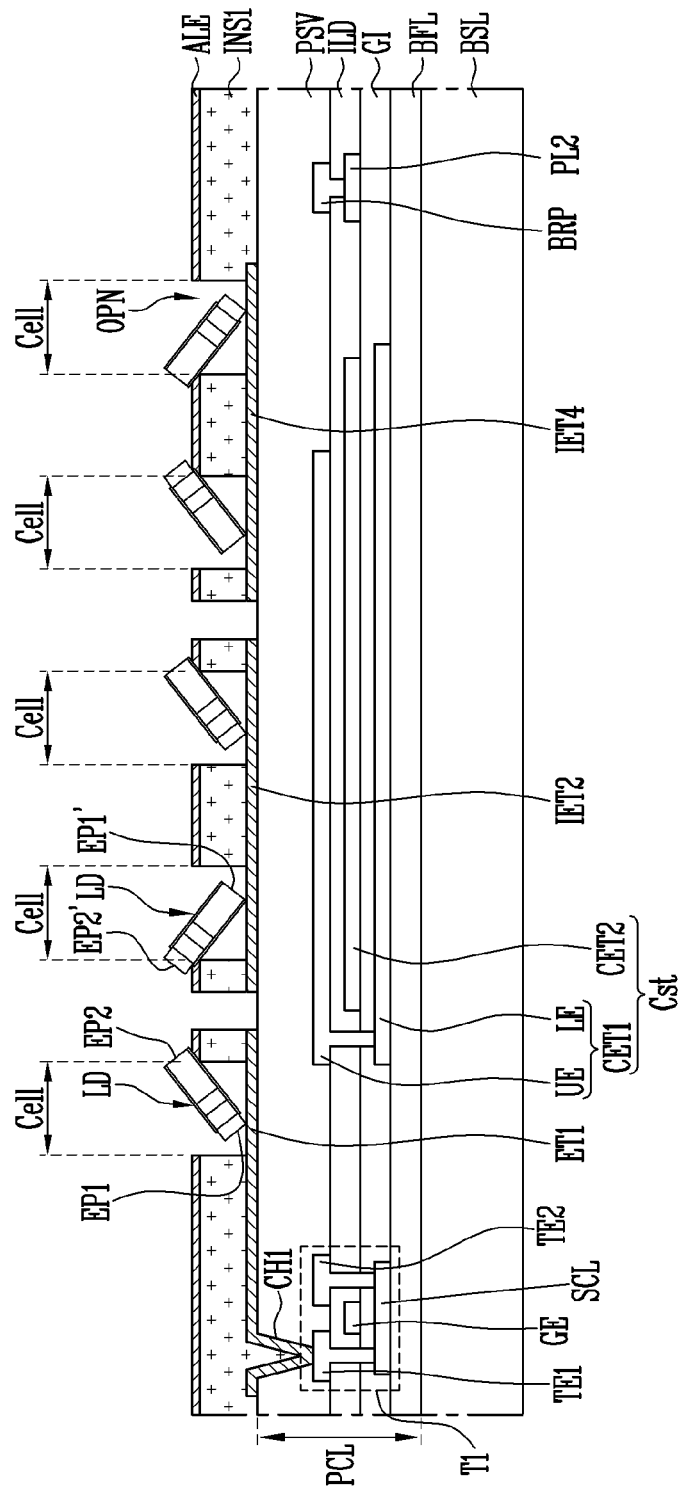

Referring to FIG. 16B, the alignment electrode ALE, the first insulating layer INS1, and the lower electrode pattern ETP may be patterned in an area corresponding to space between the first electrode ET1, the second intermediate electrode IET2, and the fourth intermediate electrode IET4 through various patterning processes including a photo process. In an embodiment, the alignment electrode ALE, the first insulating layer INS1, and the lower electrode pattern ETP may be simultaneously or successively patterned. Thereby, the lower electrode pattern ETP may be divided into the first electrode ET1, the second intermediate electrode IET2, and the fourth intermediate electrode IET4.

Figure 16C:
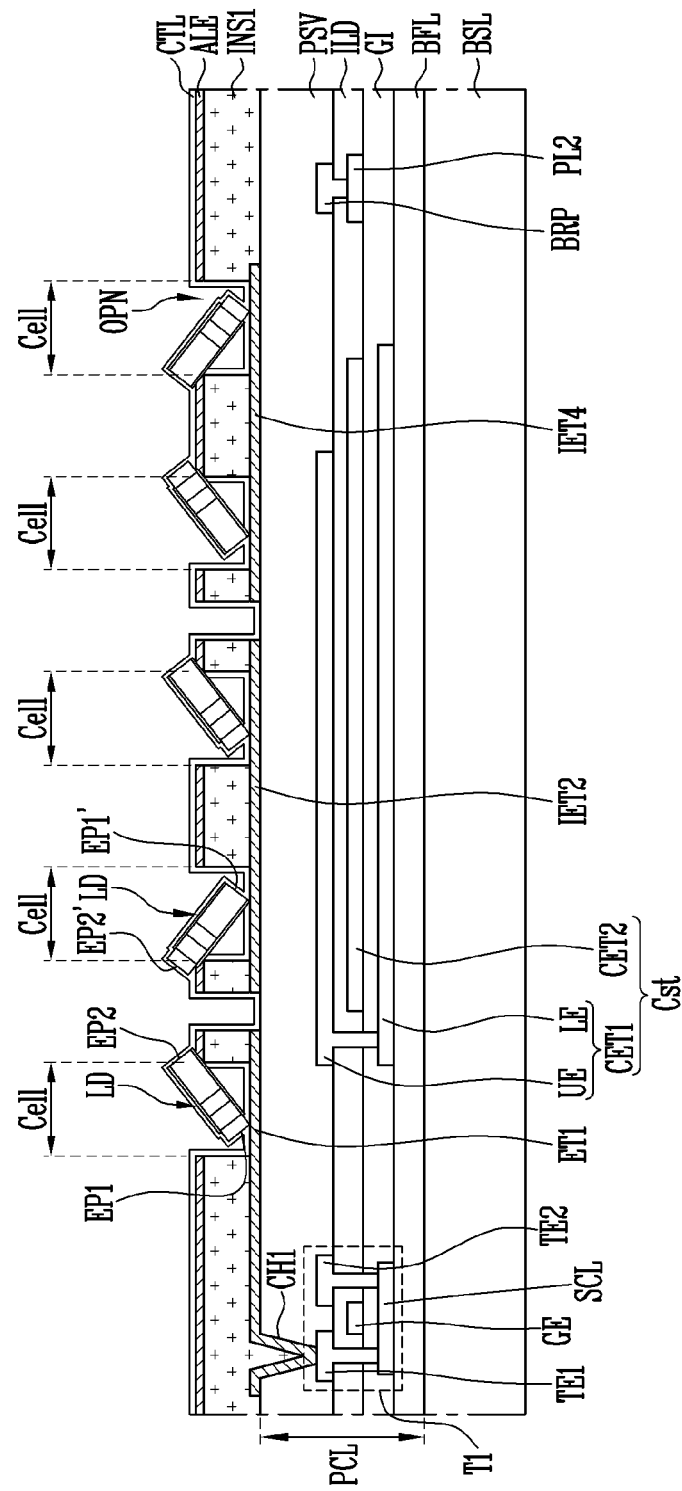
Figure 16D:
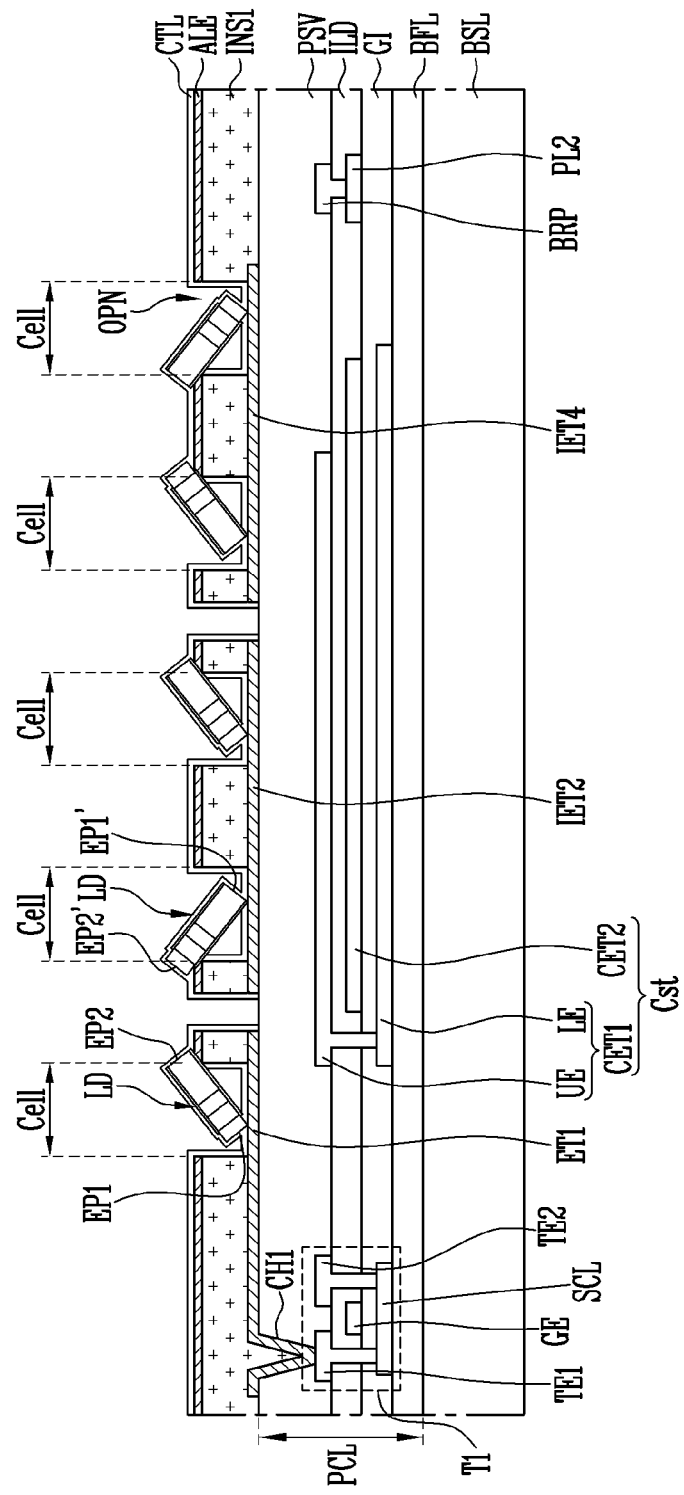

Referring to FIGS. 16C and 16D, after the conductive layer CTL is formed, the conductive layer CTL is removed between the first electrode ET1, the second intermediate electrode IET2, and the fourth intermediate electrode IET4. Hence, the first electrode ET1, the second intermediate electrode IET2, and the fourth intermediate electrode IET4 may be prevented from short-circuiting with each other.

Thereafter, as shown in the embodiments described above, the first contact electrodes CE1 and the insulating patterns INP are formed by forming the organic insulating layer INL on the conductive layer CTL, and selectively etching the conductive layer CTL and the organic insulating layer INL. During a process of depositing the organic insulating layer INL to form the insulating patterns INP, organic insulating material may be drawn between the first electrode ET1, the second intermediate electrode IET2, and the fourth intermediate electrode IET4, so that the insulating pattern INP may also be formed therebetween. After the second insulating layer INS2 is formed to completely cover or overlap the first insulating layer INS1 and the light emitting elements LD, the second insulating layer INS2 is partially etched in the thickness direction such that the second ends EP2 and EP2' of the light emitting elements LD are exposed.

Figure 16E:
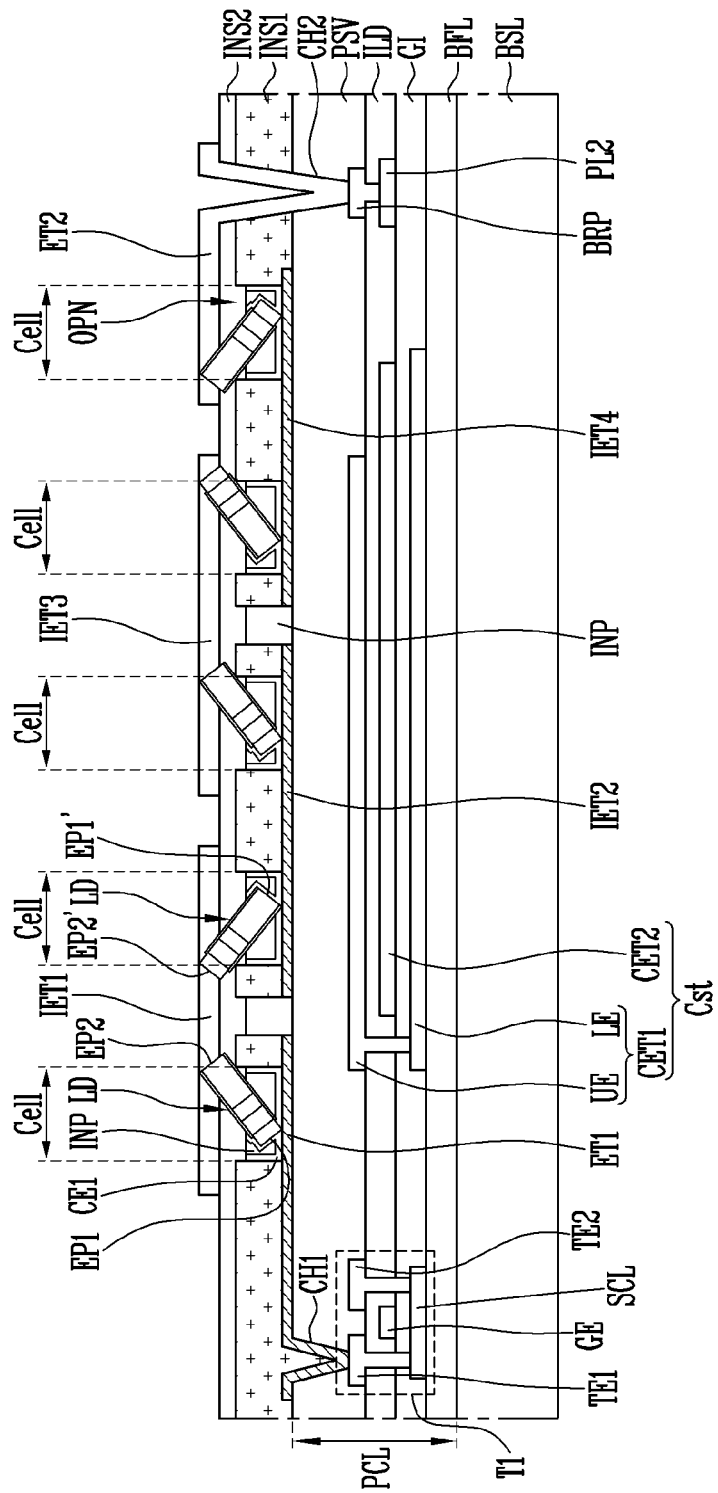
Figure 17A:
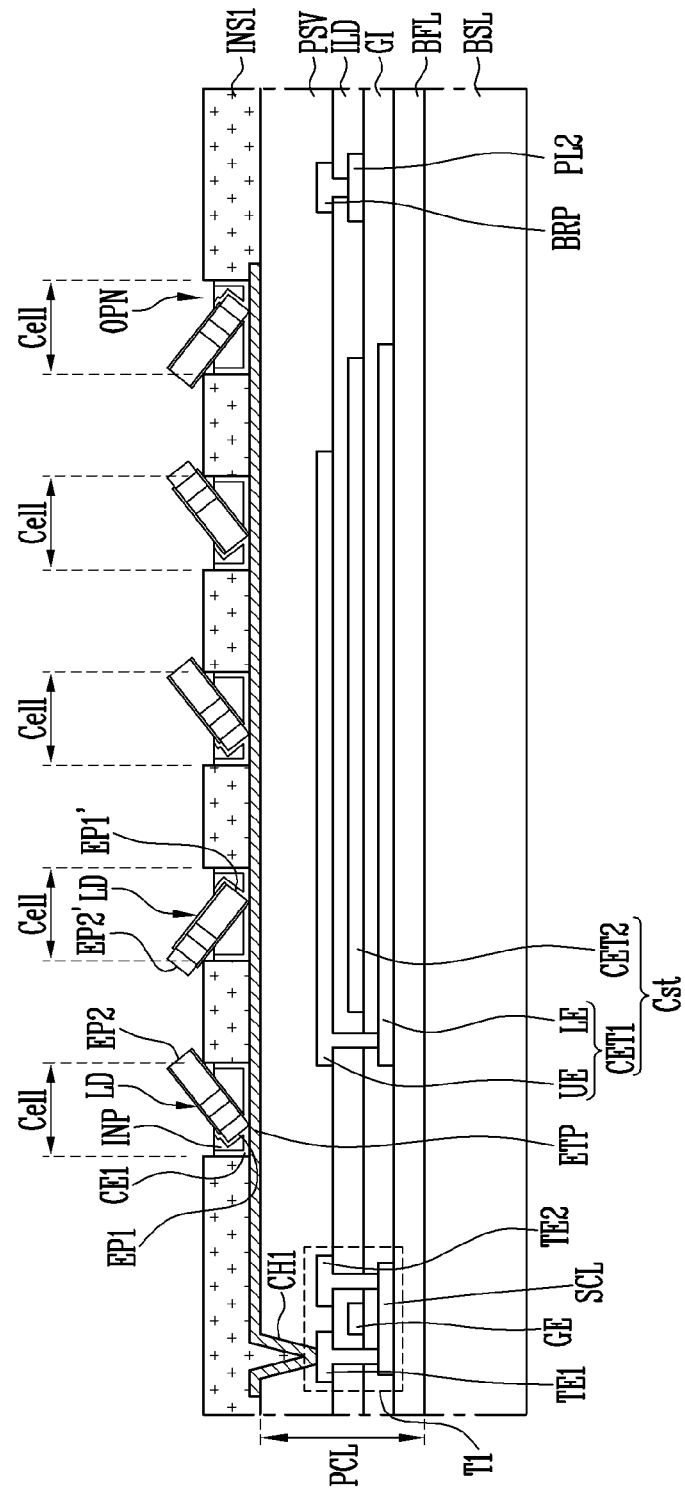
FIGS. 17A to 17D are schematic cross-sectional views illustrating a method of fabricating a display device in accordance with an embodiment and for example illustrate an embodiment of a method of fabricating a display device including the pixel of FIGS. 14 and 15.
Figure 17B:
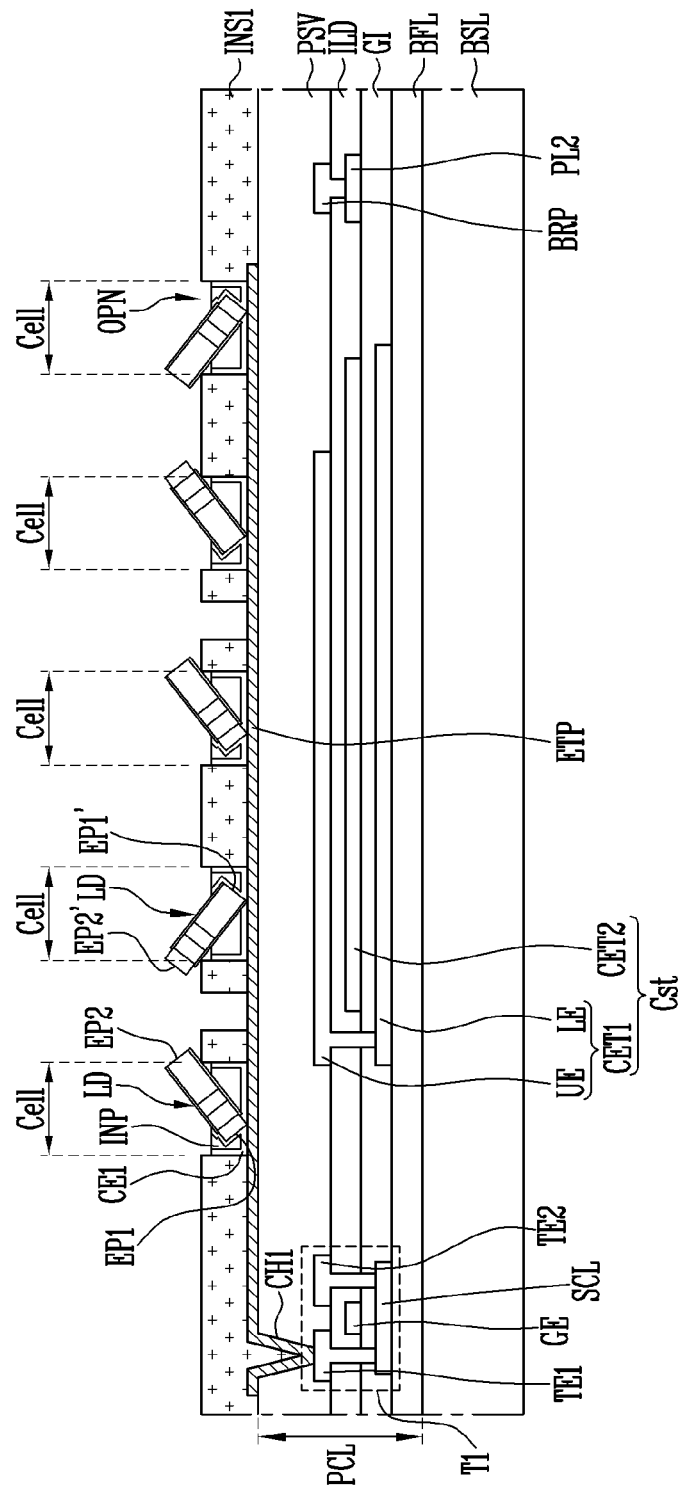
Figure 17C:
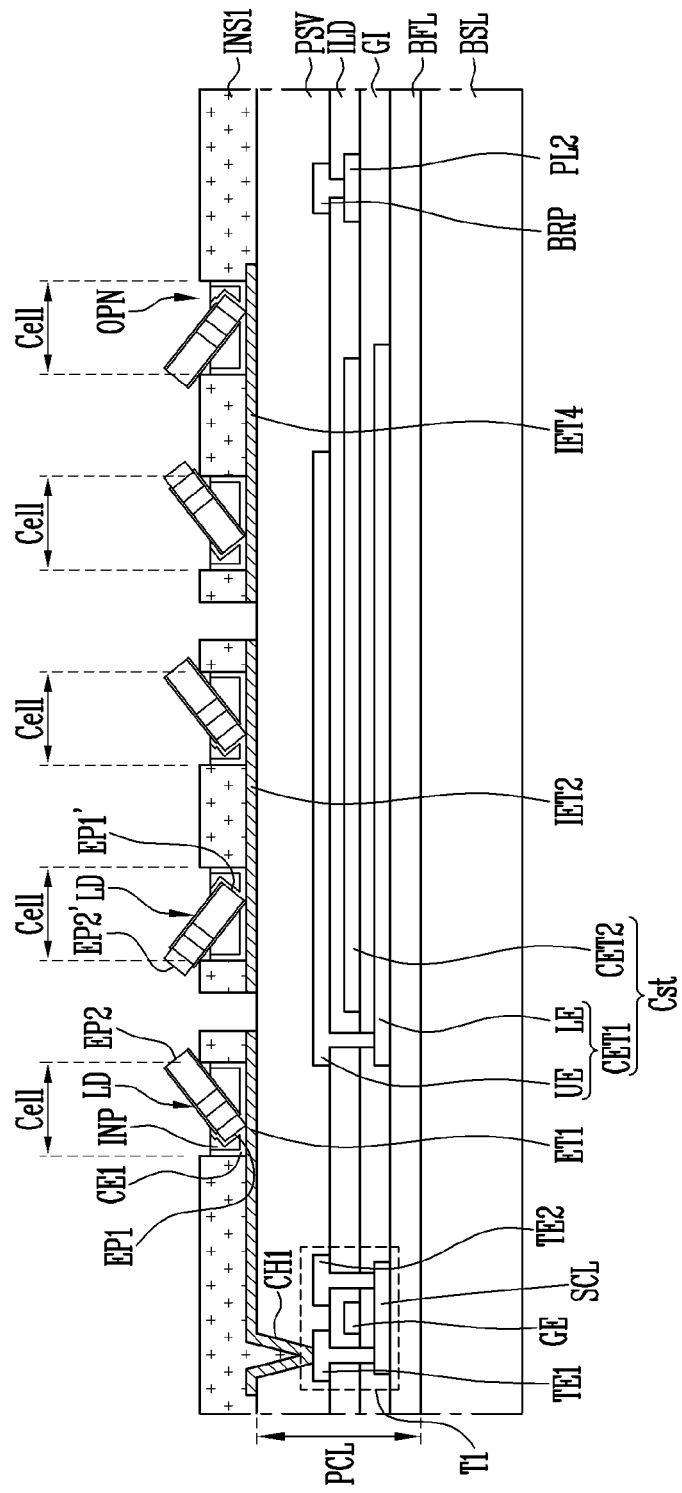
Figure 17D:
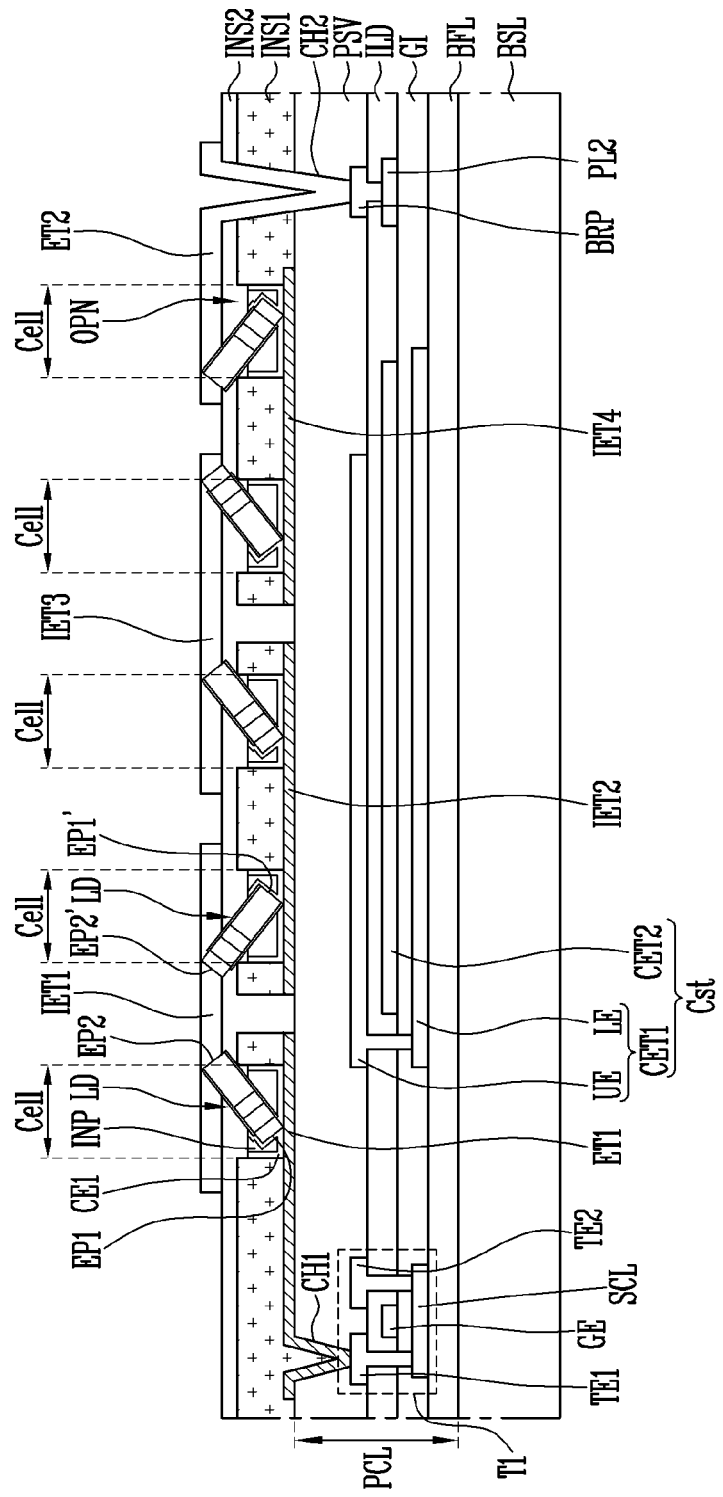

Referring to FIG. 16E, at least one intermediate electrode and the second electrode ET2 are formed on some or part of different light emitting elements LD of the light emitting elements LD. For example, the first intermediate electrode IET1, the third intermediate electrode IET3, and the second electrode ET2 may be respectively formed on some or part of different light emitting elements LD of the light emitting elements LD.

The third insulating layer INS3 and/or the overcoat layer OC may be formed, whereby the display panel PNL including the pixel PXL in accordance with the embodiment of FIGS. 14 and 15 may be fabricated.

FIGS. 17A to 17D are schematic cross-sectional views illustrating a method of fabricating a display device in accordance with an embodiment and for example illustrate an embodiment of a method of fabricating a display device including the pixel PXL of FIGS. 14 and 15. In the description of the method of fabricating the display device in accordance with the embodiment of FIGS. 17A to 17D, like reference numerals will be used to designate components similar or equal to those of the previous embodiments, and detailed explanation thereof will be omitted.

Referring to FIGS. 17A to 17D, after the first contact electrodes CE1 and the insulating patterns INP are formed on the lower electrode pattern ETP, the first insulating layer INS1 and the lower electrode pattern ETP are successively patterned, whereby the lower electrode pattern ETP may be divided into the first electrode ET1, the second intermediate electrode IET2, and the fourth intermediate electrode IET4. Thereafter, the second insulating layer INS2 is formed, and the first intermediate electrode IET1, the third intermediate electrode IET3, and the second electrode ET2 are formed on the second insulating layer INS2. During a process of forming the second insulating layer INS2, organic insulating material is drawn into space between the first electrode ET1, the second intermediate electrode IET2, and the fourth intermediate electrode IET4, so that an area of the second insulating layer INS2 may also be disposed therebetween.

As shown in the embodiments of FIGS. 16A to 16E and the embodiments of FIGS. 17A to 17D, the step of performing the process of separating the lower electrode pattern ETP may be changed in various ways depending on embodiments.

While the scope of the disclosure is described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

What is claimed is:

1. A display device comprising:
a pixel disposed in a display area, the pixel comprising:
a first electrode;
a first insulating layer disposed on the first electrode, and including openings, each of the openings exposing different areas of the first electrode and defining respective cells;
light emitting elements disposed in the respective cells, each of the light emitting elements including:
a first end portion electrically connected to the first electrode;
a second end portion protruding upward from the first insulating layer; and
a side surface connecting the first end portion and the second end portion and including an upper side surface and a lower side surface;
a second electrode disposed on the light emitting elements, and electrically connected to the second end portion of each of the light emitting elements; and
first contact electrodes disposed in the openings, each of the first contact electrodes disposed in a corresponding one of the openings including:
a lower part contacting the first electrode,
a first protruding part covering a first lateral surface of each of the openings,
a second protruding part covering a second lateral surface of each of the openings opposite to the first lateral surface of each of the openings, and
a third protruding part contacting the upper side surface and the first end portion of each of the light emitting elements, wherein
the third protruding part is disposed between the first protruding part and the second protruding part in a horizontal direction.

2. The display device of claim 1, wherein each of the openings has a width less than a length of each of the light emitting elements.

3. The display device of claim 2, wherein each of the light emitting elements is disposed in a vertical direction or a diagonal direction with respect to the first electrode and the second electrode.

4. The display device of claim 1, wherein the first end portion of each of the light emitting elements directly contacts the first electrode.

5. The display device of claim 1, wherein the second end portion of each of the light emitting elements directly contacts the second electrode.

6. The display device of claim 1, wherein
each of the openings has a substantially polygonal shape, a substantially circular shape, a substantially elliptical shape, or a shape substantially corresponding to a combination thereof in a plan view, and
each of the openings is adjacent to each other in an emission area of the pixel.

7. The display device of claim 1, further comprising:
insulating patterns disposed in each of the openings and overlapping the first contact electrodes and the first end portion of each of the light emitting elements.

8. The display device of claim 7, wherein the insulating patterns include an organic insulating material.

9. The display device of claim 1, further comprising:
a second insulating layer disposed between the first insulating layer and the second electrode and surrounding each of the light emitting elements.

10. The display device of claim 9, wherein
the second insulating layer includes an organic insulating material, and
portions of the second insulating layer enclose each of the openings of the first insulating layer.

11. The display device of claim 1, wherein the pixel comprises at least one intermediate electrode spaced apart from the first electrode and the second electrode, and electrically connected between the first electrode and the second electrode by at least one light emitting element of the light emitting elements.

12. The display device of claim 11, wherein
the pixel comprises intermediate electrodes, and
the intermediate electrodes are alternately disposed on a layer on which the first electrode is disposed and a layer on which the second electrode is disposed.

13. The display device of claim 1, wherein each of the light emitting elements comprises rod-type light emitting elements or core-shell light emitting elements.

14. The display device of claim 1, wherein
the first protruding part contacts the first lateral surface of each of the openings, and
the second protruding part contacts the second lateral surface of each of the openings.

15. The display device of claim 1, wherein
the lower part and the light emitting elements overlap each other in a plan view,
the lower part and the third protruding part are continuously connected to each other, and
the second protruding part and the third protruding part are continuously connected to each other and uniformly disposed on a bottom surface and the first and second lateral surfaces of the corresponding one of the openings.

16. A method of fabricating a display device, the method comprising:
forming a first electrode on a base layer;
forming a first insulating layer on the first electrode;
forming an alignment electrode overlapping the first electrode and including first openings on the first insulating layer;
forming second openings overlapping the first openings in the first insulating layer, using the alignment electrode as a mask;
supplying light emitting elements on the base layer, and aligning the light emitting elements in cells formed by the first openings and the second openings by applying alignment signals to the first electrode and the alignment electrode;
electrically connecting first end portions of the light emitting elements to the first electrode by forming a conductive layer overlapping the alignment electrode and the light emitting elements after the light emitting elements are aligned, the conductive layer including:
contact electrodes disposed in the second openings, each of the contact electrodes including:
a lower part contacting the first electrode,
a first protruding part covering a first lateral surface of each of the second openings,
a second protruding part covering a second lateral surface of each of the second openings opposite to the first lateral surface of each of the second openings, and a third protruding part contacting an upper side surface and the first end portion of each of the light emitting elements, the third protruding part disposed between the first protruding part and the second protruding part in a horizontal direction; and forming a second electrode on second end portions of the light emitting elements to electrically connect the second electrode to the second end portions of the light emitting elements.

17. The method of claim 16, wherein the electrically connecting of the first end portions of the light emitting elements to the first electrode further comprises:

forming an organic insulating layer on the conductive layer; and etching the conductive layer and the organic insulating layer to have a height in the first openings and the second openings.

18. The method of claim 17, wherein the alignment electrode outside the second openings is removed in the etching of the conductive layer.

19. The method of claim 18, further comprising:

forming a second insulating layer overlapping the first insulating layer and the light emitting elements after the alignment electrode is removed; and partially etching the second insulating layer in a thickness direction such that the second end portions of the light emitting elements are exposed.

20. The method of claim 16, further comprising:

dividing a lower electrode pattern including the first electrode into the first electrode and at least one intermediate electrode, after the aligning of the light emitting elements and before the forming of the second electrode.

21. The method of claim 16, wherein the forming of the second electrode comprises forming the second electrode and at least one intermediate electrode on different light emitting elements among the light emitting elements, respectively.

* * * * *